(12) United States Patent
Unno

(10) Patent No.: US 11,910,609 B2
(45) Date of Patent: Feb. 20, 2024

(54) SEMICONDUCTOR MEMORY DEVICE

(71) Applicant: Kioxia Corporation, Tokyo (JP)

(72) Inventor: Masaki Unno, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 320 days.

(21) Appl. No.: 17/182,285

(22) Filed: Feb. 23, 2021

(65) Prior Publication Data

US 2022/0059433 A1    Feb. 24, 2022

(30) Foreign Application Priority Data

Aug. 20, 2020   (JP) ................. 2020-139234

(51) Int. Cl.
  *H10B 43/10*    (2023.01)
  *H10B 43/27*    (2023.01)
  *H10B 43/50*    (2023.01)
  *H10B 43/40*    (2023.01)
  *H01L 25/18*    (2023.01)

(52) U.S. Cl.
  CPC ............. *H10B 43/40* (2023.02); *H01L 25/18* (2013.01); *H10B 43/10* (2023.02); *H10B 43/27* (2023.02); *H10B 43/50* (2023.02)

(58) Field of Classification Search
  CPC ......... H10B 43/10; H10B 43/27; H10B 43/50
  See application file for complete search history.

(56) References Cited

U.S. PATENT DOCUMENTS 10,672,782 B2    6/2020 Utsumi
2019/0378855 A1*  12/2019 Kim ................. H10B 43/10

FOREIGN PATENT DOCUMENTS

JP    2018-026518 A    2/2018

* cited by examiner

*Primary Examiner* — Robert G Bachner
*Assistant Examiner* — Molly K Reida
(74) *Attorney, Agent, or Firm* — Oblon, McClelland, Maier & Neustadt, L.L.P.

(57) ABSTRACT

A semiconductor memory device includes a substrate including a first to a fourth region, first conductive layers from the first to second region, second conductive layers from the fourth to second region, third conductive layers from the first to third region, fourth conductive layers from the fourth to third region, a first semiconductor column opposed to the first and third conductive layers in the first region, a second semiconductor column opposed to the second and fourth conductive layers in the fourth region, first and second contacts connected to the first and the second conductive layers in the second region, third and fourth contacts connected to the third and fourth conductive layers in the third region, first wirings connected to the first and second contacts in the second region, and second wirings connected to the third and fourth contacts in the third region.

9 Claims, 40 Drawing Sheets

SEMICONDUCTOR MEMORY DEVICE

CROSS-REFERENCE TO RELATED APPLICATIONS

This application is based upon and claims the benefit of Japanese Patent Application No. 2020-139234, filed on Aug. 20, 2020, the entire contents of which are incorporated herein by reference.

BACKGROUND

Field

Embodiments described herein relate generally to a semiconductor memory device.

Description of the Related Art

There has been known a semiconductor memory device that includes a semiconductor substrate, a plurality of conductive layers stacked in a direction intersecting with a surface of the semiconductor substrate, a semiconductor column extending in a direction intersecting with the surface of the semiconductor substrate and opposed to the plurality of conductive layers, and a gate insulating film disposed between the conductive layers and the semiconductor column.

DETAILED DESCRIPTION

Figure 1:
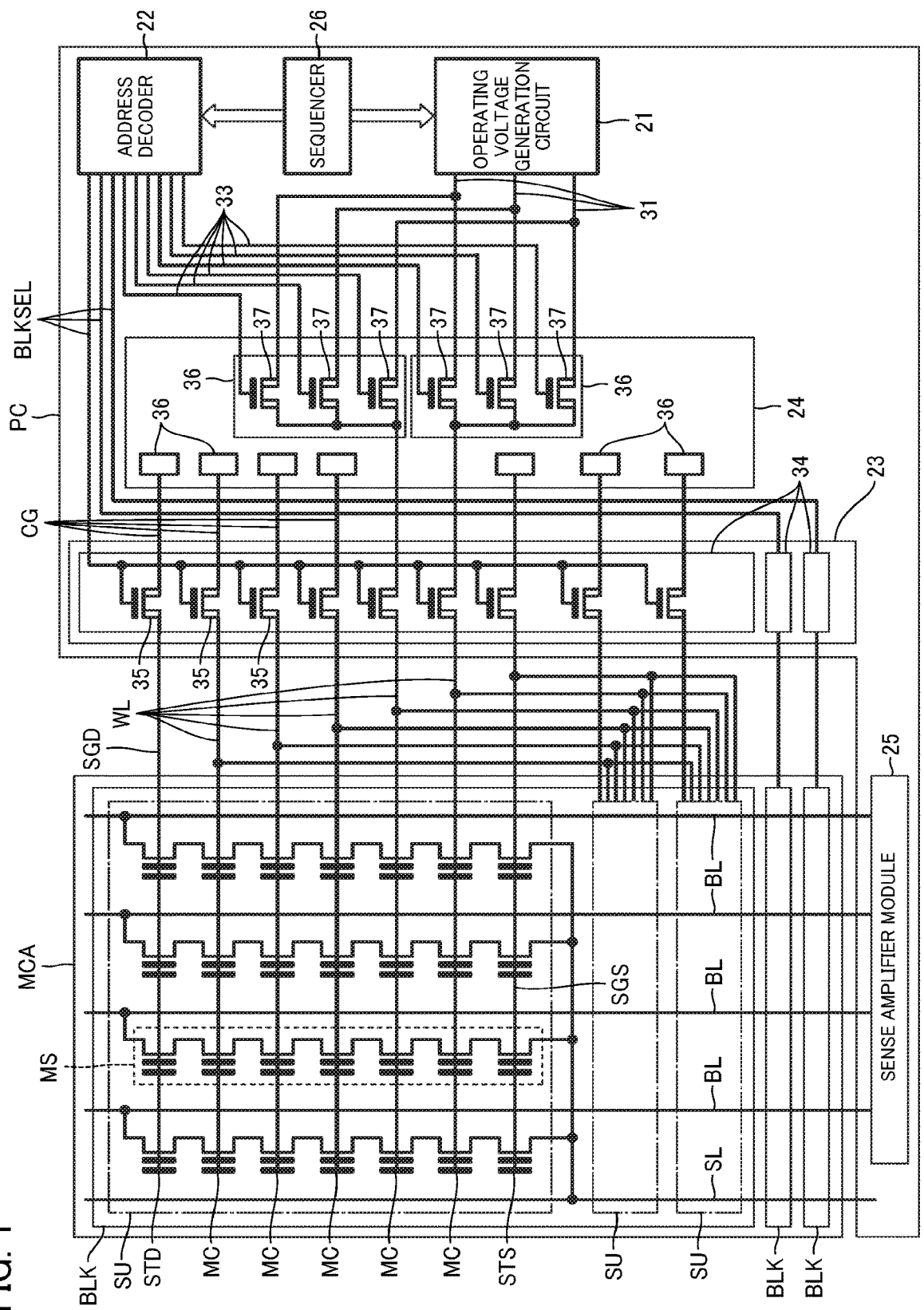
FIG. 1 is an equivalent circuit diagram illustrating a schematic configuration of a semiconductor memory device according to a first embodiment.

A semiconductor memory device according to one embodiment includes: a substrate including a first region to a fourth region arranged sequentially in a first direction; a plurality of first conductive layers extending from the first region to the second region in the first direction and arranged in a second direction intersecting with a surface of the substrate; a plurality of second conductive layers extending from the fourth region to the second region in the first direction and arranged in the second direction; a plurality of third conductive layers extending from the first region to the third region in the first direction and arranged in the second direction, the plurality of third conductive layers being disposed at positions in the second direction different from the plurality of first conductive layers; a plurality of fourth conductive layers extending from the fourth region to the third region in the first direction and arranged in the second direction, the plurality of fourth conductive layers being disposed at positions in the second direction different from the plurality of second conductive layers; a first semiconductor column disposed in the first region and extending in the second direction, the first semiconductor column being opposed to the plurality of first conductive layers and the plurality of third conductive layers; a second semiconductor column disposed in the fourth region and extending in the second direction, the second semiconductor column being opposed to the plurality of second conductive layers and the plurality of fourth conductive layers; a plurality of first contacts disposed in the second region and extending in the second direction, the plurality of first contacts being connected to end portions in the first direction of the plurality of first conductive layers; a plurality of second contacts disposed in the second region and extending in the second direction, the plurality of second contacts being connected to end portions in the first direction of the plurality of second conductive layers; a plurality of third contacts disposed in the third region and extending in the second direction, the plurality of third contacts being connected to end portions in the first direction of the plurality of third conductive layers; a plurality of fourth contacts disposed in the third region and extending in the second direction, the plurality of fourth contacts being connected to end portions in the first direction of the plurality of fourth conductive layers; a plurality of first wirings disposed in the second region, the plurality of first wirings being electrically connected to the plurality of first contacts and the plurality of second contacts; and a plurality of second wirings disposed in the third region, the plurality of second wirings being electrically connected to the plurality of third contacts and the plurality of fourth contacts.

A semiconductor memory device according to one embodiment includes: a substrate including a first region to a fourth region arranged sequentially in a first direction; a plurality of first conductive layers and a plurality of first insulating layers extending from the first region to the fourth region in the first direction, the plurality of first conductive layers and the plurality of first insulating layers being arranged alternately in a second direction intersecting with a surface of the substrate; a plurality of second conductive layers and a plurality of second insulating layers extending from the first region to the fourth region in the first direction and arranged alternately in the second direction, the plurality of second conductive layers and the plurality of second insulating layers being disposed at positions in the second direction different from the plurality of first conductive layers; a first semiconductor column disposed in the first region and extending in the second direction, the first semiconductor column being opposed to the plurality of first conductive layers and the plurality of second conductive layers; a second semiconductor column disposed in the fourth region and extending in the second direction, the second semiconductor column being opposed to the plurality of first conductive layers and the plurality of second conductive layers; a plurality of first contacts disposed in the second region and extending in the second direction, the plurality of first contacts being connected to the plurality of first conductive layers; and a plurality of second contacts disposed in the third region and extending in the second direction, the plurality of second contacts being connected to the plurality of second conductive layers. A third contact as one of the plurality of first contacts penetrates the plurality of second insulating layers, extends in the second direction, and is connected to the first conductive layer farthest from the plurality of second conductive layers among the plurality of first conductive layers. In a first cross-sectional surface extending in the first direction and the second direction and including the third contact, the first conductive layer disposed at a position closer to the plurality of second conductive layers has a larger distance to the third contact in the first direction.

Next, semiconductor memory devices according to embodiments are described in detail with reference to the accompanying drawings. The following embodiments are only examples, and are not described for the purpose of limiting the present invention.

In this specification, a direction parallel to a surface of the semiconductor substrate is referred to as an X-direction, a direction parallel to the surface of the semiconductor substrate and perpendicular to the X-direction is referred to as a Y-direction, and a direction perpendicular to the surface of the semiconductor substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction and need not to correspond to these directions.

Expressions such as "above" and "below" in this specification are based on the semiconductor substrate. For example, a direction away from the semiconductor substrate along the Z-direction is referred to as above and a direction approaching the semiconductor substrate along the Z-direction is referred to as below. A lower surface and a lower end portion of a certain configuration mean a surface and an end portion on the semiconductor substrate side of this configuration. An upper surface and an upper end portion of a certain configuration mean a surface and an end portion on a side opposite to the semiconductor substrate of this configuration. A surface intersecting with the X-direction or the Y-direction is referred to as a side surface and the like. In a configuration where two or more semiconductor substrates are disposed, any semiconductor substrate may be used as a reference.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

First Embodiment

[Overall Configuration]

The configuration of the semiconductor memory device according to the first embodiment is described with reference to the drawings. Note that the following drawings are schematic, and the configurations are partially omitted in some cases for sake of convenience of the description.

[Equivalent Circuit]

FIG. 1 is a schematic equivalent circuit diagram illustrating the configuration of the semiconductor memory device according to the first embodiment.

The semiconductor memory device according to the first embodiment includes a memory cell array MCA and a peripheral circuit PC controlling the memory cell array MCA.

The memory cell array MCA includes a plurality of memory blocks BLK. The plurality of memory blocks BLK each include a plurality of string units SU. The plurality of string units SU each include a plurality of memory strings MS. The plurality of memory strings MS have one ends each connected to the peripheral circuit PC via a bit line BL. The plurality of memory strings MS have other ends each connected to the peripheral circuit PC via a common source line SL.

The memory string MS includes a drain-side select transistor STD, a plurality of memory cells MC, and a source-side select transistor STS, which are connected in series between the bit line BL and the source line SL. Hereinafter, the drain-side select transistor STD and the source-side select transistor STS may be simply referred to as select transistors (STD, STS).

The memory cell MC according to the first embodiment is a field-effect type transistor that includes electric charge accumulating films in gate insulating films. The memory cell MC has a threshold voltage that charges according to an electric charge amount in the electric charge accumulating film. Word lines WL are connected to respective gate electrodes of the plurality of memory cells MC corresponding to one memory string MS. These respective word lines WL are connected to all of the memory strings MS in one memory block BLK in common.

The select transistors (STD, STS) are field-effect type transistors. The select gate lines (SGD, SGS) are connected to respective gate electrodes of the select transistors (STD, STS). The drain-side select gate line SGD is disposed corresponding to the string unit SU and connected to all of the memory strings MS in one string unit SU in common. The source-side select gate line SGS is connected to all of the memory strings MS in one memory block BLK in common.

The peripheral circuit PC includes an operating voltage generation circuit 21 that generates operating voltages, an address decoder 22 that decodes address data, a block select circuit 23 and a voltage select circuit 24 that transfer the operating voltage to the memory cell array MCA according to an output signal of the address decoder 22, a sense amplifier module 25 connected to the bit lines BL, and a sequencer 26 that controls them.

The operating voltage generation circuit 21 includes a plurality of operating voltage output terminals 31. The operating voltage generation circuit 21 includes, for example, a step down circuit, such as a regulator, and a step up circuit, such as a charge pump circuit. For example, the operating voltage generation circuit 21 generates a plurality of patterns of operating voltages applied to the bit line BL, the source line SL, the word line WL, and the select gate lines (SGD, SGS) in a read operation, a write operation, and an erase operation on the memory cell array MCA, in accordance with a control signal from the sequencer 26 to simultaneously output the operating voltages to the plurality of operating voltage output terminals 31. The operating voltage output from the operating voltage output terminal 31 is appropriately adjusted in accordance with the control signal from the sequencer 26.

The address decoder 22 includes a plurality of block select lines BLKSEL and a plurality of voltage select lines 33. For example, the address decoder 22 sequentially refers to address data in an address register in accordance with the control signal from the sequencer 26, decodes this address data to cause a block driving transistor 35 and a voltage select transistor 37 corresponding to the address data to be in a state of ON, and cause the block driving transistors 35 and the voltage select transistors 37 other than the above to be in a state of OFF. For example, voltages of the block select line BLKSEL and the voltage select line 33 corresponding to the address data are set to be in a state of "H" and voltages other than those are set to be in a state of "L". When a P channel type transistor is used, not an N channel type transistor, an inverse voltage is applied to these wirings.

In the illustrated example, in the address decoder 22, one block select line BLKSEL is disposed per memory block BLK. However, this configuration is appropriately changeable. For example, one block select line BLKSEL may be included in per two or more memory blocks BLK.

The block select circuit 23 includes a plurality of block selectors 34 corresponding to the memory blocks BLK. The plurality of block selectors 34 each include a plurality of block driving transistors 35 corresponding to the word lines WL and the select gate lines (SGD, SGS). The block driving transistor 35 is, for example, a field-effect type high voltage transistor. The block driving transistors 35 have drain electrodes each electrically connected to the corresponding word line WL or select gate line (SGD, SGS). Source electrodes are each electrically connected to the operating voltage output terminal 31 via a wiring CG and the voltage select circuit 24. The gate electrodes are commonly connected to the corresponding block select line BLKSEL.

Note that the block select circuit 23 further includes a plurality of transistors (not illustrated). The plurality of transistors are field-effect type high voltage transistors connected between the select gate lines (SGD, SGS) and ground voltage supply terminals. The plurality of transistors electrically conduct the select gate lines (SGD, SGS) included in the non-selected memory blocks BLK with the ground voltage supply terminals. Note that the plurality of word lines WL included in the non-selected memory blocks BLK enter a floating state.

The voltage select circuit 24 includes a plurality of voltage selectors 36 corresponding to the word lines WL and the select gate lines (SGD, SGS). The plurality of voltage selectors 36 each include a plurality of voltage select transistors 37. The voltage select transistor 37 is, for example, a field-effect type high voltage transistor. The voltage select transistors 37 have drain terminals each electrically connected to the corresponding word line WL or the select gate line (SGD, SGS) via the wiring CG and the block select circuit 23. The source terminals are each electrically connected to the corresponding operating voltage output terminal 31. The gate electrodes are each connected to the corresponding voltage select line 33.

The sense amplifier module 25 is connected to the plurality of bit lines BL. The sense amplifier module 25 includes, for example, a plurality of sense amplifier units corresponding to the bit lines BL. The sense amplifier units each include a clamp transistor that charges the bit line BL based on the voltage generated in the operating voltage generation circuit 21, a sense transistor that senses the voltage or a current of the bit line BL, a plurality of latch circuits that hold output signals, write data, and the like of this sense transistor.

The sequencer 26 outputs the control signal to the operating voltage generation circuit 21, the address decoder 22, and the sense amplifier module 25 according to an input instruction and a state of the semiconductor memory device. For example, the sequencer 26 sequentially refers to command data in a command register in accordance with a clock signal, decodes this command data, and outputs it to the operating voltage generation circuit 21, the address decoder 22, and the sense amplifier module 25.

[Structure]

Figure 2:
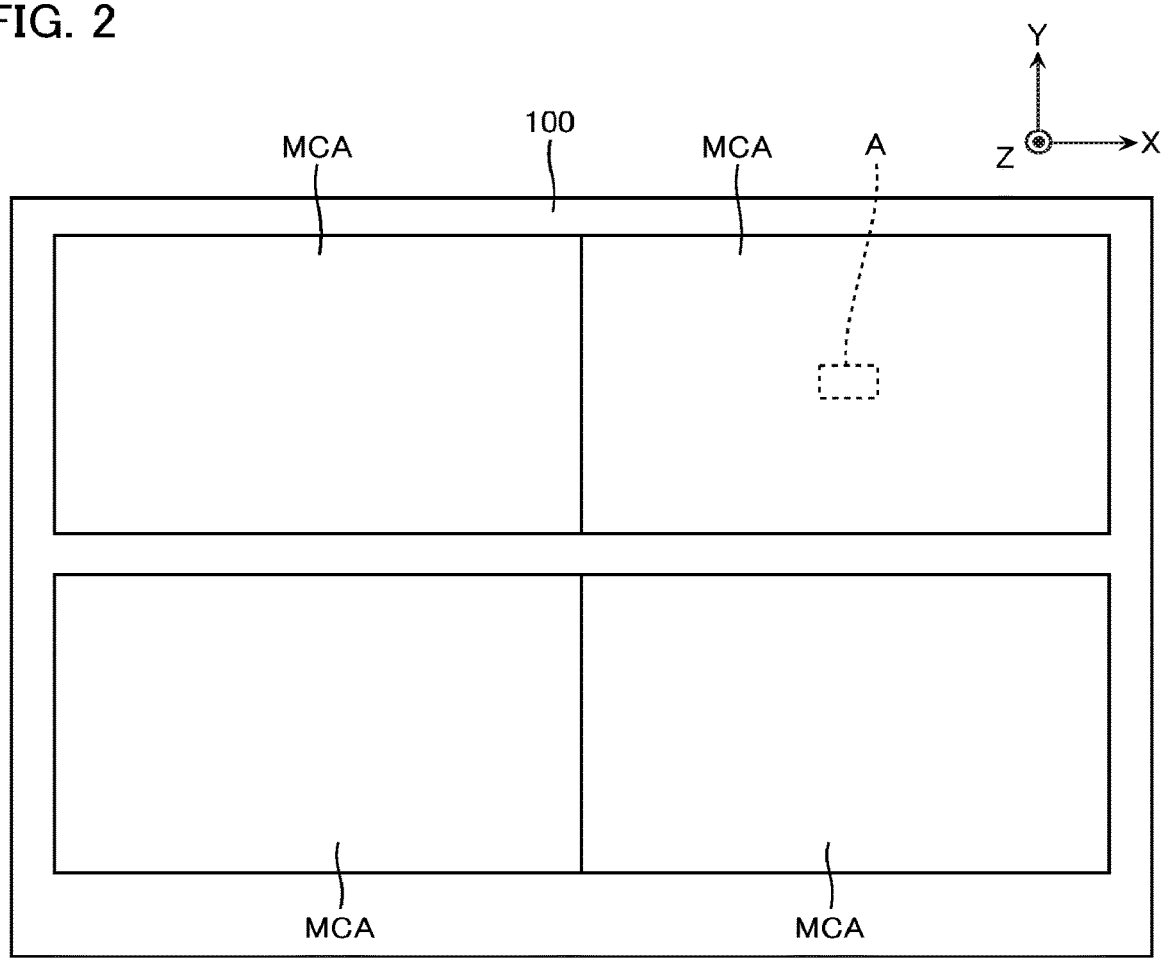
FIG. 2 is a schematic plan view of the semiconductor memory device.
Figure 3:
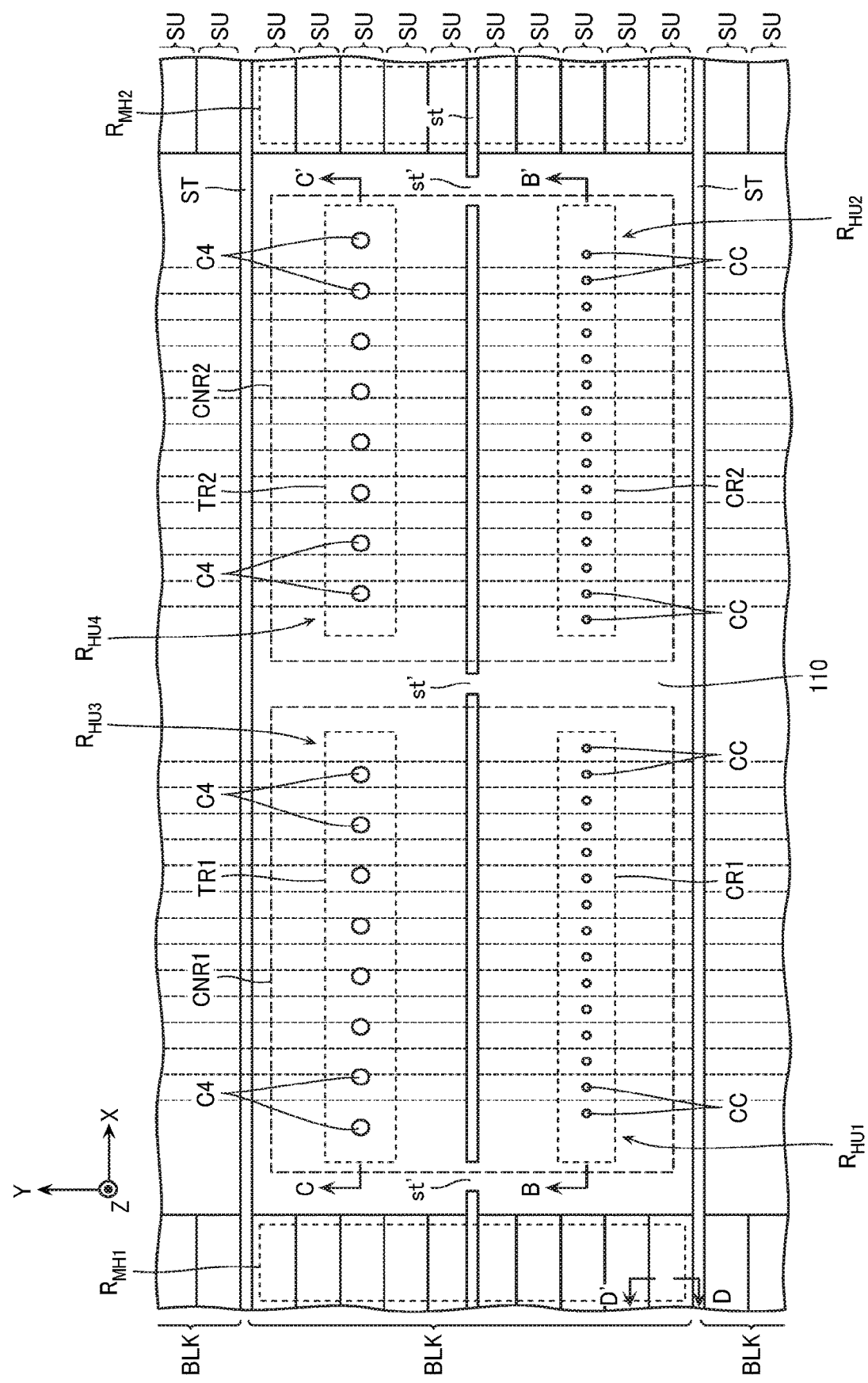
FIG. 3 is a schematic enlarged view of a part indicated by A in FIG. 2.
Figure 4:
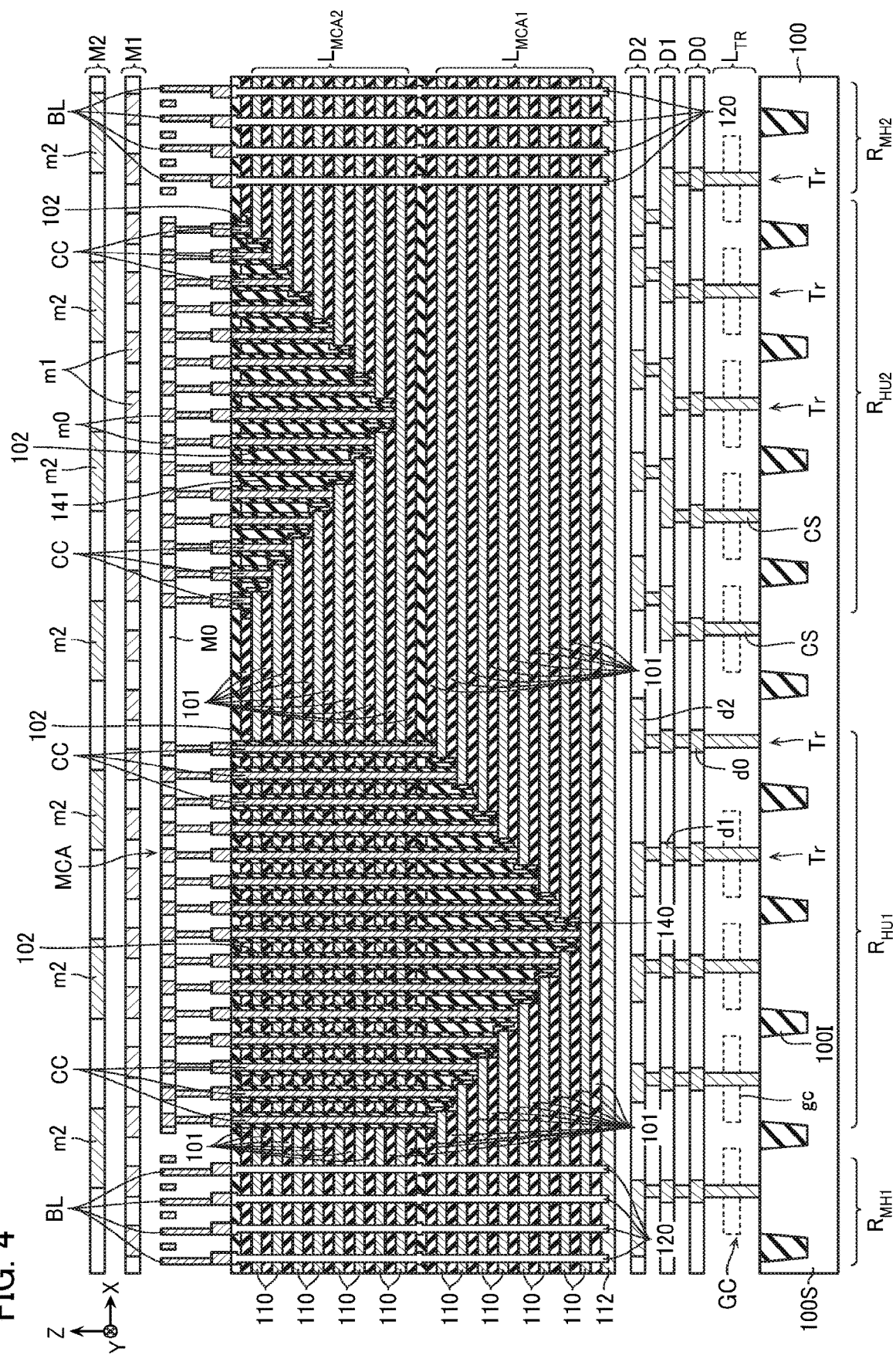
FIG. 4 is a schematic cross-sectional view in a case where the structure illustrated in FIG. 3 is taken along the line B-B' and viewed in the arrow direction.
Figure 5:
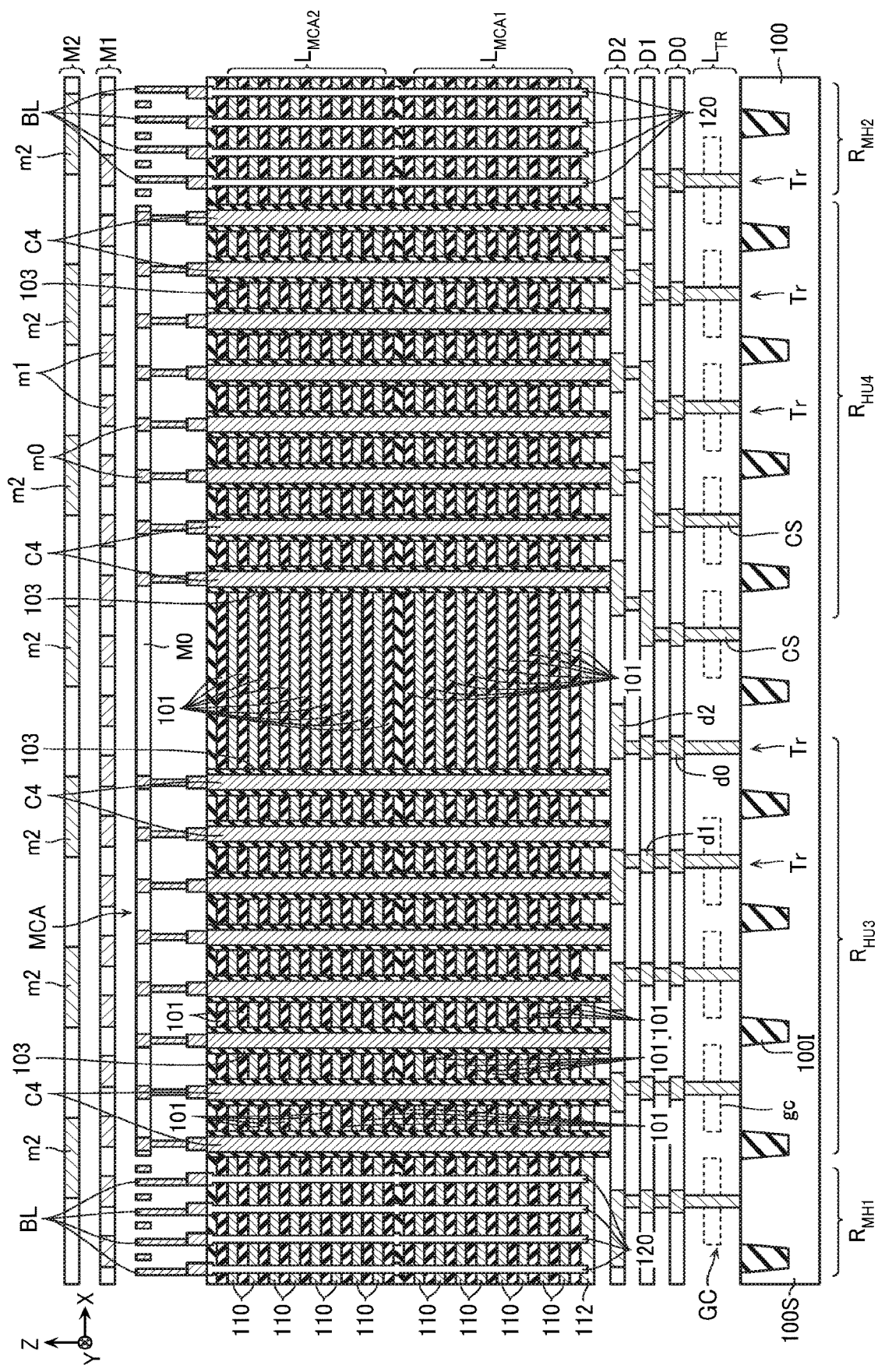
FIG. 5 is a schematic cross-sectional view in a case where the structure illustrated in FIG. 3 is taken along the line C-C' and viewed in the arrow direction.
Figure 6:
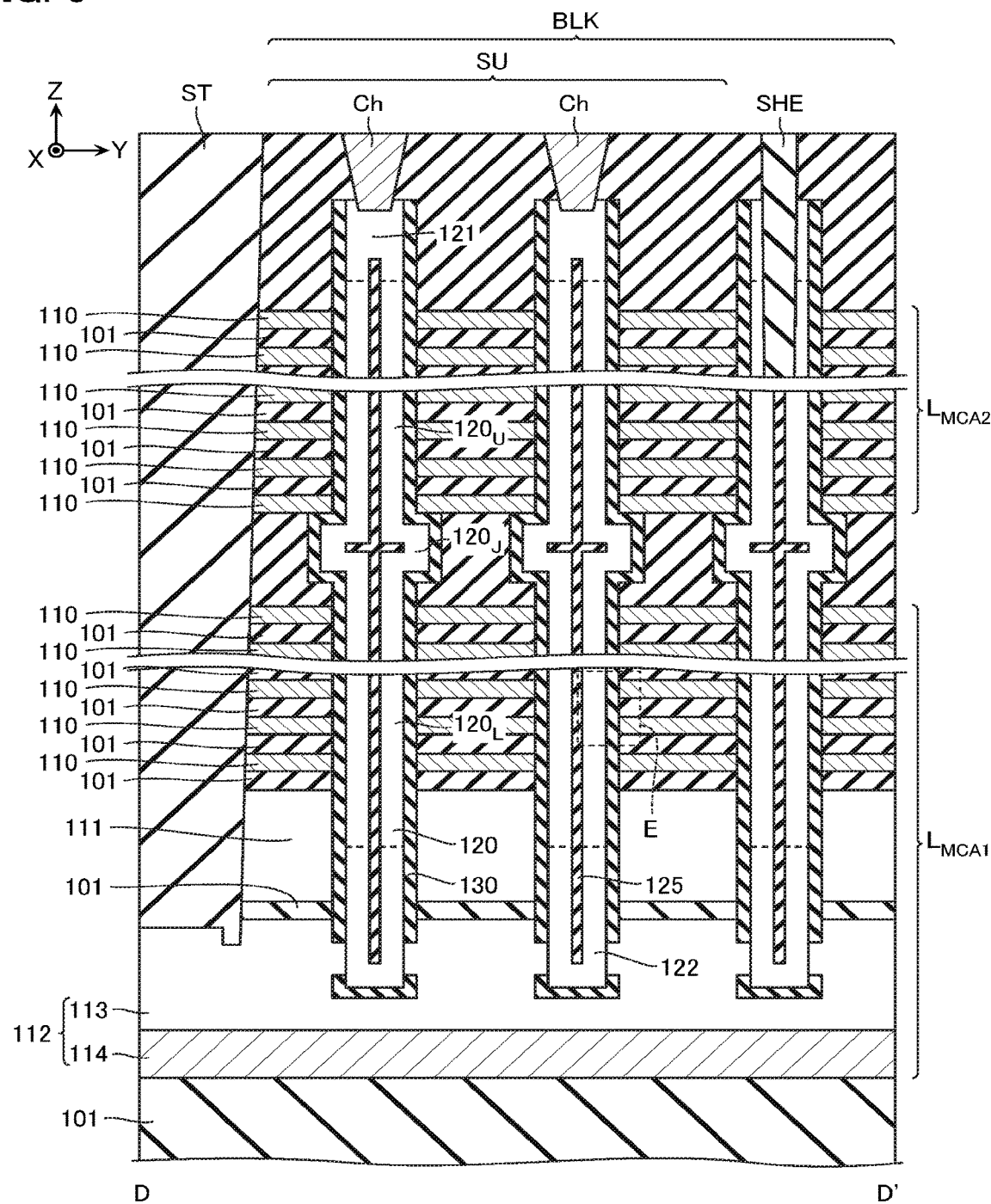
FIG. 6 is a schematic cross-sectional view of the structure illustrated in FIG. 3 taken along the line D-D' and viewed in the arrow direction.
Figure 7:
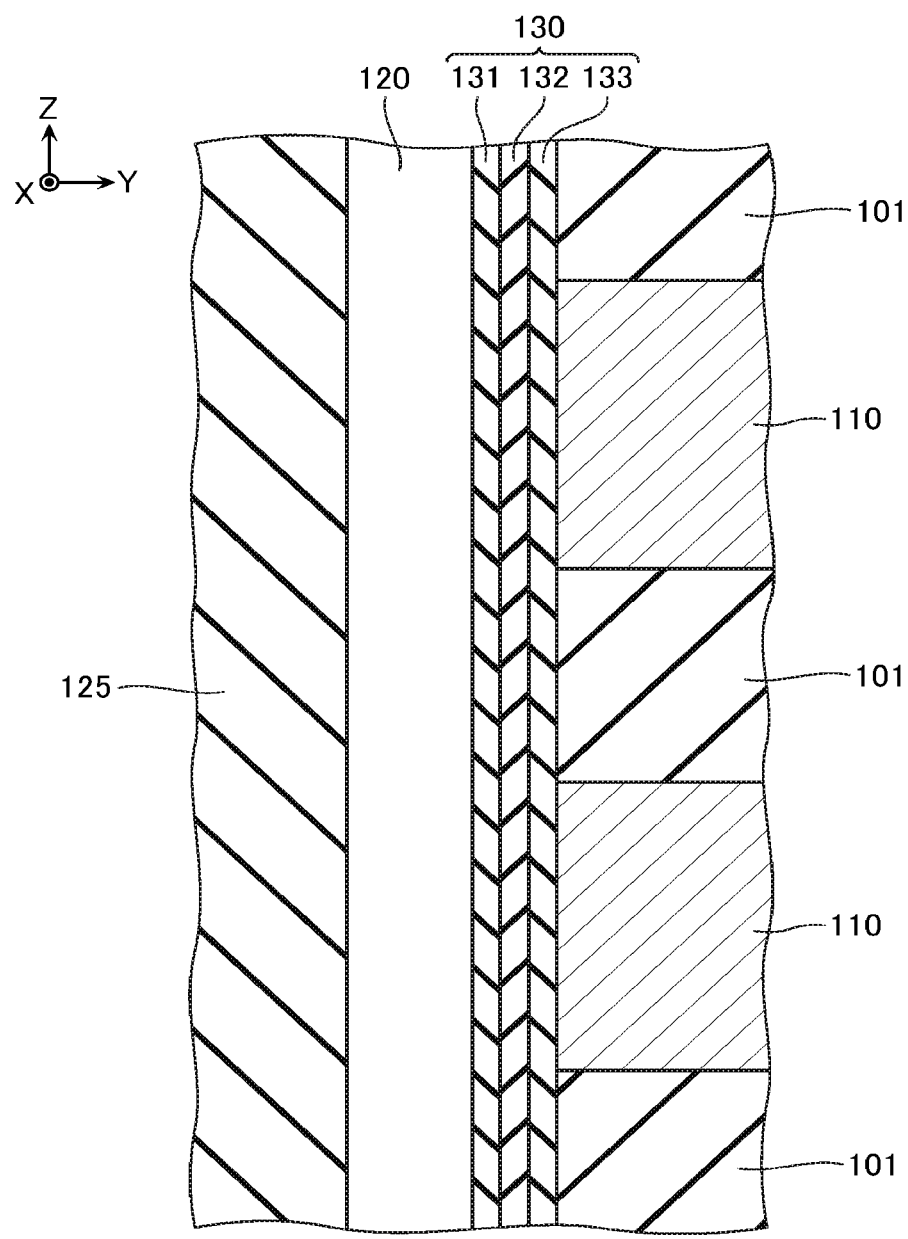
FIG. 7 is a schematic enlarged view of a part indicated by E in FIG. 6.

FIG. 2 is a schematic plan view of the semiconductor memory device according to the first embodiment. FIG. 3 is a schematic enlarged view of a part indicated by A in FIG. 2 and illustrates a configuration in a memory cell array layer of an upper layer. FIG. 4 is a schematic cross-sectional view of the structure illustrated in FIG. 3 taken along the line B-B' and viewed in the arrow direction. FIG. 5 is a schematic cross-sectional view of the structure illustrated in FIG. 3 taken along the line C-C' and viewed in the arrow direction. FIG. 6 is a schematic cross-sectional view of the structure illustrated in FIG. 3 taken along the line D-D' and viewed in the arrow direction. FIG. 7 is a schematic enlarged view of a part indicated by E in FIG. 6.

For example, as illustrated in FIG. 2, the semiconductor memory device according to the first embodiment includes a semiconductor substrate 100. In the illustrated example, the semiconductor substrate 100 includes the four memory cell arrays MCA arranged in the X-direction and the Y-direction.

For example, as illustrated in FIG. 4 and FIG. 5, the semiconductor memory device according to the first embodiment includes the semiconductor substrate 100, a transistor layer $L_{TR}$ disposed on the semiconductor substrate 100, a wiring layer D0 disposed above the transistor layer $L_{TR}$, a wiring layer D1 disposed above the wiring layer D0, a wiring layer D2 disposed above the wiring layer D1, a memory cell array layer $L_{MCA1}$ of a lower layer disposed above the wiring layer D2, a memory cell array layer $L_{MCA2}$ of an upper layer disposed above the memory cell array layer $L_{MCA1}$, a wiring layer M0 disposed above the memory cell array layer $L_{MCA2}$, a wiring layer M1 disposed above the wiring layer M0, and a wiring layer M2 disposed above the wiring layer M1.

[Structure of Semiconductor Substrate 100]

The semiconductor substrate 100 is, for example, a semiconductor substrate of P type silicon (Si) containing P type impurities, such as boron (B). For example, as illustrated in FIG. 4 and FIG. 5, in the surface of the semiconductor substrate 100, a semiconductor substrate region 100S and insulating regions 100I are disposed.

[Structure of Transistor Layer $L_{TR}$]

For example, as illustrated in FIG. 4 and FIG. 5, wiring layers GC are disposed on the upper surface of the semiconductor substrate 100 via an insulating layer (not illustrated). The wiring layer GC includes a plurality of electrodes gc opposed to the surface of the semiconductor substrate 100. Respective regions of the semiconductor substrate 100 and the plurality of electrodes gc included in the wiring layers GC are each connected to a contact CS.

The semiconductor substrate region 100S of the semiconductor substrate 100 functions as channel regions of a plurality of transistors Tr, one electrodes of the plurality of capacitors, and the like constituting the peripheral circuit PC.

The plurality of respective electrodes gc included in the wiring layers GC function as the gate electrodes of the plurality of transistors Tr, the other electrodes of the plurality of capacitors, and the like constituting the peripheral circuit PC.

The contact CS extends in the Z-direction and is in contact with the semiconductor substrate 100 or the upper surface of the electrode gc at a lower end. In a connection part between the contact CS and the semiconductor substrate 100, an impurity region containing N type impurities or P type impurities is disposed. For example, the contact CS may include a stacked film of a barrier conductive film, such as titanium nitride (TiN), and a metal film, such as tungsten (W), or the like.

[Structures of Wiring Layers D0, D1, D2]

For example, as illustrated in FIG. 4 and FIG. 5, a plurality of wirings included in the wiring layers D0, D1, D2 are electrically connected to at least one of the configurations in the memory cell array MCA and the configurations in the peripheral circuit PC.

The wiring layers D0, D1, D2 each include a plurality of wirings d0, d1, d2. For example, the plurality of wirings d0, d1, d2 may include a stacked film of a barrier conductive film, such as titanium nitride (TiN), and a metal film, such as tungsten (W), or the like.

[Structures of Memory Cell Array Layers $L_{MCA1}$, $L_{MCA2}$]

As illustrated in FIG. 3, the memory cell array layers $L_{MCA1}$, $L_{MCA2}$ include the plurality of memory blocks BLK arranged in the Y-direction and an inter-block insulating layer ST, such as silicon oxide ($SiO_2$), disposed between the two memory blocks BLK adjacent in the Y-direction.

The memory block BLK is partitioned into two regions arranged in the Y-direction by an inner-block insulating layer st, such as silicon oxide ($SiO_2$), extending in the X-direction. One of these two regions includes two memory hole regions $R_{MH1}$, $R_{MH2}$ extending in the X-direction and arranged in the X-direction and a hook-up region $R_{HU1}$ and a hook-up region $R_{HU2}$ disposed between the memory hole regions $R_{MH1}$, $R_{MH2}$. The other region among these two regions includes the two memory hole regions $R_{MH1}$, $R_{MH2}$ extending in the X-direction and arranged in the X-direction and a hook-up region $R_{HU3}$ and a hook-up region $R_{HU4}$ disposed between the memory hole regions $R_{MH1}$, $R_{MH2}$. Note that the inner-block insulating layer st includes a plurality of missing portions st'. Therefore, a part of the configurations in the memory block BLK are electrically connected via the missing portion st' between the two regions arranged in the Y-direction.

The memory hole regions $R_{MH1}$, $R_{MH2}$ each include the plurality of string units SU arranged in the Y-direction and an inter-string unit insulating layer SHE (FIG. 6), such as silicon oxide (SiO$_2$), disposed between the two string units SU adjacent in the Y-direction.

[Structures of Memory Hole Regions $R_{MH1}$, $R_{MH2}$ of Memory Cell Array Layers $L_{MCA1}$, $L_{MCA2}$]

For example, as illustrated in FIG. 6, the memory hole regions $R_{MH1}$, $R_{MH2}$ (FIG. 3, FIG. 4, and FIG. 5) of the memory cell array layers $L_{MCA1}$, $L_{MCA2}$ include a plurality of conductive layers 110 arranged in the Z-direction, a plurality of semiconductor columns 120 extending in the Z-direction, and a plurality of respective gate insulating films 130 disposed between the plurality of conductive layers 110 and the plurality of semiconductor columns 120.

The conductive layer 110 is a substantially plate-shaped conductive layer extending in the X-direction. The conductive layer 110 may include a stacked film of a barrier conductive film, such as titanium nitride (TiN), and a metal film, such as tungsten (W), or the like. For example, the conductive layer 110 may contain polycrystalline silicon containing impurities, such as phosphorus (P) or boron (B), or the like. Between the plurality of conductive layers 110 arranged in the Z-direction, insulating layers 101, such as silicon oxide (SiO$_2$), are disposed.

A conductive layer 111 is disposed below the conductive layer 110. For example, the conductive layer 111 may contain polycrystalline silicon containing impurities, such as phosphorus (P) or boron (B), or the like. Between the conductive layer 111 and the conductive layer 110, the insulating layer 101, such as silicon oxide (SiO$_2$), is disposed.

A conductive layer 112 is disposed below the conductive layers 111. The conductive layer 112 includes a semiconductor layer 113 joined to lower ends of the semiconductor columns 120 and a conductive layer 114 in contact with a lower surface of the semiconductor layer 113. For example, the semiconductor layer 113 may contain polycrystalline silicon containing N type impurities, such as phosphorus (P), or P type impurities, such as boron (B), or the like. The conductive layer 114 may include, for example, any conductive layer including a conductive layer containing a metal, such as tungsten (W), or tungsten silicide, or another conductive layer. Between the conductive layer 112 and the conductive layers 111, the insulating layers 101, such as silicon oxide (SiO$_2$), are disposed.

The conductive layer 112 functions as the source line SL (FIG. 1).

The conductive layers 111 function as the source-side select gate line SGS (FIG. 1) and gate electrodes of the plurality of source-side select transistors STS connected to the source-side select gate line SGS. The conductive layers 111 are electrically independent in every memory block BLK.

Among the plurality of conductive layers 110, one or the plurality of conductive layers 110 positioned at the lowermost layer function as the source-side select gate line SGS (FIG. 1) and gate electrodes of the plurality of source-side select transistors STS connected to the source-side select gate line SGS. The plurality of conductive layers 110 are electrically independent in every memory block BLK.

The plurality of conductive layers 110 positioned upward of this layer function as the word lines WL (FIG. 1) and gate electrodes of the plurality of memory cells MC (FIG. 1) connected to the word lines WL. The plurality of conductive layers 110 are each electrically independent in every memory block BLK.

One or the plurality of conductive layers 110 positioned upward of these conductive layers 110 function as the drain-side select gate line SGD and gate electrodes of the plurality of drain-side select transistors STD (FIG. 1) connected the drain-side select gate line SGD. The plurality of conductive layers 110 are each electrically independent in every string unit SU.

The semiconductor columns 120 are arranged in the X-direction and the Y-direction in a predetermined pattern. The semiconductor columns 120 function as the channel regions of the plurality of memory cells MC and the select transistors (STD, STS) included in one memory string MS (FIG. 1). The semiconductor column 120 is, for example, a semiconductor layer, such as polycrystalline silicon (Si). For example, as illustrated in FIG. 6, the semiconductor column 120 has a substantially closed-bottomed cylindrical shape and includes an insulating layer 125, such as silicon oxide, in the center part.

For example, as illustrated in FIG. 6, the semiconductor column 120 includes a semiconductor region $120_L$ included in the memory cell array layer $L_{MCA1}$ and a semiconductor region $120_U$ included in the memory cell array layer $L_{MCA2}$. The semiconductor column 120 includes a semiconductor region $120_J$ disposed between the semiconductor region $120_L$ and the semiconductor region $120_U$, an impurity region 122 disposed below the semiconductor region $120_L$, and an impurity region 121 disposed above the semiconductor region $120_U$.

The semiconductor region $120_L$ is a substantially cylindrically-shaped region extending in the Z-direction. Outer peripheral surfaces of the semiconductor regions $120_L$ are each surrounded by the plurality of conductive layers 110 and the conductive layer ill included in the memory cell array layer $L_{MCA1}$ and opposed to the plurality of conductive layers 110 and the conductive layer 111.

The semiconductor region $120_U$ is a substantially cylindrically-shaped region extending in the Z-direction. Outer peripheral surfaces of the semiconductor regions $120_U$ are each surrounded by the plurality of conductive layers 110 included in the memory cell array layer $L_{MCA2}$ and opposed to the plurality of conductive layers 110. Note that a width in the X-direction and a width in the Y-direction of the semiconductor region $120_U$ are same extent as a width in the X-direction and a width in the Y-direction of the semiconductor region $120_L$.

The respective semiconductor regions $120_J$ are disposed above the plurality of conductive layers 110 included in the memory cell array layer $L_{MCA1}$ and disposed below the plurality of conductive layers 110 included in the memory cell array layer $L_{MCA2}$. A width in the X-direction and a width in the Y-direction of the semiconductor region $120_J$ are larger than the width in the X-direction and the width in the Y-direction of the semiconductor region $120_L$ and larger than the width in the X-direction and the width in the Y-direction of the semiconductor region $120_U$.

The impurity regions 122 are joined to the semiconductor layer 113 in the conductive layer 112. The impurity region 122 contains, for example, N type impurities, such as phosphorus (P), or P type impurities, such as boron (B). An outer peripheral surface of the impurity region 122 is surrounded by the conductive layer 111 and opposed to the conductive layer 111.

The impurity region 121 contains, for example, N type impurities, such as phosphorus (P). The impurity regions 121 are connected to the bit lines BL via contacts Ch or the like.

The gate insulating film 130 has a substantially closed-bottomed cylindrical shape that covers the outer peripheral surface of the semiconductor column 120. The gate insulating film 130 includes, for example, as illustrated in FIG. 7, a tunnel insulating film 131, an electric charge accumulating film 132, and a block insulating film 133, which are stacked between the semiconductor column 120 and the conductive layers 110. The tunnel insulating film 131 and the block insulating film 133 are, for example, insulating films of silicon oxide ($SiO_2$) or the like. The electric charge accumulating film 132 is, for example, a film of silicon nitride ($Si_3N_4$) or the like that can accumulate an electric charge. The tunnel insulating film 131, the electric charge accumulating film 132, and the block insulating film 133, which have substantially cylindrical shapes, extend in the Z-direction along the outer peripheral surface of the semiconductor column 120.

FIG. 7 illustrates an example in which the gate insulating film 130 includes the electric charge accumulating film 132 of silicon nitride or the like. However, the gate insulating film 130 may include, for example, a floating gate of polycrystalline silicon containing N type or P type impurities or the like.

[Structures of Hook-Up Regions $R_{HU1}$, $R_{HU2}$, $R_{HU3}$, $R_{HU4}$ of Memory Cell Array Layers $L_{MCA1}$, $L_{MCA2}$]

For example, as illustrated in FIG. 4 and FIG. 5, in the respective hook-up regions $R_{HU1}$, $R_{HU2}$, $R_{HU3}$, $R_{HU4}$ of the memory cell array layers $L_{MCA1}$, $L_{MCA2}$, the plurality of conductive layers 110 are arranged in the Z-direction, similarly to the memory hole regions $R_{MH1}$, $R_{MH2}$. The number of layers of the conductive layers 110 is actually, for example, from several tens of layers to a hundred and several tens of layers. However, for ease of understanding, FIG. 4 and FIG. 5 illustrate a state in which the memory cell array layers $L_{MCA1}$, $L_{MCA2}$ each include the eight conductive layers 110. Here, the eight conductive layers 110 disposed in the memory cell array layer $L_{MCA1}$ are referred to as the conductive layers 110 of a first layer to an eighth layer in this order from the lower layer to the upper layer, and the eight conductive layers 110 disposed in the memory cell array layer $L_{MCA2}$ are referred to as the conductive layers 110 of a ninth layer to a sixteenth layer in this order from the lower layer to the upper layer.

[Structure of Hook-Up Region $R_{HU1}$ of Memory Cell Array Layers $L_{MCA1}$, $L_{MCA2}$]

For example, as illustrated in FIG. 4, in the hook-up region $R_{HU1}$ of the memory cell array layer $L_{MCA1}$ of the lower layer, a structure of a substantially staircase pattern is formed. This structure of the substantially staircase pattern is configured as follows. That is, in the hook-up region $R_{HU1}$ of the memory cell array layer $L_{MCA1}$ of the lower layer, for example, the conductive layers 110 of the first layer to the eighth layer extending in the X-direction are arranged in the Z-direction. Between the conductive layers 110 of the first layer to the eighth layer, the insulating layers 101 are disposed. At this time, while the conductive layer 110 of the first layer is continuous in the X-direction, the conductive layers 110 of the second layer to the eighth layer are physically separated in the middle in the X-direction. That is, in the hook-up region $R_{HU1}$, a part of the conductive layer 110 of the first layer extending in the X-direction from the memory hole region $R_{MH1}$ to the memory hole region $R_{MH2}$, the end portions in the X-direction of the conductive layers 110 of the second layer to the eighth layer extending in the X-direction from the memory hole region $R_{MH1}$ to the hook-up region $R_{HU1}$, and the end portions in the X-direction of the conductive layers 110 of the second layer to the eighth layer extending in the X-direction from the memory hole region $R_{MH2}$ to the hook-up region $R_{HU1}$ are disposed. Additionally, among the conductive layers 110 of the second layer to the eighth layer, the lower the end portion in the X-direction disposed on one side (the left side in FIG. 4) in the X-direction is disposed, the farther the end portion becomes from the memory hole region $R_{MH1}$, and the upper the end portion is disposed, the closer the end portion becomes to the memory hole region $R_{MH1}$. Additionally, among the conductive layers 110 of the second layer to the eighth layer, the lower the end portion in the X-direction disposed on the other side (the right side in FIG. 4) in the X-direction is disposed, the farther the end portion becomes from the memory hole region $R_{MH2}$, and the upper the end portion is disposed, the closer the end portion becomes to the memory hole region $R_{MH2}$. Therefore, separation distances between the conductive layers 110 disposed on one side (the left side in FIG. 4) in the X-direction and the conductive layers 110 disposed on the other side (the right side in FIG. 4) in the X-direction increase in phases from the conductive layer 110 of the second layer to the conductive layer 110 of the eighth layer (as the conductive layers 110 head for upward in the Z-direction). Additionally, the center positions of the separation distances of the conductive layers 110 of the second layer to the eighth layer match in the X-direction. Thus, the structure of the substantially staircase pattern depressed in a V-shape is formed. An insulating layer 140, such as silicon oxide ($SiO_2$), is filled in the part depressed in the V-shape.

For example, as illustrated in FIG. 4, in the hook-up region $R_{HU1}$ of the memory cell array layer $L_{MCA2}$ of the upper layer, the plurality of conductive layers 110 extending in the X-direction are arranged in the Z-direction. Between the plurality of conductive layers 110 arranged in the Z-direction, the insulating layers 101 are disposed.

For example, as illustrated in FIG. 4, in the hook-up region $R_{HU1}$ of the memory cell array layers $L_{MCA1}$, $L_{MCA2}$, a plurality of contacts CC arranged in the X-direction are disposed. The plurality of contacts CC extend in the Z-direction, penetrate the plurality of conductive layers 110 in the memory cell array layer $L_{MCA2}$, penetrate the insulating layer 140 filled in the structure of the substantially staircase pattern in the memory cell array layer $L_{MCA1}$, and have the lower ends in contact with the respective conductive layers 110 in the memory cell array layer $L_{MCA1}$. Each of the contacts CC may include, for example, a stacked film of a barrier conductive film, such as titanium nitride (TiN), and a metal film, such as tungsten (W), or the like. An insulating layer 102, such as silicon oxide ($SiO_2$), is disposed on the outer peripheral surface of each contact CC.

In the cross-sectional surface illustrated in FIG. 4 as an example, the contacts CC are connected to the structure of the substantially staircase pattern in the memory cell array layer $L_{MCA1}$. Therefore, for example, distances in the X-direction between the contact CC connected to the conductive layer 110 of the first layer and the conductive layers 110 of the second layer to the eighth layer or the insulating layers 101 disposed therebetween are larger than at least the film thickness of the insulating layer 102. Meanwhile, in the cross-sectional surface illustrated in FIG. 4 as an example, the contacts CC penetrate the plurality of conductive layers 110 and insulating layers 101 in the memory cell array layer $L_{MCA2}$. Therefore, for example, the distances in the X-direction between the contact CC connected to the conductive layer 110 of the first layer and the conductive layers 110 of the ninth layer to the sixteenth layer or the insulating layers 101 disposed therebetween are around the film thickness of the insulating layer 102, which is comparatively small.

In the example illustrated in FIG. 3, the plurality of contacts CC disposed in the hook-up region $R_{HU1}$ are arranged in one row in the X-direction. Hereinafter, the region in the region $R_{HU1}$ will be referred to as a contact region CR1 in some cases.

[Structures of Hook-Up Region $R_{HU2}$ of Memory Cell Array Layers $L_{MCA1}$, $L_{MCA2}$]

For example, as illustrated in FIG. 4, in the hook-up region $R_{HU2}$ of the memory cell array layer $L_{MCA1}$ of the lower layer, the plurality of conductive layers 110 extending in the X-direction are arranged in the Z-direction. Between the plurality of conductive layers 110 arranged in the Z-direction, the insulating layers 101 are disposed.

For example, as illustrated in FIG. 4, in the hook-up region $R_{HU2}$ of the memory cell array layer $L_{MCA2}$ of the upper layer, a structure of a substantially staircase pattern is formed. This structure of the substantially staircase pattern is configured as follows. That is, in the hook-up region $R_{HU2}$ of the memory cell array layer $L_{MCA2}$ of the upper layer, for example, the conductive layers 110 of the ninth layer to the sixteenth layer extending in the X-direction are arranged in the Z-direction. Between the conductive layers 110 of the ninth layer to the sixteenth layer, the insulating layers 101 are disposed. At this time, while the conductive layer 110 of the ninth layer is continuous in the X-direction, the conductive layers 110 of the tenth layer to the sixteenth layer are physically separated in the middle in the X-direction. That is, in the hook-up region $R_{HU2}$, a part of the conductive layer 110 of the ninth layer extending in the X-direction from the memory hole region $R_{MH1}$ to the memory hole region $R_{MH2}$, the end portions in the X-direction of the conductive layers 110 of the tenth layer to the sixteenth layer extending in the X-direction from the memory hole region $R_{MH1}$ to the hook-up region $R_{HU2}$, and the end portions in the X-direction of the conductive layers 110 of the tenth layer to the sixteenth layer extending in the X-direction from the memory hole region $R_{MH2}$ to the hook-up region $R_{HU2}$ are disposed. Additionally, among the conductive layers 110 of the tenth layer to the sixteenth layer, the lower the end portion in the X-direction disposed on one side (the left side in FIG. 4) in the X-direction is disposed, the farther the end portion becomes from the memory hole region $R_{MH1}$, and the upper the end portion is disposed, the closer the end portion becomes to the memory hole region $R_{MH1}$. Additionally, among the conductive layers 110 of the tenth layer to the sixteenth layer, the lower the end portion in the X-direction disposed on the other side (the right side in FIG. 4) in the X-direction is disposed, the farther the end portion becomes from the memory hole region $R_{MH2}$, and the upper the end portion is disposed, the closer the end portion becomes to the memory hole region $R_{MH2}$. Therefore, separation distances between the conductive layers 110 disposed on one side (the left side in FIG. 4) in the X-direction and the conductive layers 110 disposed on the other side (the right side in FIG. 4) in the X-direction increase in phases from the conductive layer 110 of the tenth layer to the conductive layer 110 of the sixteenth layer (as the conductive layers 110 head for upward in the Z-direction). Additionally, the center positions of the separation distances of the conductive layers 110 of the tenth layer to the sixteenth layer match in the X-direction. Thus, the structure of the substantially staircase pattern depressed in a V-shape is formed. An insulating layer 141, such as silicon oxide ($SiO_2$), is filled in the part depressed in the V-shape.

For example, as illustrated in FIG. 4, the plurality of contacts CC arranged in the X-direction are disposed in the hook-up region $R_{HU2}$ of the memory cell array layer $L_{MCA2}$. The plurality of contacts CC extend in the Z-direction, penetrate the insulating layer 141, which is filled in the structure of the substantially staircase pattern in the memory cell array layer $L_{MCA2}$, and have lower ends in contact with the respective conductive layers 110 in the memory cell array layer $L_{MCA2}$. For example, each of the contacts CC may include a stacked film of a barrier conductive film, such as titanium nitride (TiN), and a metal film, such as tungsten (W), or the like. The insulating layer 102, such as silicon oxide ($SiO_2$), is disposed on the outer peripheral surface of each contact CC.

Note that, in the cross-sectional surface illustrated in FIG. 4 as an example, the contacts CC are connected to the structure of the substantially staircase pattern in the memory cell array layer $L_{MCA2}$. Accordingly, for example, distances in the X-direction between the contact CC connected to the conductive layer 110 of the ninth layer and the conductive layers 110 of the tenth layer to the sixteenth layer or the insulating layers 101 disposed therebetween are larger than at least the film thickness of the insulating layer 102.

In the example illustrated in FIG. 3, the plurality of contacts CC disposed in the hook-up region $R_{HU2}$ are arranged in one row in the X-direction. Hereinafter, the region in the hook-up region $R_{HU2}$ will be referred to as a contact region CR2 in some cases.

[Structures of Hook-Up Region $R_{HU3}$ of Memory Cell Array Layers $L_{MCA1}$, $L_{MCA2}$]

For example, as illustrated in FIG. 5, a plurality of through contacts C4 arranged in the X-direction are disposed in the hook-up region $R_{HU3}$ of the memory cell array layers $L_{MCA1}$, $L_{MCA2}$. The plurality of through contacts C4 extend in the Z-direction and penetrate the plurality of conductive layers 110 in the memory cell array layers $L_{MCA1}$, $L_{MCA2}$. Each of the through contacts C4 has an upper end connected to a wiring m0 in the wiring layer M0 and a lower end connected to the wiring d2 in the wiring layer D2. The through contacts C4 each may include a stacked film of a barrier conductive film, such as titanium nitride (TiN), and a metal film, such as tungsten (W), or the like. Additionally, the respective through contacts C4 are electrically insulated from the conductive layers 110 via insulating layers 103, such as silicon oxide ($SiO_2$).

In the example illustrated in FIG. 3, the plurality of through contacts C4 disposed in the hook-up region $R_{HU3}$ are arranged in one row in the X-direction. Hereinafter, the region in the hook-up region $R_{HU3}$ will be referred to as a through contact region TR1 in some cases.

[Structures of Hook-Up Region $R_{HU4}$ of Memory Cell Array Layers $L_{MCA1}$, $L_{MCA2}$]

For example, as illustrated in FIG. 5, the plurality of through contacts C4 arranged in the X-direction are disposed in the hook-up region $R_{HU4}$ of the memory cell array layers $L_{MCA1}$, $L_{MCA2}$. The plurality of through contacts C4 extend in the Z-direction and penetrate the plurality of conductive layers 110 in the memory cell array layers $L_{MCA1}$, $L_{MCA2}$. Each of the through contacts C4 has an upper end connected to the wiring m0 in the wiring layer M0 and a lower end connected to the wiring d2 in the wiring layer D2. The through contacts C4 each may include a stacked film of a barrier conductive film, such as titanium nitride (TiN), and a metal film, such as tungsten (W), or the like. Additionally, the respective through contacts C4 are electrically insulated from the conductive layers 110 via the insulating layers 103, such as silicon oxide ($SiO_2$).

In the example illustrated in FIG. 3, the plurality of through contacts C4 disposed in the hook-up region $R_{HU4}$ are arranged in one row in the X-direction. Hereinafter, the region in the hook-up region $R_{HU4}$ will be referred to as a through contact region TR2 in some cases.

[Structures of Wiring Layers M0, M1, M2]

For example, as illustrated in FIG. 4 and FIG. 5, a plurality of wirings included in the wiring layers M0, M1, M2 are electrically connected to at least one of the configurations in the memory cell array MCA and the configurations in the peripheral circuit PC.

The wiring layers M0 each include the plurality of wirings m0. For example, the plurality of wirings m0 may include a stacked film of a barrier conductive film, such as titanium nitride (TiN), and a metal film, such as copper (Cu), or the like. Note that a part of the plurality of wirings m0 function as the bit lines BL.

The wiring layers M1 each include a plurality of wirings m1. For example, the plurality of wirings m1 may include a stacked film of a barrier conductive film, such as titanium nitride (TiN), and a metal film, such as copper (Cu), or the like.

The wiring layers M2 each include the plurality of wirings m2. For example, the plurality of wirings m2 may include a stacked film of a barrier conductive film, such as titanium nitride (TiN), and a metal film, such as aluminum (Al), or the like.

Here, for example, as illustrated in FIG. 3, between the two memory hole regions $R_{MH1}$, $R_{MH2}$, two connection regions CNR1, CNR2 are arranged in the X-direction.

The connection region CNR1 is a region that includes the wirings m0, m1 (FIG. 4, FIG. 5) to connect between the contacts CC disposed in the contact region CR1 and the through contacts C4 disposed in the through contact region TR1 and to connect the predetermined contacts CC disposed in the contact region CR1. The connection region CNR1 is disposed in a region overlapping with the contact region CR1 and the through contact region TR1 viewed from in the Z-direction.

The connection region CNR2 is a region that includes the wirings m0, m1 (FIG. 4, FIG. 5) to connect between the contacts CC disposed in the contact region CR2 and the through contacts C4 disposed in the through contact region TR2 and to connect the predetermined contacts CC disposed in the contact region CR2. This connection region CNR2 is disposed in a region overlapping with the contact region CR2 and the through contact region TR2 viewed from in the Z-direction.

Figure 8:
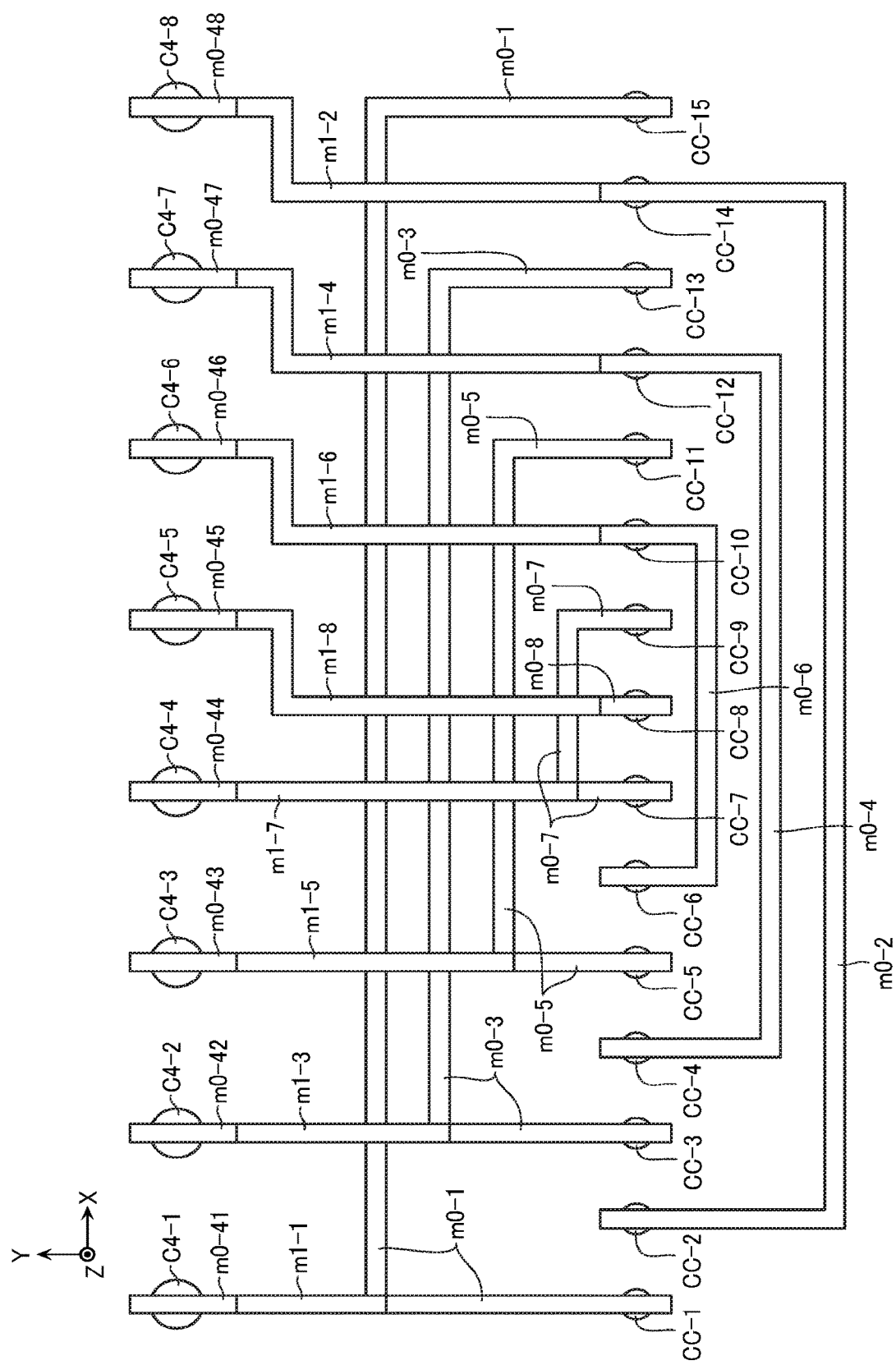
FIG. 8 is a schematic connection drawing illustrating an example of connection of contacts and through contacts.

Next, an example of connecting the contacts CC and the through contacts C4 in the connection region CNR1 in FIG. 3 is described with reference to, for example, FIG. 8. FIG. 8 schematically illustrates the connection state, and various aspects can be employed as the specific connection state. In FIG. 8, 15 respective contacts CC referred to as contacts CC-1 to CC-15 are described. Additionally, eight through contacts C4 referred to as through contacts C4-1 to C4-8 are described. Further, the wirings m0, m1 are described with numerals for distinction of the respective wirings given as necessary.

Wirings m0-1 extending in the X-direction are connected to an upper end of the contact CC-1 connected to the conductive layer 110 of the eighth layer and an upper end of the contact CC-15 connected to the conductive layer 110 of the eighth layer. Similarly, wirings m0-2 to m0-7 extending in the X-direction are connected to the contacts CC-2 to CC-7 connected to the conductive layers 110 of the seventh layer to the second layer and the contacts CC-14 to CC-9 connected to the conductive layers 110 of the seventh layer to the second layer, respectively. A wiring m0-8 is connected to an upper end of the contact CC-8 connected to the conductive layer 110 of the first layer.

Wirings m0-41 to m0-48 are connected to upper ends of the through contacts C4-1 to C4-8 disposed in the through contact region TR1, respectively.

A wiring m1-1 extending in the Y-direction is connected to the wirings m0-1 and the wiring m0-41. Similarly, wirings m1-2 to m1-7 extending in the Y-direction are connected to the respective wirings m0-2 to m0-7 and wirings m0-42 to m0-48.

Because of the configuration, for example, the operating voltage generated in the operating voltage generation circuit (FIG. 1) in the transistor layer $L_{TR}$ (FIG. 4, FIG. 5) is individually supplied to the respective conductive layers 110 of the first layer to the eighth layer in the memory cell array layer $L_{MCA1}$ of the lower layer via the through contacts C4-1 to C4-8, the connections by the respective wirings illustrated in FIG. 8, and the contacts CC1 to CC15.

As the connection between the contact CC in the contact region CR2 and the through contact C4 in the through contact region TR2 in the connection region CNR2 in FIG. 3, for example, the connection similar to the connection state illustrated in FIG. 8 can be employed.

By the connection, for example, the operating voltage generated in the operating voltage generation circuit 21 (FIG. 1) in the transistor layer $L_{TR}$ (FIG. 4, FIG. 5) is individually supplied to the respective conductive layers 110 of the ninth layer to the sixteenth layer in the memory cell array layer $L_{MCA2}$ of the upper layer via the respective through contacts C4 disposed in the through contact region TR2, for example, the connections similar to the connections by the respective wirings illustrated in FIG. 8, and the respective contacts CC disposed in the contact region CR2.

[Manufacturing Method]

Next, with reference to FIG. 9 to FIG. 16, which are schematic X-Z cross-sectional surfaces, a part of the method for manufacturing the semiconductor memory device according to the first embodiment is described.

[Preparation Step]

In the manufacturing method, first, the transistor layer $L_{TR}$ and the wiring layers D0, D1, D2 are formed on the semiconductor substrate 100 (FIG. 4, FIG. 5). An insulating layer is formed on the upper surface of the wiring layer D2, the conductive layer 112 is formed on the upper surface of this insulating layer, and the conductive layer 111 is formed above the conductive layer 112 (FIG. 6).

Figure 9:
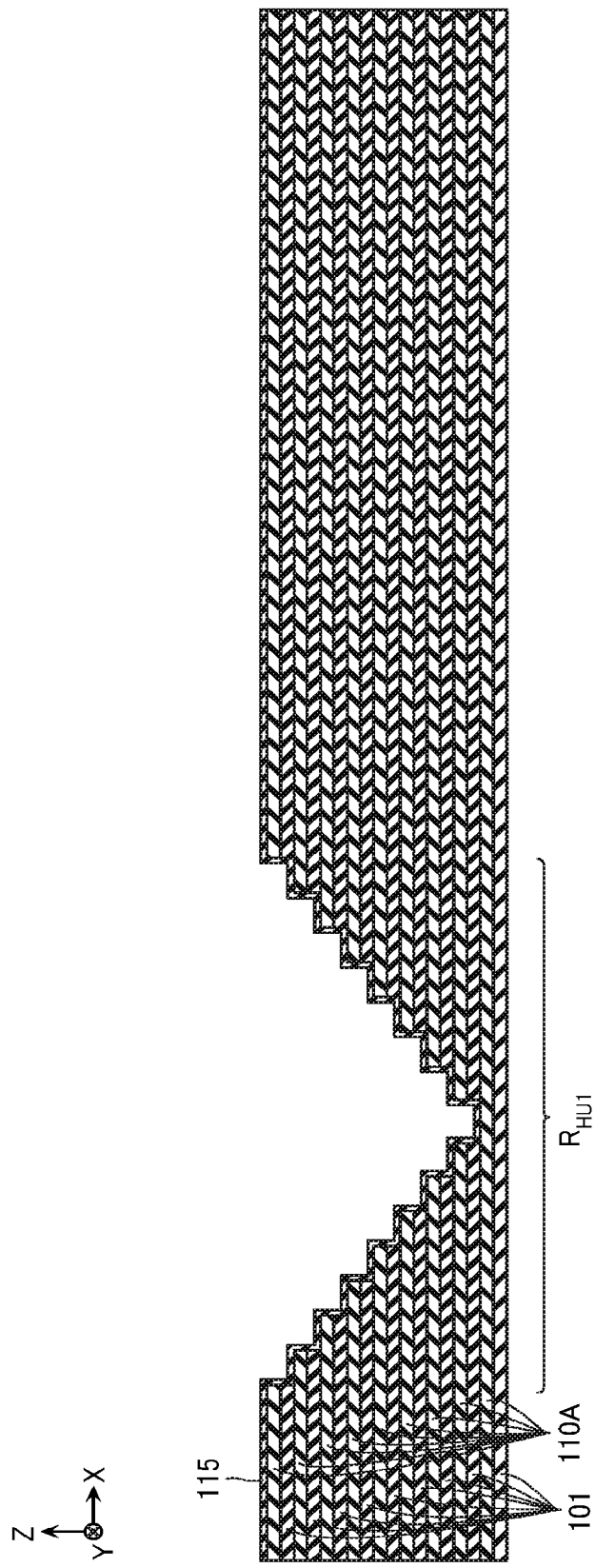
FIG. 9 is a schematic cross-sectional view illustrating a method for manufacturing the semiconductor memory device according to the first embodiment.

[First Step: FIG. 9]

The first step is described with reference to FIG. 9.

In the first step, first, the plurality of insulating layers 101 and a plurality of sacrifice layers 110A are formed alternately on the conductive layer 111 (FIG. 6). The sacrifice layer 110A contains, for example, silicon nitride (SiN). For example, this step is performed by Chemical Vapor Deposition (CVD) or the like.

Next, in the hook-up region $R_{HU1}$, a part of the insulating layers 101 and the sacrifice layers 110A are removed to form the structure of the substantially staircase pattern depressed in the V-shape. This step is performed by forming resists on the upper surfaces of the insulating layers 101 and the sacrifice layers 110A formed alternately and repeatedly removing a part of the insulating layers 101, removing a part of the sacrifice layers 110A, and removing a part of the resists. The step of removing the insulating layers 101, the sacrifice layers 110A, and the resists are performed by, for example, wet etching or dry etching, such as Reactive Ion Etching (RIE) (hereinafter referred to as "etching or the like" in some cases).

After the structure of the substantially staircase pattern depressed in the V-shape is formed, an etching stopper 115 is formed on the upper surfaces, the side surfaces of the structure of the substantially staircase pattern and the upper surface of the sacrifice layer 110A at the uppermost layer. The etching stopper 115 contains, for example, silicon nitride (SiN). For example, this step is performed by Low-Pressure Chemical Vapor Deposition (CVD) or the like.

Figure 10:
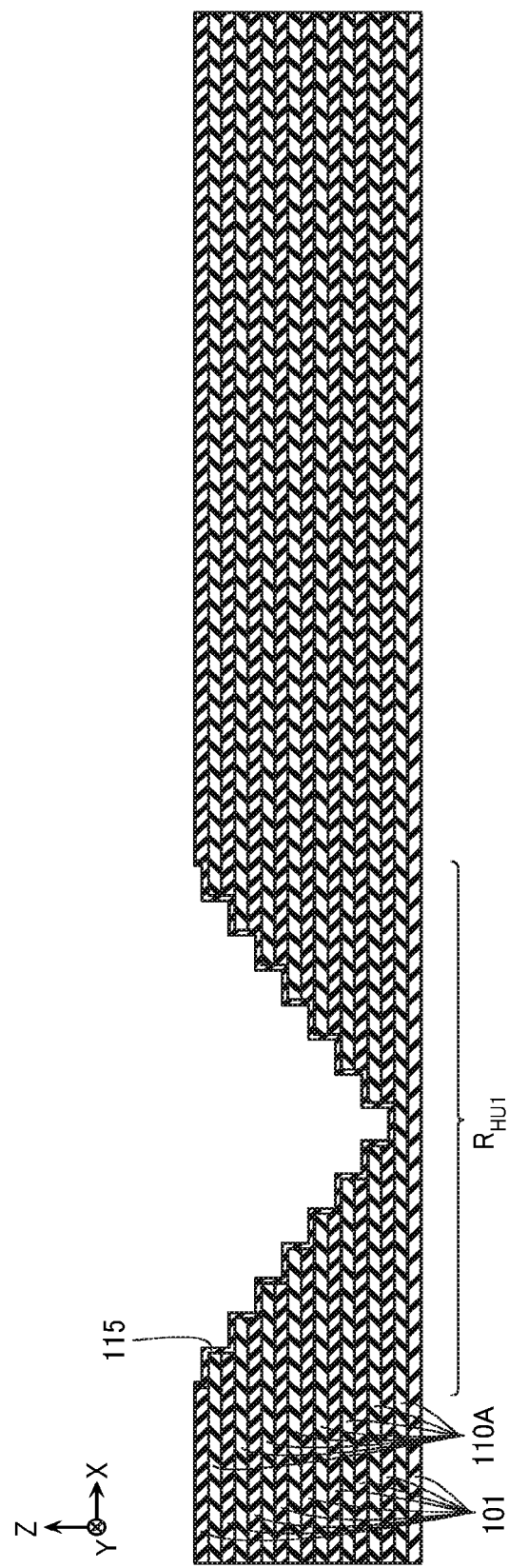
FIG. 10 is a schematic cross-sectional view illustrating the method for manufacturing the semiconductor memory device according to the first embodiment.

[Second Step: FIG. 10]

The second step is described with reference to FIG. 10.

In the second step, first, the unnecessary etching stoppers 115 formed on the upper surface and the side surfaces of the sacrifice layer 110A at the uppermost layer are removed. For example, this step is performed by etching or the like.

Next, among the plurality of sacrifice layers 110A, one uppermost layer is removed. After removing the sacrifice layer 110A at the uppermost layer, among the plurality of insulating layers 101, the surface part of the insulating layer 101 at the uppermost layer is removed by a thickness according to the need. For example, this step is performed by chemical mechanical polishing (CMP) or the like.

Figure 11:
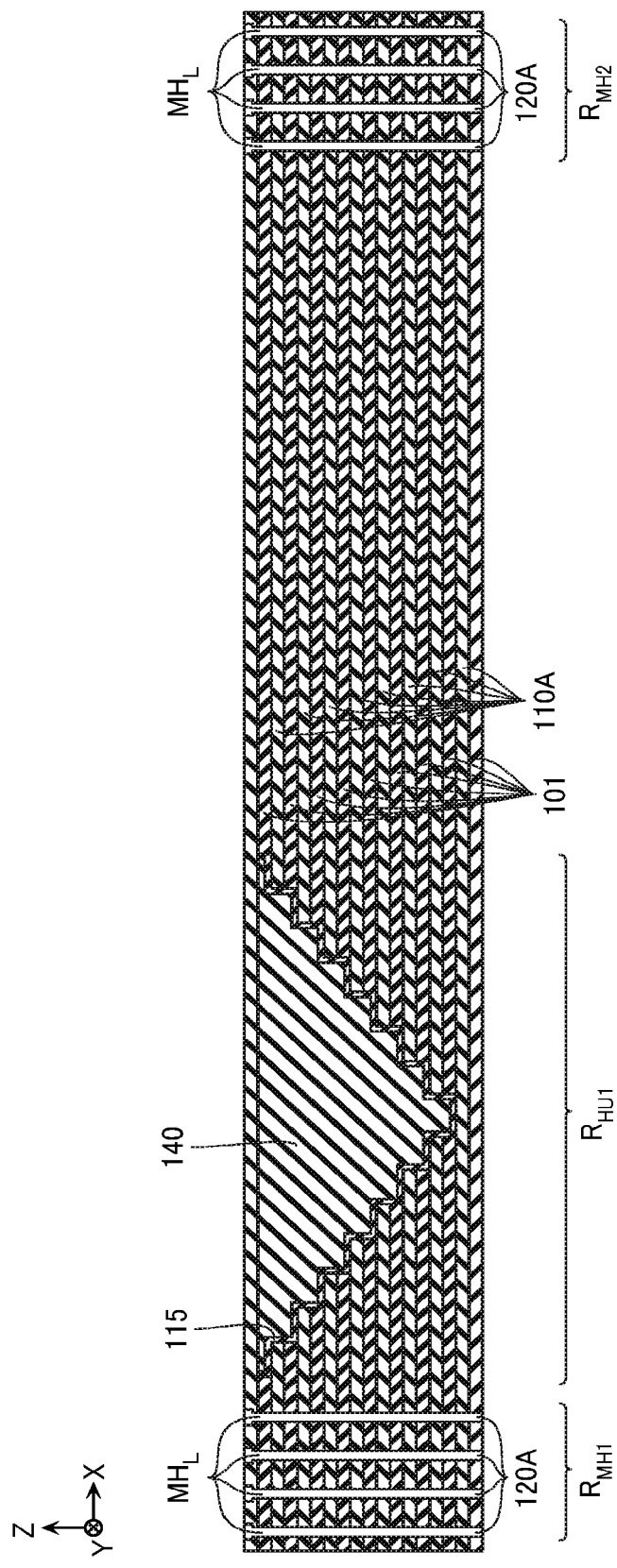
FIG. 11 is a schematic cross-sectional view illustrating the method for manufacturing the semiconductor memory device according to the first embodiment.

[Third Step: FIG. 11]

The third step is described with reference to FIG. 11.

In the third step, first, the insulating layer 140 is filled in the structure of the substantially staircase pattern depressed in the V-shape and the upper surface of the insulating layer 101 at the uppermost layer. The insulating layer 140 contains, for example, silicon oxide ($SiO_2$). For example, this step is performed by CVD or the like.

Next, the upper surface of the insulating layer 140 is polished to be flattened. For example, this step is performed by CMP or the like.

Next, a plurality of memory holes $MH_L$ are formed in the memory hole region $R_{MH1}$ and the memory hole region $R_{MH2}$. The memory hole $MH_L$ extends in the Z-direction and penetrates the insulating layers 101 and the sacrifice layers 110A. For example, the memory holes $MH_L$ are formed by RIE or the like.

Next, amorphous silicons 120A are filled in the memory holes $MH_L$. For example, this step is performed by a method, such as CVD. In this step, before the amorphous silicon 120A is filled, an insulating film, such as silicon oxide ($SiO_2$) or silicon nitride (SiN), may be formed on the inner peripheral surface of the memory hole $MH_L$.

Figure 12:
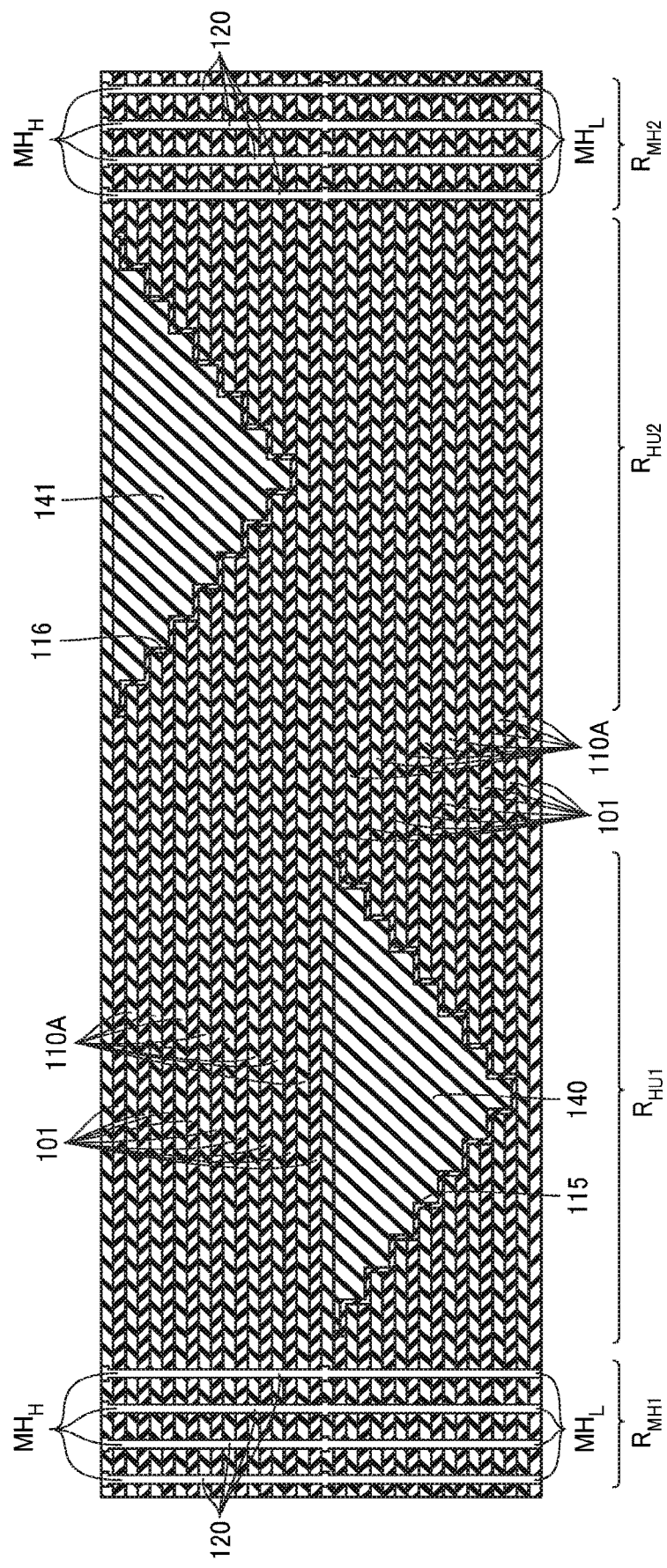
FIG. 12 is a schematic cross-sectional view illustrating the method for manufacturing the semiconductor memory device according to the first embodiment.

[Fourth Step: FIG. 12]

The fourth step is described with reference to FIG. 12.

The fourth step performs the manufacturing method almost similar to the manufacturing method performed by the above-described first step to the third step on a part upper than the insulating layer 140.

That is, first, on the insulating layer 140, the plurality of insulating layers 101 and the plurality of sacrifice layers 110A are alternately formed. The sacrifice layer 110A contains, for example, silicon nitride (SiN). For example, this step is performed by CVD or the like.

Note that the insulating layer 101 and the sacrifice layer 110A formed upward the insulating layer 140 are referred to as the insulating layer 101 and the sacrifice layer 110A of the upper layers in some cases. Additionally, the insulating layer 101 and the sacrifice layer 110A formed downward the insulating layer 140 are referred to as the insulating layer 101 and the sacrifice layer 110A of the lower layers in some cases.

Next, in the hook-up region $R_{HU2}$, a part of the insulating layers 101 and the sacrifice layers 110A of the upper layers are removed by, for example, etching or the like to form the structure of the substantially staircase pattern depressed in the V-shape.

Next, an etching stopper 116 is formed on the upper surfaces and the side surfaces of the structure of the substantially staircase pattern formed in the hook-up region $R_{HU2}$ and the upper surface of the insulating layer 101 at the uppermost layer by, for example, Low-Pressure CVD or the like. The etching stopper 116 contains, for example, silicon nitride (SiN).

Next, the unnecessary etching stopper 116 formed on the upper surface and the side surfaces of the insulating layer 101 at the uppermost layer is removed by etching or the like.

Next, the insulating layer 141 is filled in the structure of the substantially staircase pattern depressed in the V-shape formed in the hook-up region $R_{HU2}$ and the upper surface of the insulating layer 101 at the uppermost layer. The insulating layer 141 contains, for example, silicon oxide ($SiO_2$). For example, this step is performed by CVD or the like.

Next, the upper surface of the insulating layer 141 is polished to be flattened. For example, this step is performed by CMP or the like.

Next, in the memory hole region $R_{MH1}$ and the memory hole region $R_{MH2}$, a plurality of memory holes $MH_H$ are formed in the insulating layers 101 and the sacrifice layers 110A of the upper layers. The plurality of memory holes $MH_H$ extend in the Z-direction, penetrate the insulating layers 101 and the sacrifice layers 110A of the upper layers, and reach the upper end portions of the memory holes $MH_L$, which are formed in the insulating layers 101 and the sacrifice layers 110A of the lower layers. The step of forming the memory holes $MH_H$ is performed by, for example, RIE or the like.

Next, the amorphous silicons 120A filled in the memory holes $MH_L$ are removed. For example, this step is performed by a method, such as wet etching. Thus, the memory hole $MH_H$ communicates with the memory hole $MH_L$, which is in a hollow state by removing the amorphous silicon 120A.

Next, in the inner peripheral surfaces of the memory holes $MH_L$, $MH_H$ formed in the memory hole region $R_{MH1}$ and the memory hole region $R_{MH2}$, the gate insulating films 130, the semiconductor columns 120, and the insulating layers 125 are formed (FIG. 6). For example, this step is performed by CVD or the like.

Figure 13:
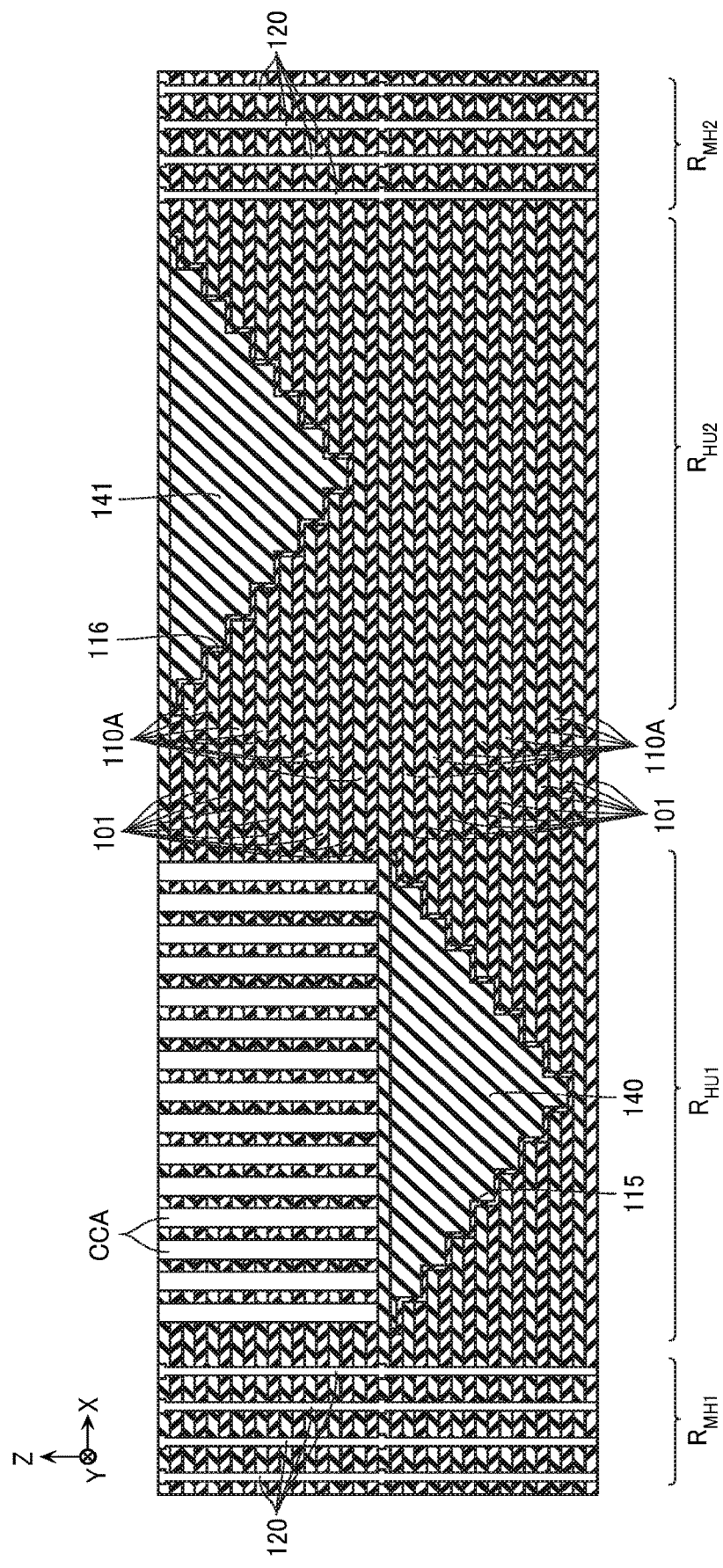
FIG. 13 is a schematic cross-sectional view illustrating the method for manufacturing the semiconductor memory device according to the first embodiment.

[Fifth Step: FIG. 13]

The fifth step is described with reference to FIG. 13.

In the fifth step, in the hook-up region $R_{HU1}$, contact holes CCA are formed in the insulating layers 101 and the sacrifice layers 110A of the upper layers. These contact holes CCA are formed at positions corresponding to the contacts CC (FIG. 4) disposed in the hook-up region $R_{HU1}$. The contact hole CCA is formed by, for example, a method, such as RIE.

Next, amorphous silicon is filled in the contact holes CCA formed in the hook-up region $R_{HU1}$.

Next, trenches for replacement (not illustrated) are formed at positions corresponding to the inter-block insulating layers ST and the inner-block insulating layers st (FIG. 3, FIG. 6). Trenches for the replacement extend in the Z-direction and the X-direction to separate the conductive layer 111 (FIG. 6) and the upper layer part of the semiconductor layer 113 (FIG. 6) in the Y-direction, in addition to the insulating layer 101 and the sacrifice layer 110A. For example, this step is performed by RIE or the like.

Figure 14:
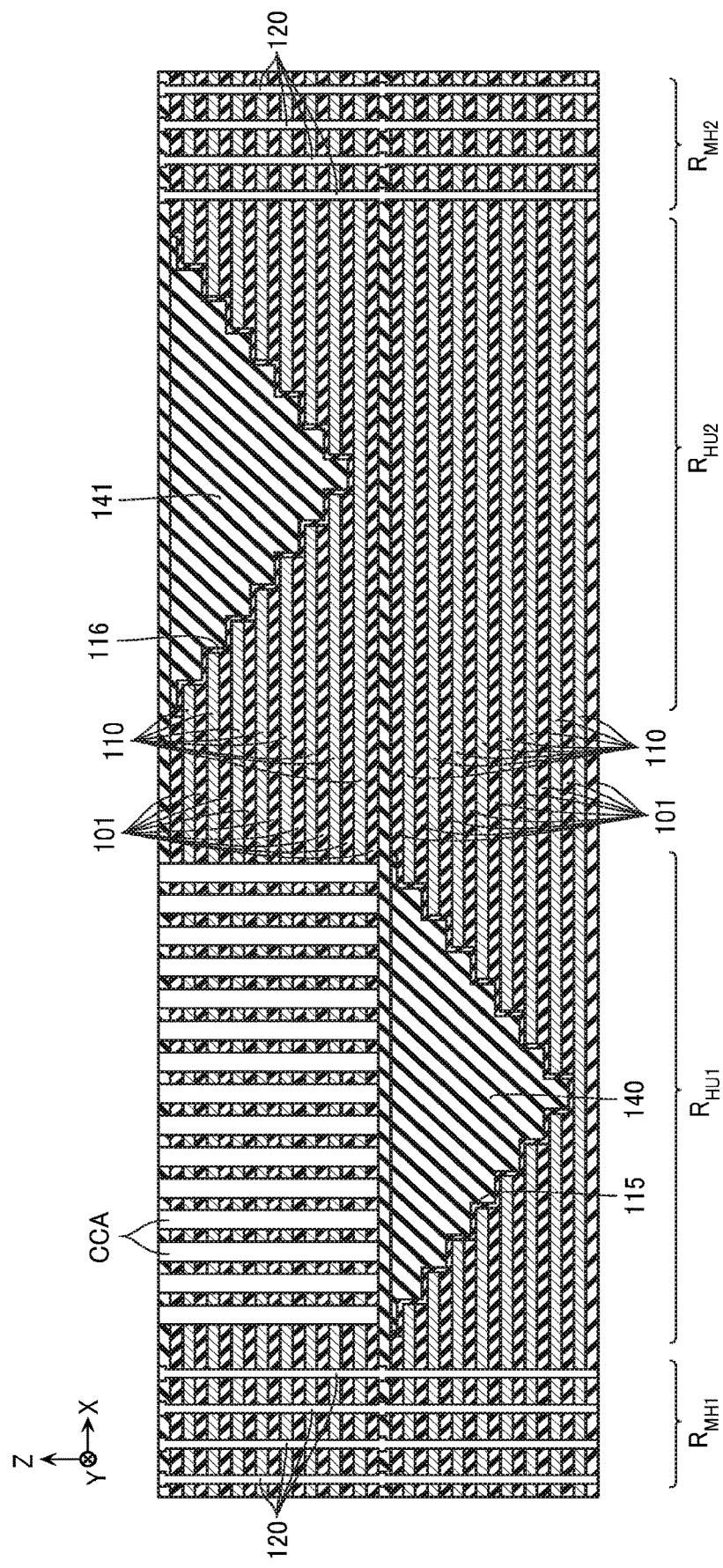
FIG. 14 is a schematic cross-sectional view illustrating the method for manufacturing the semiconductor memory device according to the first embodiment.

[Sixth Step: FIG. 14]

The sixth step is described with reference to FIG. 14.

In the sixth step, wet etching or the like using a liquid etchant, such as phosphoric acid, via trenches for the replacement to selectively remove the sacrifice layers 110A.

Next, the conductive layers 110 are formed at the parts from which the sacrifice layers 110A have been removed. For example, this step is performed by film formation of the conductive layers 110 by CVD or the like via the trenches for the replacement. The conductive layer 110 may contain a stacked film of a barrier conductive film, such as titanium nitride (TiN), and a metal film, such as tungsten (W), or the like.

In the following description, such a step, that is, a step like selectively removing the sacrifice layers 110A by wet etching or the like and after that forming the conductive layers 110 at the parts from which the sacrifice layers 110A have been removed is referred to as "replacement" in some cases.

Next, trenches for the replacement are buried with silicon oxide ($SiO_2$) or the like to form the inter-block insulating layers ST and the inner-block insulating layers st.

Figure 15:
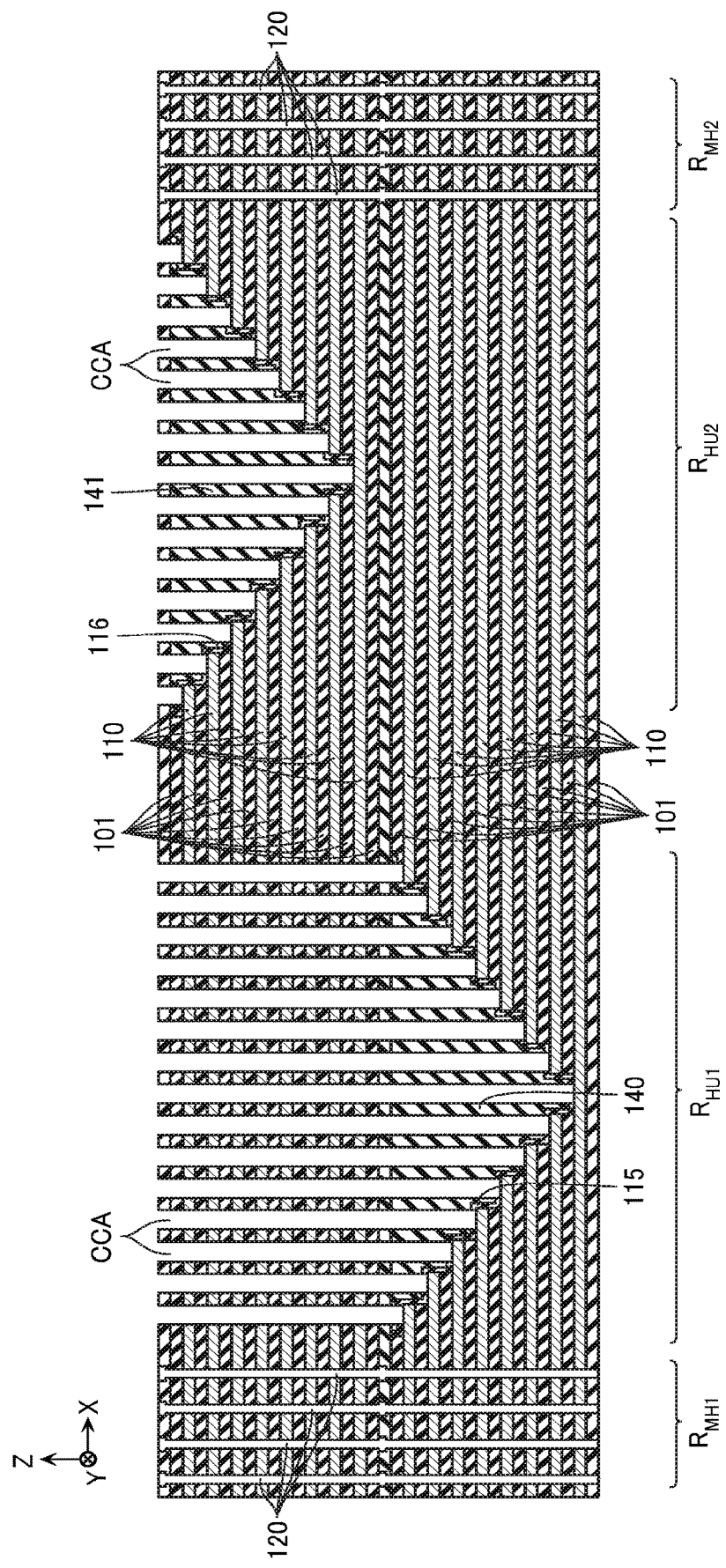
FIG. 15 is a schematic cross-sectional view illustrating the method for manufacturing the semiconductor memory device according to the first embodiment.

[Seventh Step: FIG. 15]

The seventh step is described with reference to FIG. 15.

In the seventh step, in the hook-up region $R_{HU1}$, the amorphous silicons filled in the contact holes CCA are removed. For example, this step is performed by wet etching or the like.

Next, in the hook-up region $R_{HU1}$, holes extending in the Z-direction from the lower ends of the contact holes CCA to the insulating layers 140 are formed to extend the contact holes CCA downward. The lower end of the contact hole CCA extended downward reaches the etching stopper 115. For example, this step is performed by a method, such as RIE.

Simultaneously with the extension of the contact holes CCA downward in the hook-up region $R_{HU1}$, holes extending in the Z-direction are formed in the insulating layer 141 in the hook-up region $R_{HU2}$ to form the contact holes CCA. That is, the contact holes CCA are formed at positions corresponding to the contacts CC (FIG. 4) disposed in the hook-up region $R_{HU2}$. The contact hole CCA has a lower end reaching the etching stopper 116. For example, this step is performed by a method, such as RIE.

Next, insulating films made of silicon oxide ($SiO_2$) or the like are formed on the inner surfaces of the contact holes CCA formed in the hook-up region $R_{HU1}$ and the inner surfaces of the contact holes CCA formed in the hook-up region $R_{HU2}$.

Further, a part of the etching stoppers 115 to which the lower ends of the contact holes CCA reach in the hook-up region $R_{HU1}$ and a part of the etching stoppers 116 to which the lower ends of the contact holes CCA reach in the hook-up region $R_{HU2}$ are removed by wet etching or the like.

The contact holes CCA in the hook-up region $R_{HU1}$ thus formed extend in the Z-direction and serve as through-holes exposing the upper surfaces of the conductive layers 110 of the lower layers.

Additionally, the contact holes CCA in the hook-up region $R_{HU2}$ thus formed extend in the Z-direction and serve as through-holes exposing the upper surfaces of the conductive layers 110 of the upper layers.

Figure 16:
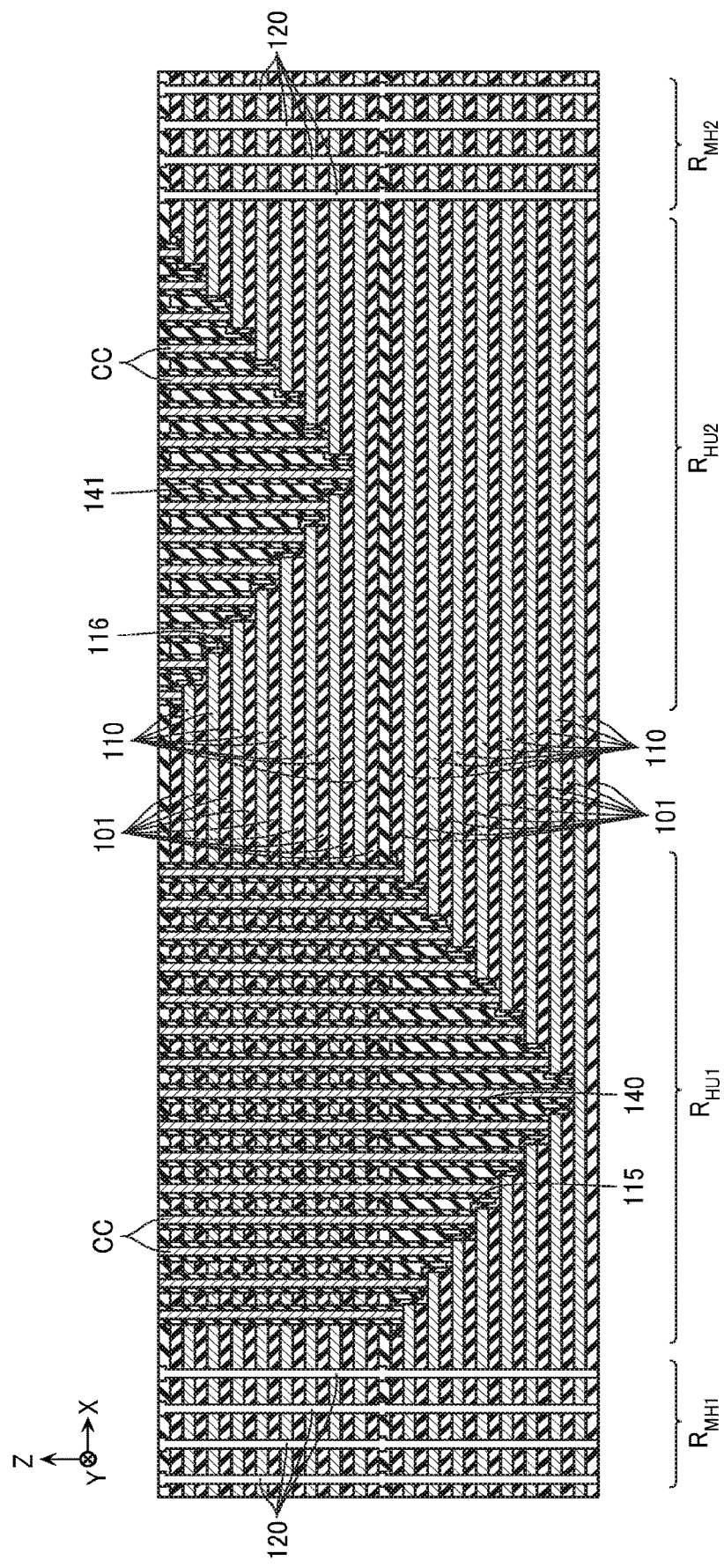
FIG. 16 is a schematic cross-sectional view illustrating the method for manufacturing the semiconductor memory device according to the first embodiment.

[Eighth Step: FIG. 16]

The eighth step is described with reference to FIG. 16.

In the eighth step, barrier conductive films, such as titanium nitride (TiN), are formed on the inner surfaces of the contact holes CCA formed in the hook-up region $R_{HU1}$ and the contact holes CCA formed in the hook-up region $R_{HU2}$, and then the respective contact holes CCA are filled with tungsten (W) or the like. Accordingly, the contacts CC are formed in the hook-up region $R_{HU1}$ and the hook-up region $R_{HU2}$.

Comparative Example

Figure 17:
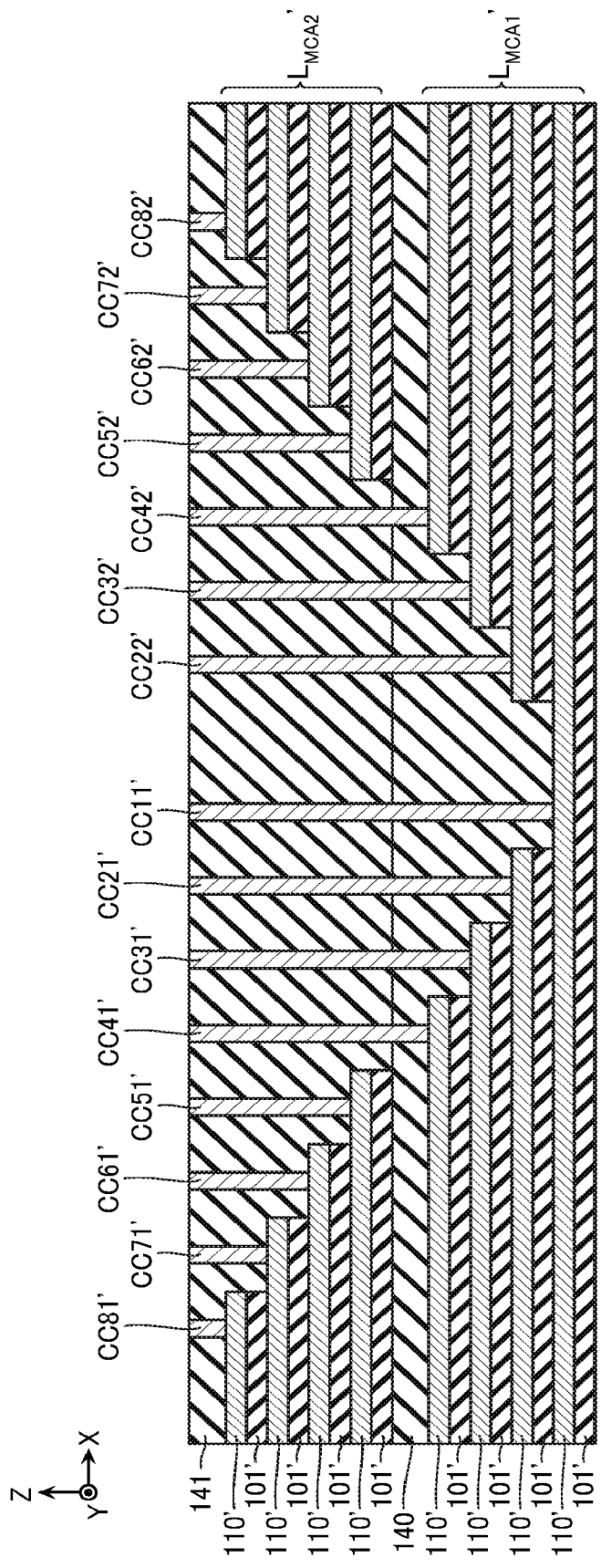
FIG. 17 is a schematic cross-sectional view illustrating a semiconductor memory device according to a comparative example.
Figure 18:
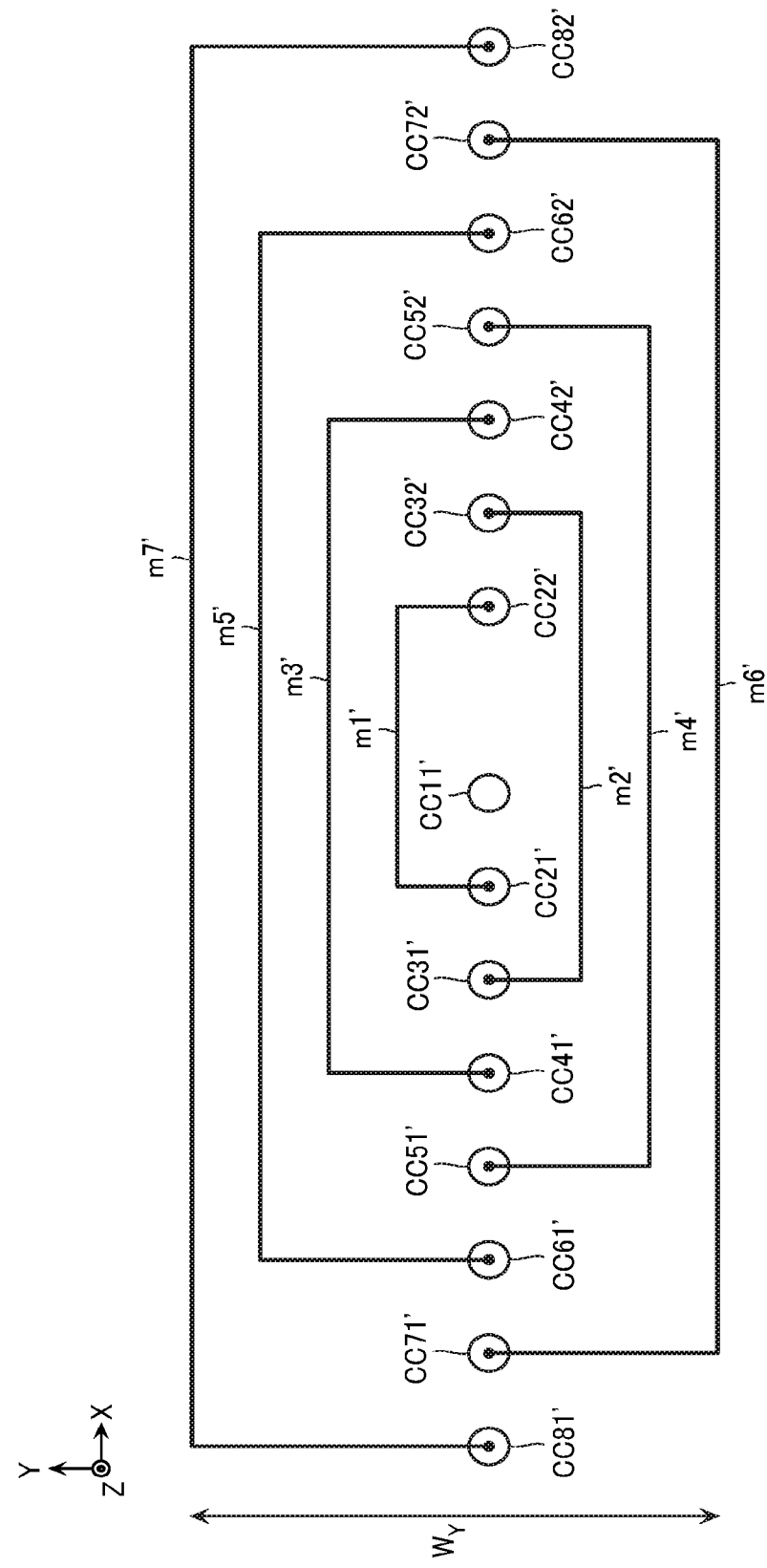
FIG. 18 is a connection drawing schematically illustrating a connection state between contacts in the comparative example.

Here, with reference to FIG. 17 and FIG. 18, a semiconductor memory device according to the comparative example is described. FIG. 17 is a simplified schematic cross-sectional view describing the semiconductor memory device according to the comparative example. FIG. 18 schematically illustrates a connection state between contacts CC' in the comparative example.

As illustrated in FIG. 17, in the semiconductor memory device according to the comparative example, a memory cell array layer $L_{MCA2}'$ of an upper layer including conductive layers 110' and insulating layers 101' alternately stacked is formed above a memory cell array layer $L_{MCA1}'$ of a lower layer including conductive layers 110' and the insulating layers 101' alternately stacked. Additionally, one structure of a substantially staircase pattern depressed in a V-shape is formed from the memory cell array layer $L_{MCA1}'$ of the lower layer to the memory cell array layer $L_{MCA2}'$ of the upper layer.

Thus, since the structure of the substantially staircase pattern is formed, the plurality of layers of the conductive layers 110' disposed in the memory cell array layer $L_{MCA1}'$ of the lower layer are physically separated into apart on one side (the left side in FIG. 17) in the X-direction and a part on the other side (the right side in FIG. 17) in the X-direction excluding the conductive layer 110' at the lowermost layer. The plurality of layers of the conductive layers 110' disposed in the memory cell array layer $L_{MCA2}'$ of the upper layer are physically separated into a part on one side (the left side in FIG. 17) in the X-direction and a part on the other side (the right side in FIG. 17) in the X-direction.

To the respective conductive layers 110', contacts CC11', CC21', CC22' to CC81', and CC82' extending in the Z-direction are connected. These contacts CC11', CC21', CC22' to CC81', and CC82' are connected with wirings m1' to m7' in the state illustrated in FIG. 18. In view of this, the conductive layers 110' physically separated into the part on the one side (the left side in FIG. 17) in the X-direction and the part on the other side (the right side in FIG. 17) are electrically connected with the contacts CC21', CC22' to CC81', and CC82' and the wirings m1' to m7'.

As illustrated in FIG. 18, to connect the contacts CC21', CC22' to CC81', and CC82', the seven wirings m1' to m7' arranged in the Y-direction are required. A width of a connection region in which the wirings m1' to m7' are disposed in the Y-direction is $W_Y$.

[Effects of First Embodiment]

Figure 19:
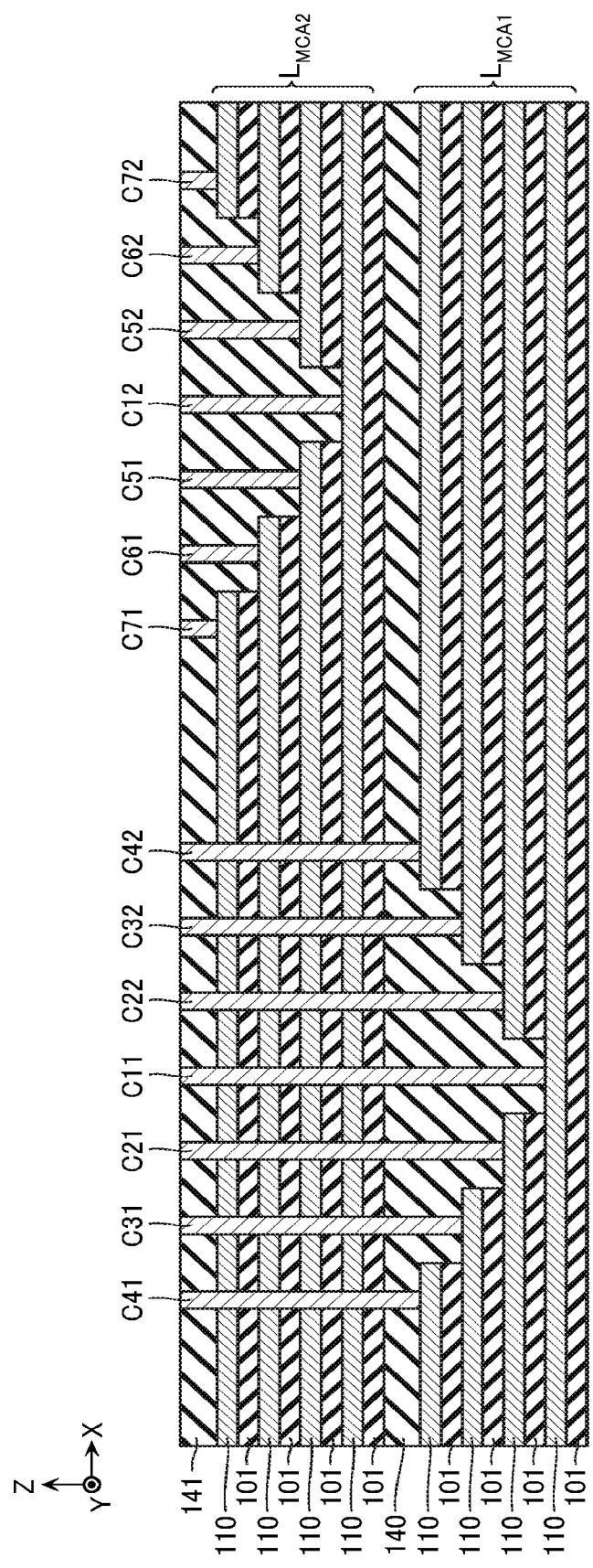
FIG. 19 is a schematic cross-sectional view illustrating the semiconductor memory device according to the first embodiment.
Figure 20:
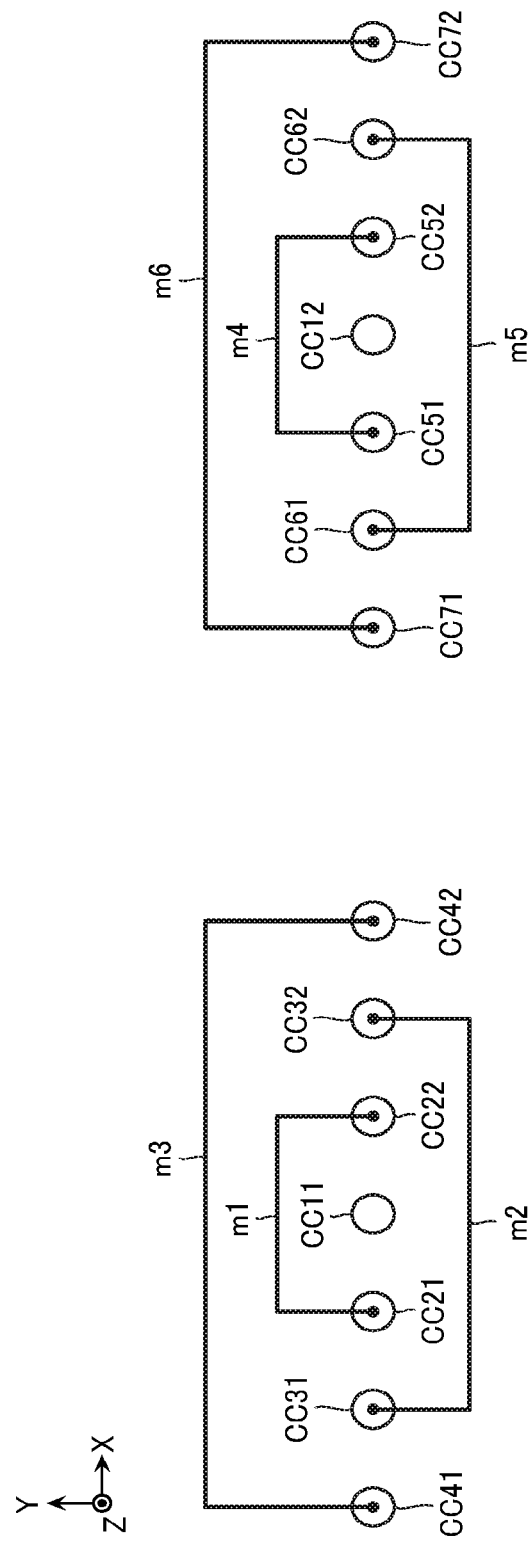
FIG. 20 is a connection drawing schematically illustrating a connection state between contacts in the first embodiment.

FIG. 19 is a schematic cross-sectional view illustrating the simplified semiconductor memory device according to the first embodiment corresponding to FIG. 17. FIG. 20 schematically illustrates the connection state between the contacts CC in the schematic structure in FIG. 19.

As illustrated in FIG. 19, in the first embodiment, the structure of the substantially staircase pattern formed in the memory cell array layer $L_{MCA1}$ of the lower layer and the structure of the substantially staircase pattern formed in the memory cell array layer $L_{MCA2}$ of the upper layer are formed at positions displaced in the X-direction.

To the respective conductive layers 110, contacts CC11, CC12 to CC71, and CC72 extending in the Z-direction are connected. These contacts CC11, CC12 to CC71, and CC72 are connected with wirings m1 to m6 in the state illustrated in FIG. 20.

In view of this, as illustrated in FIG. 20, among the conductive layers 110 disposed in the memory cell array layer $L_{MCA1}$ of the lower layer, the conductive layers 110 physically separated into the part on the one side (the left side in FIG. 19) in the X-direction and the part on the other side (the right side in FIG. 19) are electrically connected with the contacts CC21, CC22 to CC41, and CC42 and the wirings m1 to m3.

Additionally, as illustrated in FIG. 20, among the conductive layers 110 disposed in the memory cell array layer $L_{MCA2}$ of the upper layer, the conductive layers 110 physically separated into the part on the one side (the left side in FIG. 19) and the part on the other side (the right side in FIG. 19) in the X-direction are electrically connected with contacts CC51, CC52 to CC71, and CC72 and wirings m4 to m6.

In the configuration, the wirings m1 to m3 arranged in the Y-direction and the wirings m4 to m6 arranged in the Y-direction are displaced in the X-direction. Accordingly, the number of wirings arranged in the Y-direction becomes around the half of the number of wirings arranged in the Y-direction in the comparative example illustrated in FIG. 18. In view of this, in the first embodiment, the width in the Y-direction of the connection region in which the wirings m1 to m6 are disposed becomes about $W_y/2$, which is around the half of that of the comparative example.

Thus, in the first embodiment, compared with the comparative example, the width in the Y-direction of the connection region becomes narrower. In view of this, in the first embodiment, even when the number of wirings disposed in the Y-direction increases according to the increase in the number of the stacked conductive layers 110, the increase in widths in the Y-direction of the connection regions CNR1, CNR2 (FIG. 3) and eventually the width in the Y-direction of the memory block BLK (FIG. 3) can be reduced.

Second Embodiment

Next, a configuration of a semiconductor memory device according to the second embodiment is described with reference to the drawings. Note that, in the following description, same reference numerals are given to configuration parts similar to those of the first embodiment and description thereof will be simplified and omitted.

[Structure]

Figure 21:
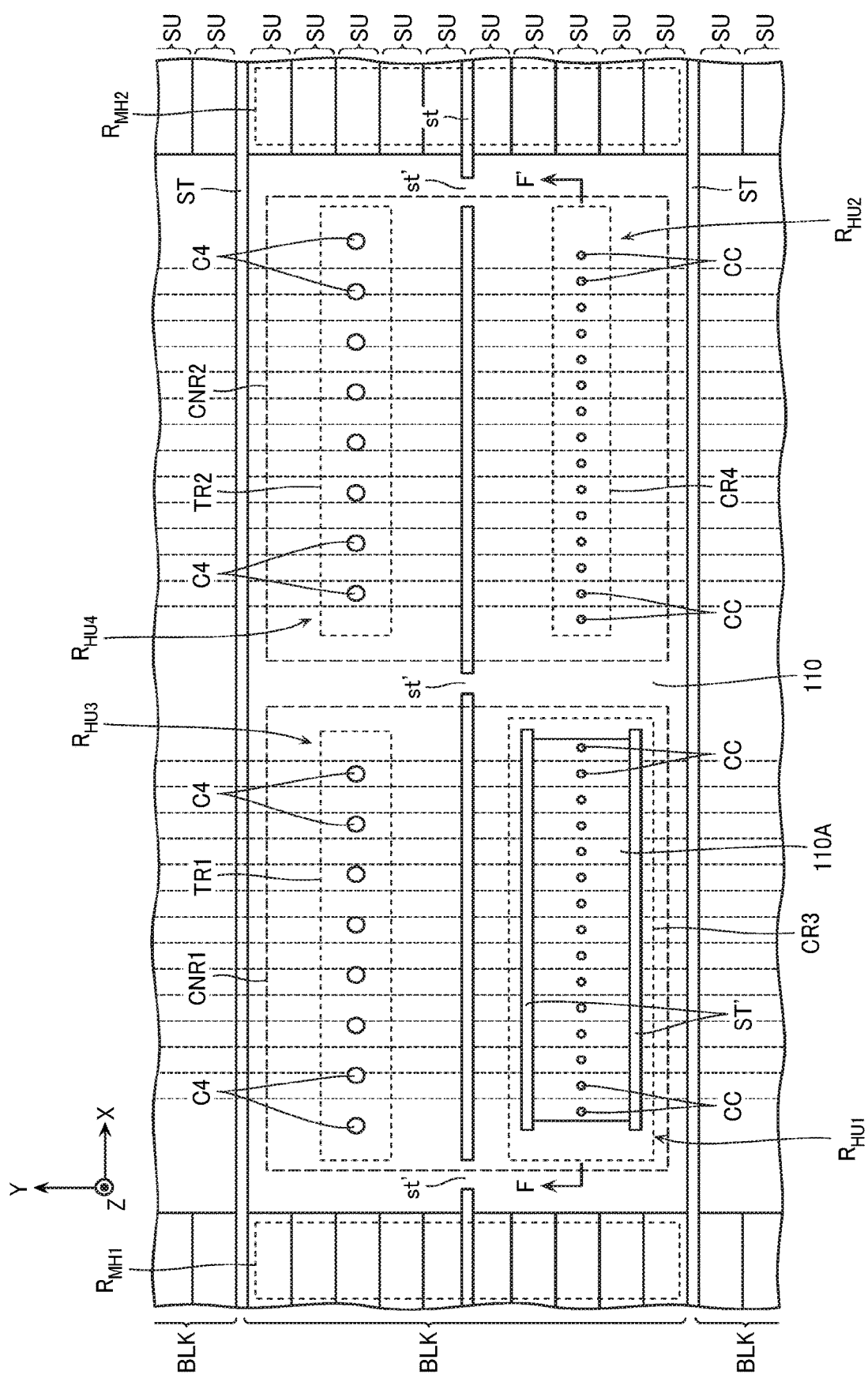
FIG. 21 is a schematic enlarged view of a semiconductor memory device according to a second embodiment.
Figure 22:
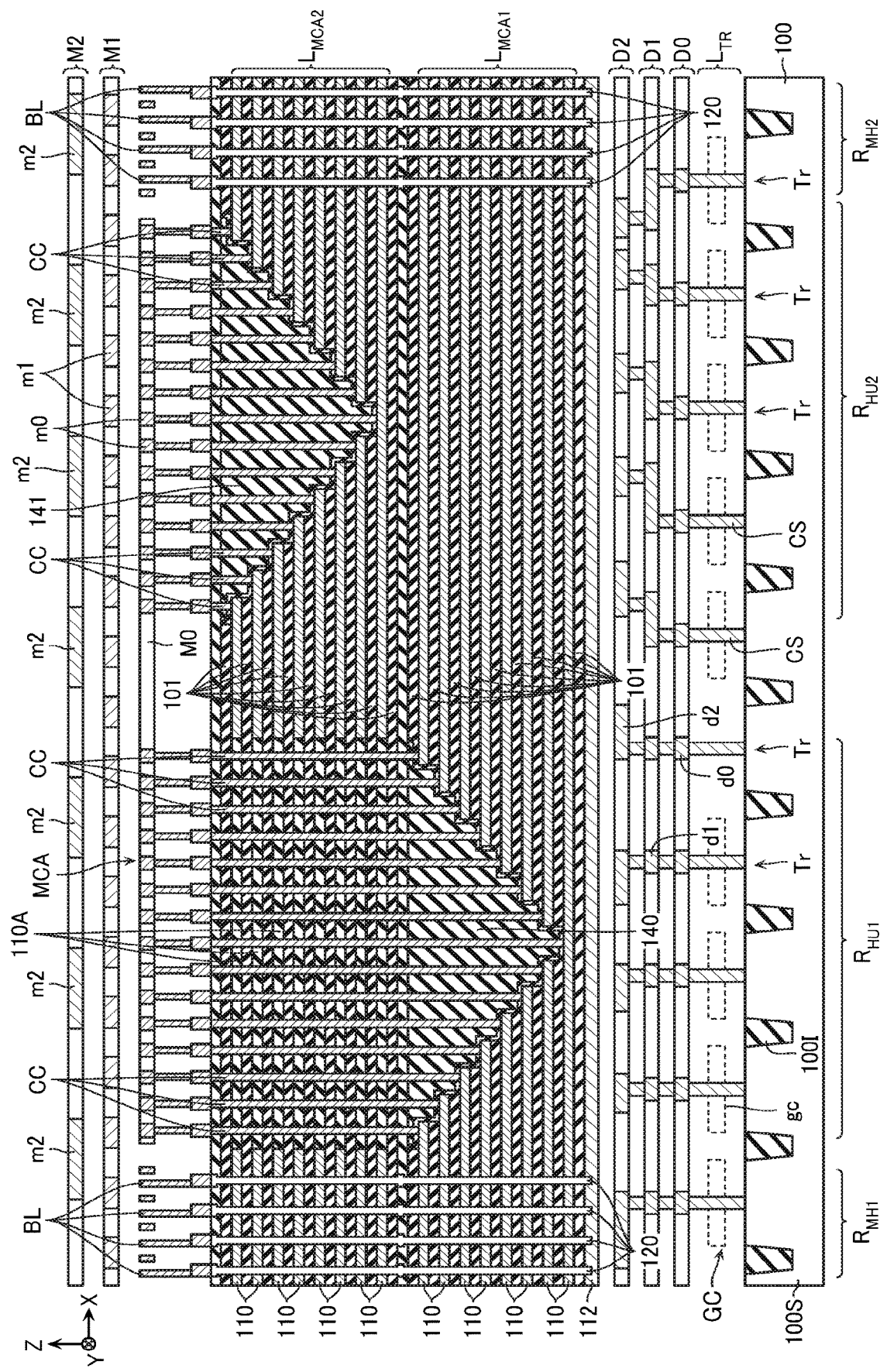
FIG. 22 is a schematic cross-sectional view of the structure illustrated in FIG. 21 taken along the line F-F' and viewed in the arrow direction.

FIG. 21 is a schematic enlarged plan view of the semiconductor memory device according to the second embodiment, is equivalent to the schematic enlarged view of apart indicated by A in FIG. 2, and illustrates a configuration in a memory cell array layer of the upper layer. FIG. 22 is a schematic cross-sectional view of the structure illustrated in FIG. 21 taken along the line F-F' and viewed in the arrow direction.

As illustrated in FIG. 21, the semiconductor memory device according to the second embodiment includes a contact region CR3 instead of the contact region CR1. Additionally, the semiconductor memory device according to the second embodiment includes a contact region CR4 instead of the contact region CR2.

The structure of the memory cell array layer $L_{MCA1}$ in the contact region CR3 is similar to the structure of the memory cell array layer $L_{MCA1}$ in the contact region CR1 according to the first embodiment.

The contact region CR3 of the memory cell array layer $L_{MCA2}$ includes a pair of stopper insulating layers ST' extending in the X-direction, the sacrifice layer 110A extending in the X-direction between the pair of stopper insulating layers ST', and the plurality of contacts CC arranged in the X-direction and have outer peripheral surfaces surrounded by the sacrifice layer 110A.

The pair of stopper insulating layers ST' contain, for example, silicon oxide ($SiO_2$) or the like. The pair of stopper insulating layers ST' are separated in the Y-direction and extend in the Z-direction and the X-direction with the plurality of contacts CC disposed in the contact region CR3 interposed therebetween.

A length of each of the pair of stopper insulating layers ST' in the X-direction is longer than a length of the sacrifice layer 110A in the X-direction. In the X-direction, the one end and the other end of the sacrifice layer 110A are positioned between the one end and the other end of the stopper insulating layer ST'.

One side surfaces in the Y-direction of the pair of stopper insulating layers ST' are connected to the plurality of sacrifice layers 110A and the insulating layers 101 included in the contact region CR3. Additionally, the other side surfaces in the Y-direction of the pair of stopper insulating layers ST' are connected to the plurality of conductive layers 110 and the insulating layers 101 not included in the contact region CR3. A depth in the Z-direction of the pair of stopper insulating layers ST' reaches the position of the lower end of the memory cell array layer $L_{MCA2}$ (FIG. 22) of the upper layer.

As illustrated in FIG. 22, the plurality of sacrifice layers 110A are stacked in the Z-direction instead of the conductive layers 110. Respective both end portions in the X-direction of the sacrifice layers 110A are connected to the conductive layers 110. Respective both end portions in the Y-direction of the sacrifice layers 110A are connected to the stopper insulating layers ST'. Between the plurality of sacrifice layers 110A arranged in the Z-direction, the insulating layers 101 are disposed.

The reason that the sacrifice layers 110A remain in the part interposed between the pair of stopper insulating layers ST' is as follows. Although details are described later in a manufacturing method of the second embodiment, in a step that selectively removes the sacrifice layers 110A by wet etching or the like via trenches for the replacement using a liquid etchant, such as phosphoric acid, the invasion of the liquid etchant is reduced at the part interposed between the pair of stopper insulating layers ST'. As a result, the sacrifice layers 110A remain in the part interposed between the pair of stopper insulating layers ST'.

The contacts CC disposed in the contact region CR3 penetrate the plurality of sacrifice layers 110A in the memory cell array layer $L_{MCA2}$, penetrate the insulating layer 140 filled in the structure of the substantially staircase pattern formed in the memory cell array layer $L_{MCA1}$, and have lower ends in contact with the respective conductive layers 110 in the memory cell array layer $L_{MCA1}$. Note that the insulating layer 102 (FIG. 4) is not disposed on the outer peripheral surface of the contact CC according to the embodiment. The outer peripheral surfaces of the contacts CC according to the embodiment are in contact with the sacrifice layers 110A and the insulating layers 101 disposed between the sacrifice layers 110A in the memory cell array layer $L_{MCA2}$.

The contact region CR4 is configured basically similarly to the contact region CR2. However, the insulating layer 102 (FIG. 4) is not disposed on the outer peripheral surface of the contact CC disposed in the contact region CR4.

[Manufacturing Method]

Figure 23:
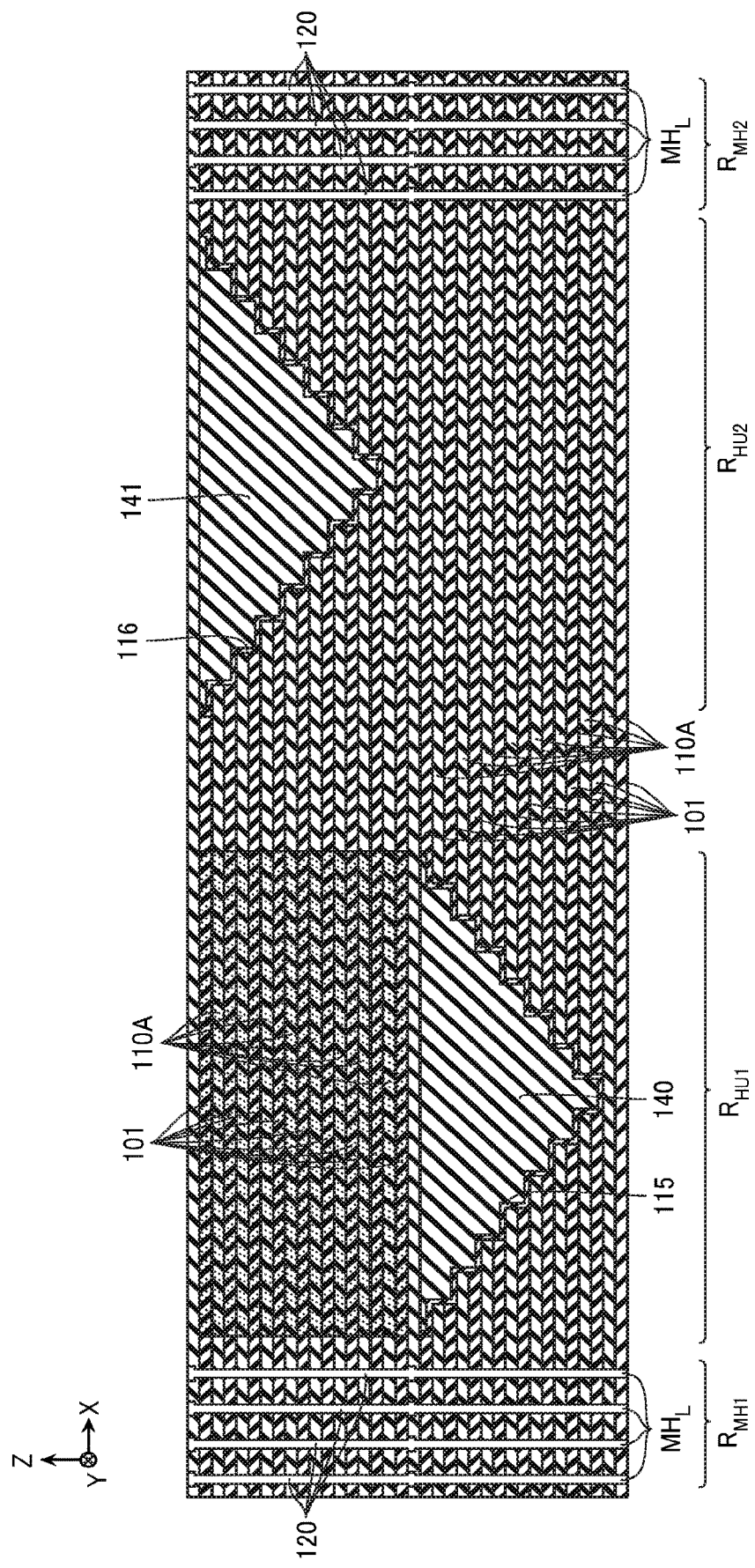
FIG. 23 is a schematic cross-sectional view illustrating a method for manufacturing the semiconductor memory device according to the second embodiment.
Figure 24:
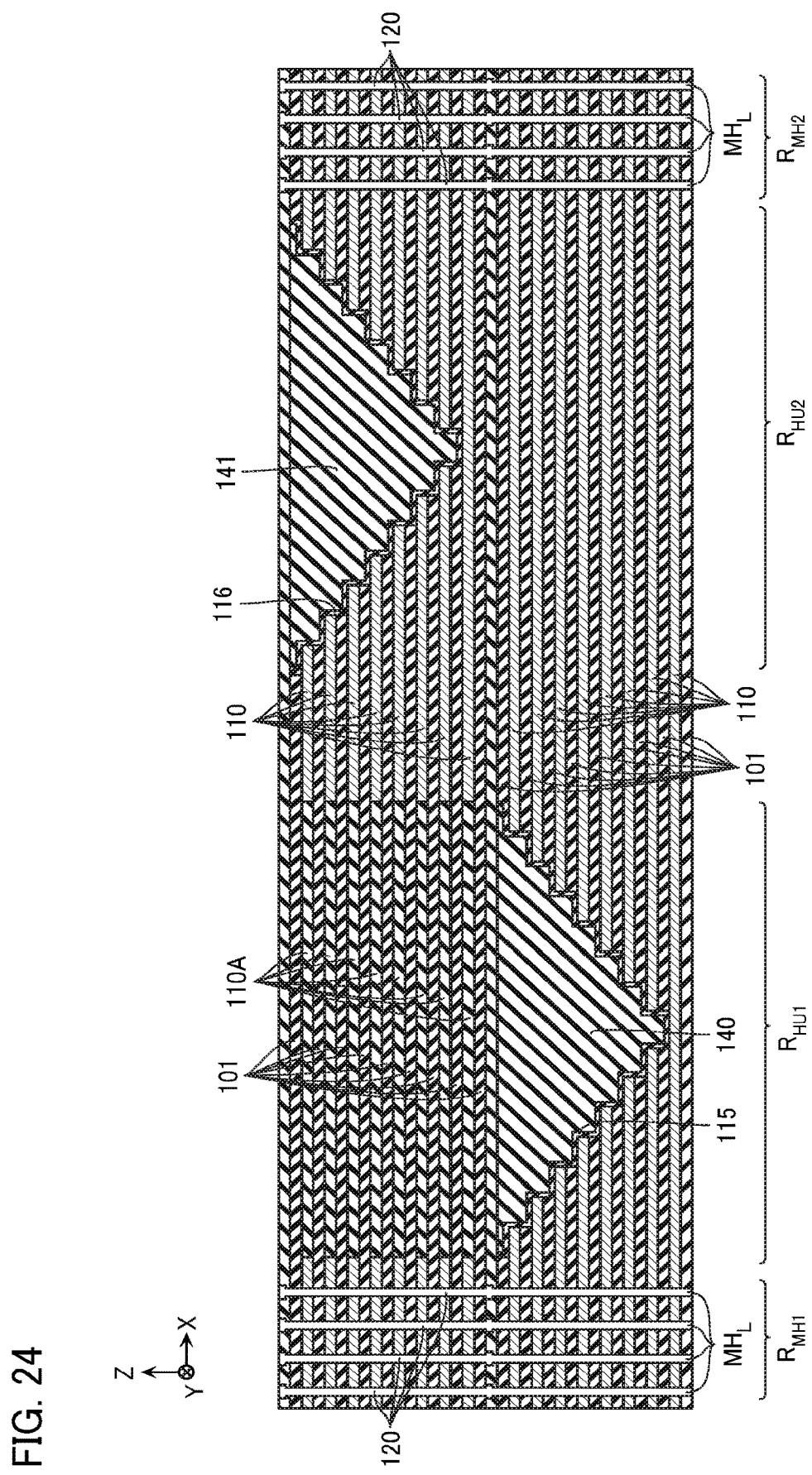
FIG. 24 is a schematic cross-sectional view illustrating the method for manufacturing the semiconductor memory device according to the second embodiment.
Figure 25:
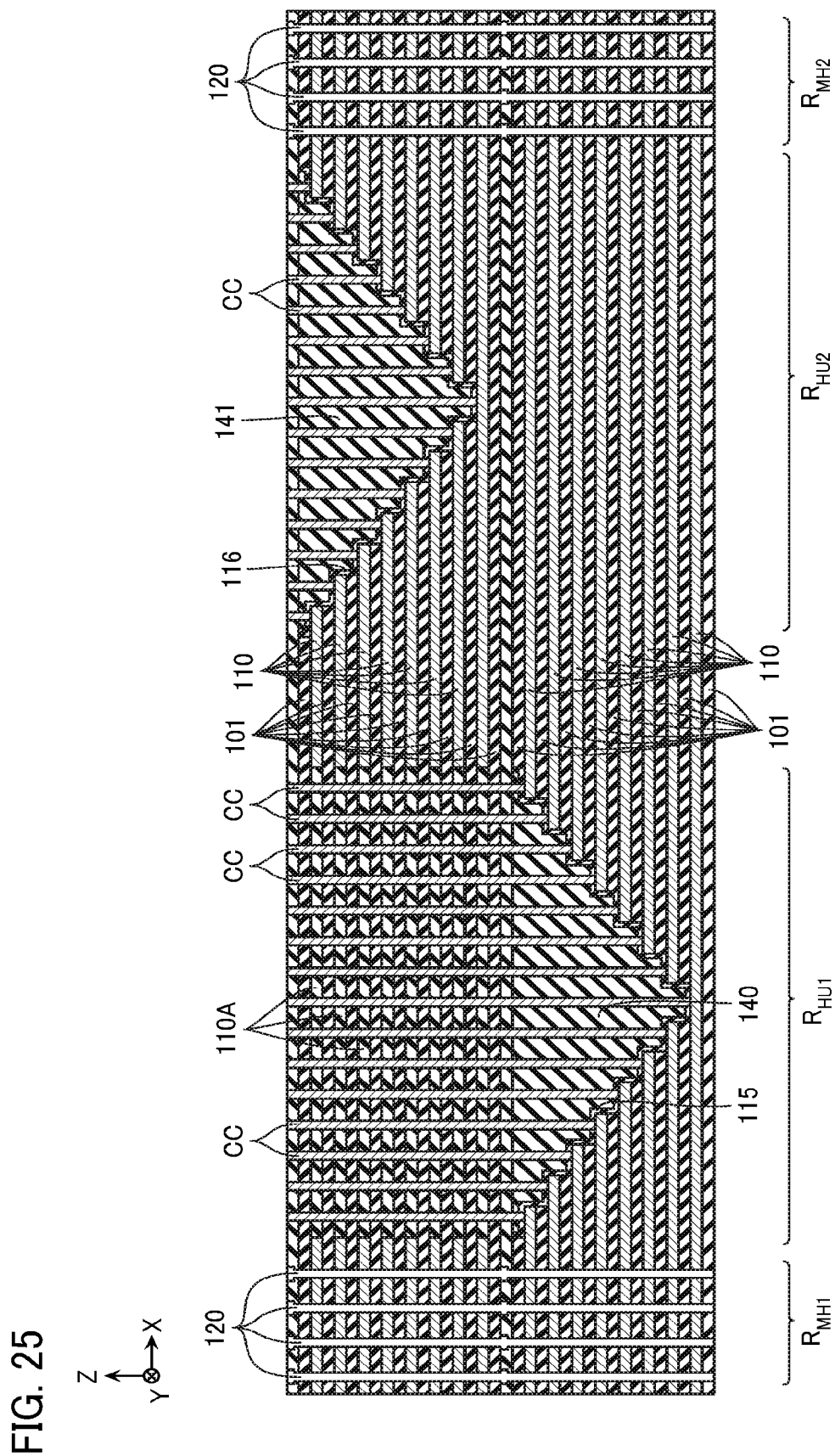
FIG. 25 is a schematic cross-sectional view illustrating the method for manufacturing the semiconductor memory device according to the second embodiment.

Next, with reference to FIG. 23 to FIG. 25, which are schematic X-Z cross-sectional surfaces, a part of the method for manufacturing the semiconductor memory device according to the second embodiment is described. Here, the distinctive part of the manufacturing method of the second embodiment is described.

[State Before Replacement]

FIG. 23 illustrates the state before the replacement.

As illustrated in FIG. 23, the insulating layers 101 and the sacrifice layers 110A of the lower layers are alternately stacked. The structure of the substantially staircase pattern depressed in the V-shape is formed in the insulating layers 101 and the sacrifice layers 110A of the lower layers alternately stacked in the hook-up region $R_{HU1}$. The insulating layer 140 is filled in this structure of the staircase pattern.

The insulating layers 101 and the sacrifice layers 110A of the upper layers are alternately stacked. The structure of the substantially staircase pattern depressed in the V-shape is formed in the insulating layers 101 and the sacrifice layers 110A of the upper layers alternately stacked in the hook-up region $R_{HU2}$. The insulating layer 141 is filled in this structure of the staircase pattern.

The semiconductor columns 120 and the like are formed in the memory hole regions $R_{MH1}$, $R_{MH2}$.

The dotted regions in FIG. 23 are regions interposed between the pair of stopper insulating layers ST' (FIG. 21). These regions include a part of the insulating layers 101 and the sacrifice layers 110A of the upper layers.

[State after Replacement]

FIG. 24 illustrates a state after the replacement.

When wet etching or the like is performed on the insulating layers 101, the sacrifice layers 110A, and the like in the state illustrated in FIG. 23 via trenches for the replacement using the liquid etchant, such as phosphoric acid, the sacrifice layers 110A are selectively removed, and the conductive layers 110 are formed. FIG. 24 illustrates the state.

That is, among the sacrifice layers 110A, the invasion of the liquid etchant is reduced in the regions (the dotted regions in FIG. 23) interposed between the pair of stopper insulating layers ST' (FIG. 21), and therefore the sacrifice layers 110A remain.

On the other hand, the other parts of the sacrifice layers 110A are removed.

The conductive layers 110 are formed in the parts from which the sacrifice layers 110A have been removed by CVD or the like via trenches for the replacement.

[Formation of Contact Holes and Contacts]

FIG. 25 illustrates a state of forming the contact holes and further forming the contacts CC in the contact holes.

In the state illustrated in FIG. 24, the contact holes penetrating the insulating layers 101 and the sacrifice layers 110A of the upper layers and the insulating layer 140 of the lower layer in the hook-up region $R_{HU1}$ are formed.

Simultaneously with this, the contact holes penetrating the insulating layer 141 of the upper layer in the hook-up region $R_{HU2}$ are formed.

Barrier metals, such as titanium nitride (TiN), are formed on the inner surfaces of the contact holes formed in the hook-up region $R_{HU1}$ and the contact holes are filled with tungsten (W) or the like to form the contacts CC in the hook-up region $R_{HU1}$.

Simultaneously with this, barrier metals, such as titanium nitride (TiN), are formed on the inner surfaces of the contact holes formed in the hook-up region $R_{HU2}$, and the contact holes are filled with tungsten (W) or the like to form the contacts CC in the hook-up region $R_{HU2}$.

Third Embodiment

Next, a configuration of a semiconductor memory device according to the third embodiment is described with reference to the drawings. Note that, in the following description, same reference numerals are given to configuration parts similar to those of the first embodiment and description thereof will be simplified and omitted.

[Structure]

Figure 26:
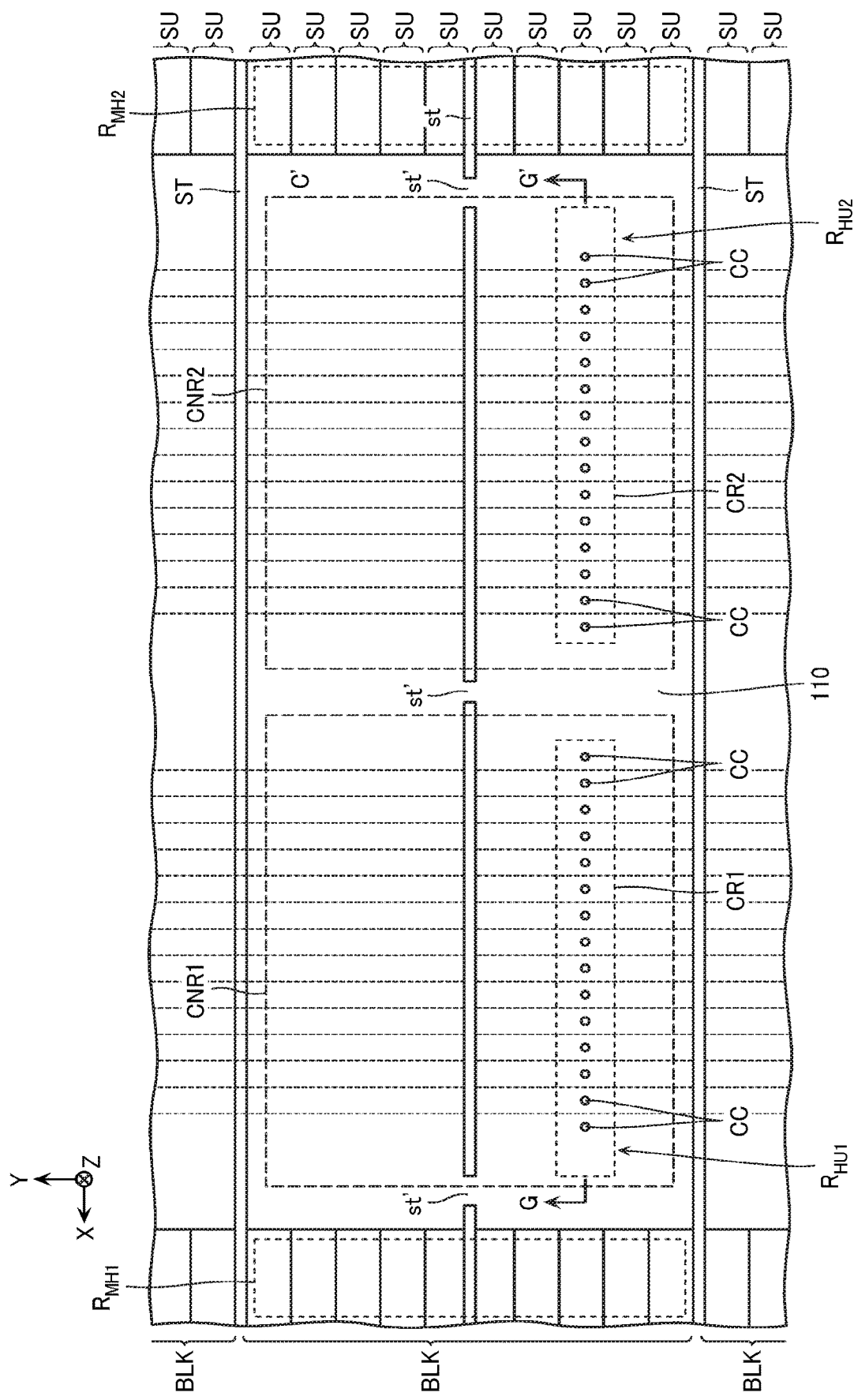
FIG. 26 is a schematic enlarged view of a semiconductor memory device according to a third embodiment.
Figure 27:
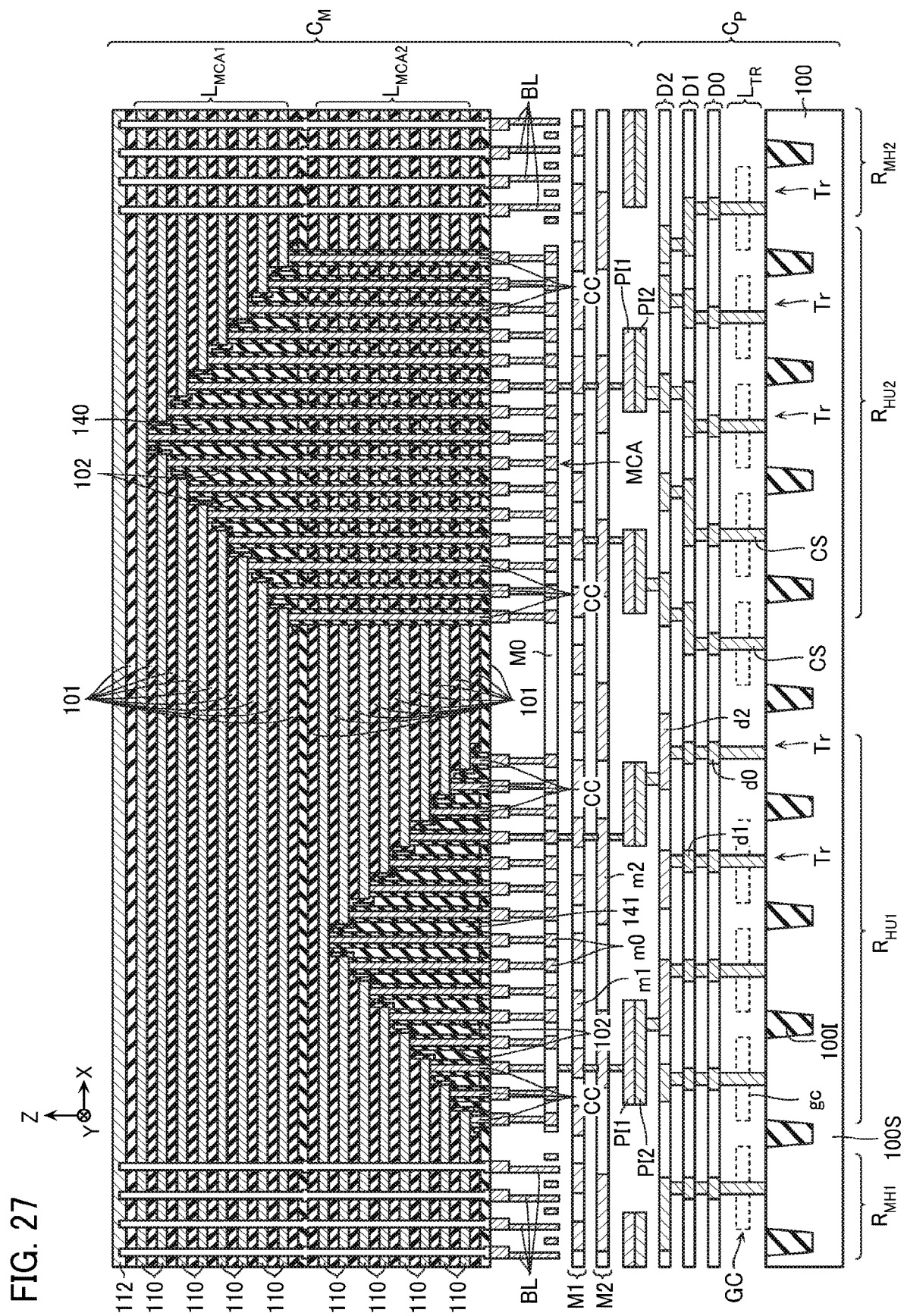
FIG. 27 is a schematic cross-sectional view of the structure illustrated in FIG. 26 taken along the line G-G' and viewed in the arrow direction.

FIG. 26 is a schematic enlarged plan view of the semiconductor memory device according to the third embodiment, is equivalent to a schematic enlarged view of a part indicated by A in FIG. 2, and illustrates the configuration in the memory cell array layer. FIG. 27 is a schematic cross-sectional view of the structure illustrated in FIG. 26 taken along the line G-G' and viewed in the arrow direction.

As illustrated in FIG. 27, the semiconductor memory device according to the third embodiment is configured by bonding a chip $C_M$ including the memory cell array MCA (FIG. 1) and a chip $C_P$ including the peripheral circuit PC (FIG. 1).

The chip $C_M$ includes a plurality of bonding electrodes PI1, and the chip $C_P$ includes a plurality of bonding electrodes PI2. The disposed positions of the plurality of bonding electrodes PI2 correspond to the disposed positions of the plurality of bonding electrodes PI1. By bonding the bonding electrodes PI1 and the bonding electrodes PI2, the chip $C_M$ and the chip $C_P$ are bonded together, and the bonding electrodes PI1 and the bonding electrodes PI2 are electrically connected. For example, the bonding electrodes PI1, PI2 contain a conductive material, such as copper (Cu).

As described above, since the chip $C_M$ and the chip $C_P$ are bonded together, the plurality of conductive layers 110 and the bit lines BL included in the chip $C_M$ are electrically connected to the transistors Tr included in the chip $C_P$ via the contacts CC, the wirings m0 to m2, the bonding electrodes PI1, PI2, the wirings d0 to d2, and the like.

The chip $C_M$ includes the memory cell array layer $L_{MCA1}$, the memory cell array layer $L_{MCA2}$, the bit lines BL, the wiring layer M0, the wiring layer M1, and the wiring layer M2. Note that the respective members thus included in the chip $C_M$ have the disposed positions in the up-down direction opposite to the memory cell array layer $L_{MCA1}$, the memory cell array layer $L_{MCA2}$, the bit lines BL, the wiring layer M0, the wiring layer M1, and the wiring layer M2 of the first embodiment illustrated in FIG. 4.

In view of this, in the third embodiment, the memory cell array layer $L_{MCA1}$ is positioned on the upper layer side and the memory cell array layer $L_{MCA2}$ is positioned on the lower layer side. The structure of the substantially staircase pattern formed in the memory cell array layer $L_{MCA1}$ has an inverted V shape and is positioned in the hook-up region $R_{HU2}$. The structure of the substantially staircase pattern formed in the memory cell array layer $L_{MCA2}$ also has an inverted V Shape and is positioned in the hook-up region $R_{HU1}$.

Similarly to the first embodiment, in the third embodiment as well, the structure of the substantially staircase pattern formed in the memory cell array layer $L_{MCA1}$ and the structure of the substantially staircase pattern formed in the memory cell array layer $L_{MCA2}$ are formed at positions displaced in the X-direction.

Similarly to the first embodiment illustrated in FIG. 4, the chip $C_P$ includes the semiconductor substrate 100, the transistor layer $L_{TR}$, the wiring layer D0, the wiring layer D1, and the wiring layer D2.

As illustrated in FIG. 26, the structures of the memory cell array layers $L_{MCA1}$, $L_{MCA2}$ according to the embodiment are basically similar to the structures of the memory cell array layers $L_{MCA1}$, $L_{MCA2}$ according to the first embodiment, which have been described with reference to FIG. 3 and the like. However, the memory cell array layers $L_{MCA1}$, $L_{MCA2}$ according to the embodiment do not include the configurations in the hook-up region $R_{HU3}$ or the hook-up region $R_{HU4}$ according to the first embodiment.

Note that the semiconductor memory device according to the third embodiment may include the contact region CR3 and the contact region CR4 according to the second embodiment instead of the contact region CR1 and the contact region CR2 according to the first embodiment.

Fourth Embodiment

Next, a configuration of a semiconductor memory device according to the fourth embodiment is described with reference to the drawings. Note that, in the following description, same reference numerals are given to configuration parts similar to those of the first embodiment and description thereof will be simplified and omitted.

Figure 28:
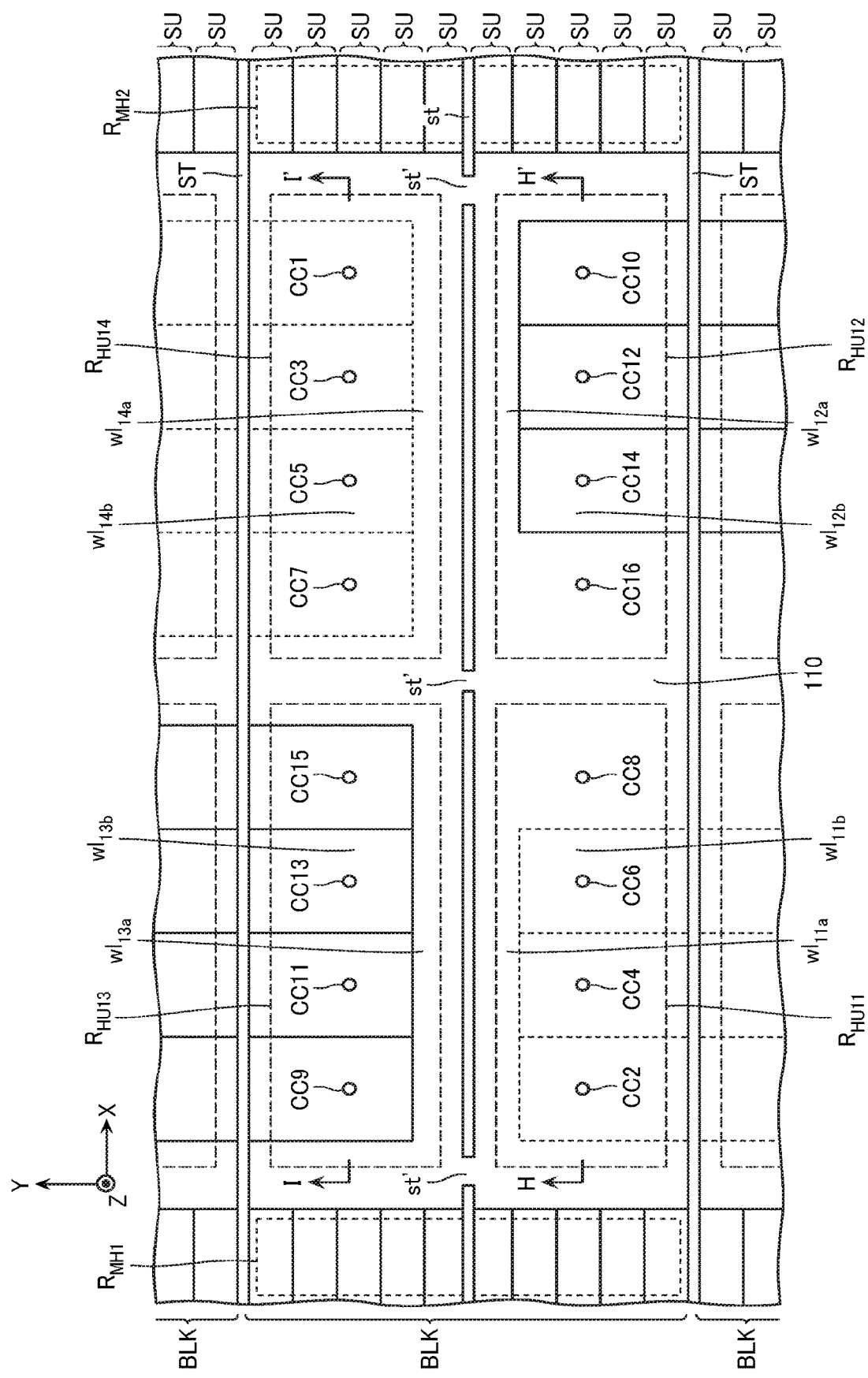
FIG. 28 is a schematic enlarged view of a semiconductor memory device according to a fourth embodiment.
Figure 29:
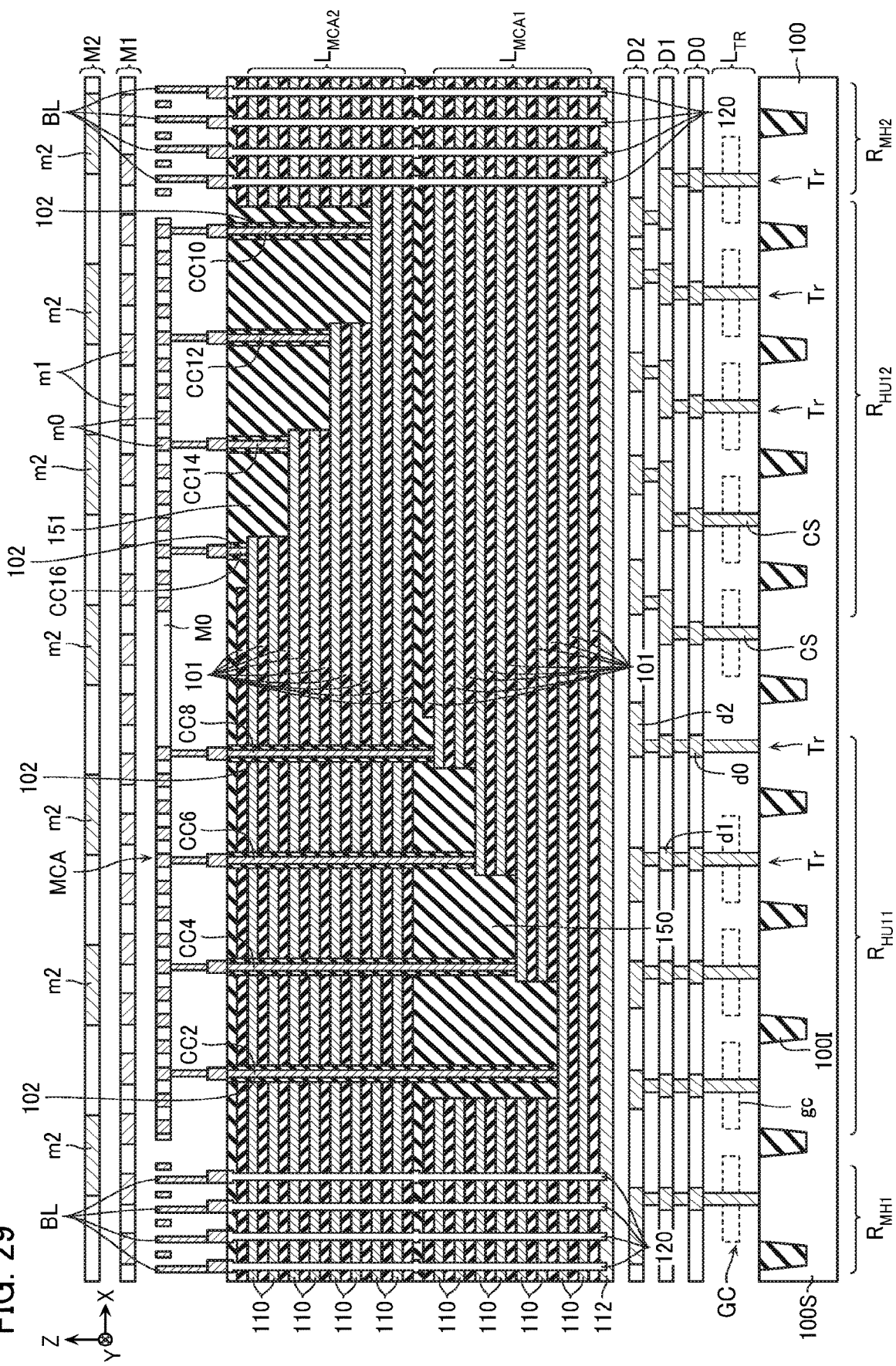
FIG. 29 is a schematic cross-sectional view of the structure illustrated in FIG. 28 taken along the line H-H' and viewed in the arrow direction.
Figure 30:
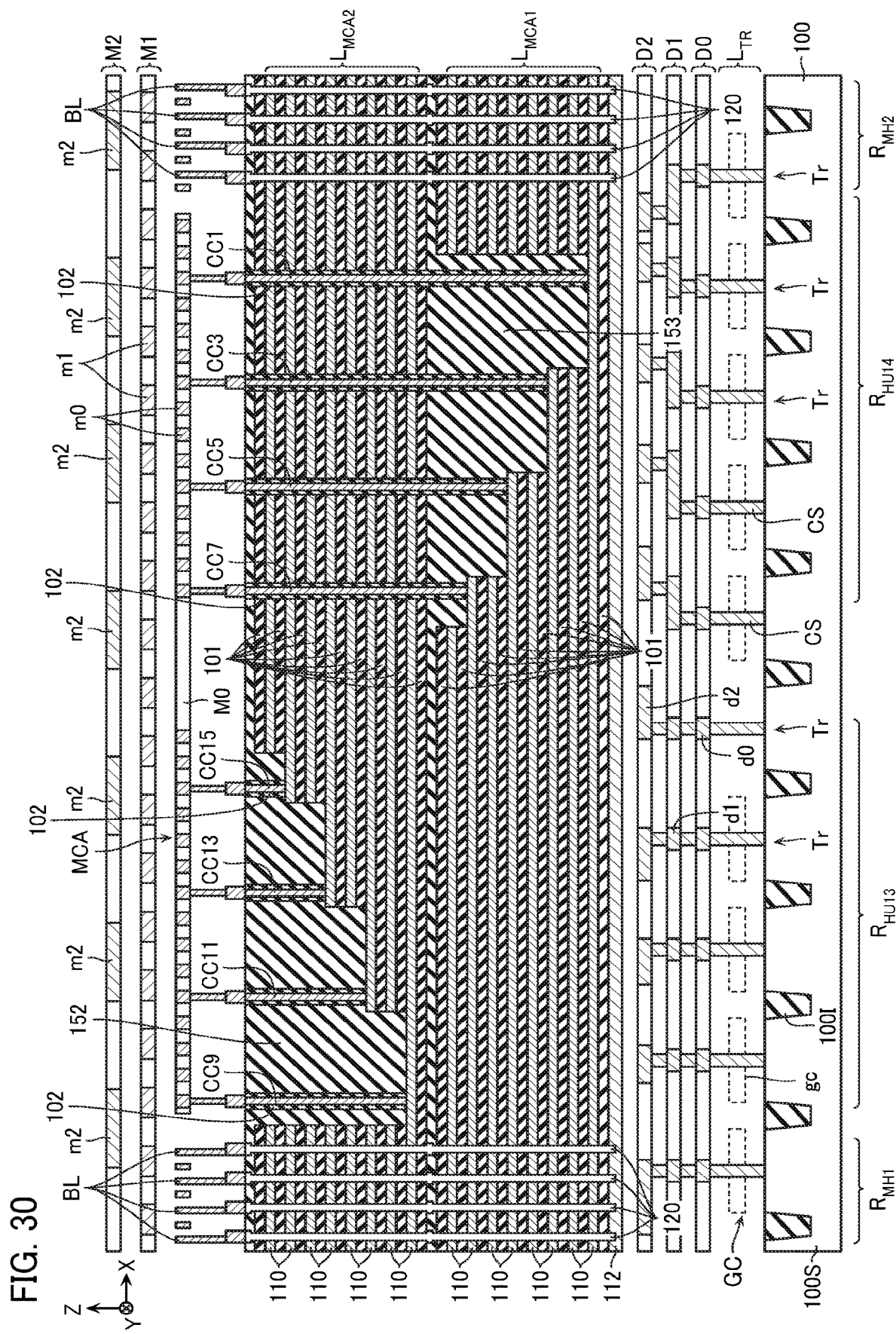
FIG. 30 is a schematic cross-sectional view of the structure illustrated in FIG. 28 taken along the line I-I' and viewed in the arrow direction.

FIG. 28 is a schematic enlarged plan view of the semiconductor memory device according to the fourth embodiment, is equivalent to the schematic enlarged view of the part indicated by A in FIG. 2, and illustrates the configuration in the memory cell array layer of the upper layer. FIG. 29 is a schematic cross-sectional view of the structure illustrated in FIG. 28 taken along the line H-H' and viewed in the arrow direction. FIG. 30 is a schematic cross-sectional view of the structure illustrated in FIG. 28 taken along the line I-I' and viewed in the arrow direction.

As illustrated in FIG. 28 to FIG. 30, the semiconductor memory device according to the fourth embodiment includes hook-up regions $R_{HU11}$, $R_{HU12}$, $R_{HU13}$, $R_{HU14}$ instead of the hook-up regions $R_{HU1}$, $R_{HU2}$, $R_{HU3}$, $R_{HU4}$.

The hook-up region $R_{HU11}$ includes a wiring region $wl_{11a}$ extending in the X-direction and a contact region $wl_{11a}$ extending in the X-direction. The wiring region $wl_{11a}$ and the contact region $wl_{11b}$ are arranged in the Y-direction.

The hook-up region $R_{HU12}$ includes a wiring region $wl_{12a}$ extending in the X-direction and a contact region $wl_{12b}$ extending in the X-direction. The wiring region $wl_{12a}$ and the contact region $wl_{12b}$ are arranged in the Y-direction.

A hook-up region $R_{HU13}$ includes a wiring region $wl_{13a}$ extending in the X-direction and a contact region $wl_{13b}$ extending in the X-direction. The wiring region $wl_{13a}$ and the contact region $wl_{13b}$ are arranged in the Y-direction.

The hook-up region $R_{HU14}$ includes a wiring region $wl_{14a}$ extending in the X-direction and a contact region $wl_{14b}$ extending in the X-direction. The wiring region $wl_{14a}$ and the contact region $wl_{14b}$ are arranged in the Y-direction.

[Structures of Wiring Regions $wl_{11a}$, $wl_{12a}$, $wl_{13a}$, $wl_{14a}$]

The wiring region $wl_{11a}$ in the hook-up region $R_{HU11}$ and the wiring region $wl_{12a}$ in the hook-up region $R_{HU12}$ are continuous in the X-direction and include a part of the plurality of conductive layers 110 arranged in the Z-direction. A part of these conductive layers 110 extend in the X-direction along the inter-block insulating layer ST and the inner-block insulating layer st.

The wiring region $wl_{13a}$ in the hook-up region $R_{HU13}$ and the wiring region $wl_{14a}$ in the hook-up region $R_{HU14}$ are continuous in the X-direction and include a part of the plurality of conductive layers 110 arranged in the Z-direction. A part of these conductive layers 110 extend in the X-direction along the inter-block insulating layer ST and the inner-block insulating layer st.

In view of this, the plurality of conductive layers 110 included in the wiring regions $wl_{11a}$, $wl_{12a}$ and the wiring regions $wl_{13a}$, $wl_{14a}$ are continuous in the X-direction in each layer. As a result, the plurality of conductive layers 110 included in the memory hole region $R_{MH1}$ arranged in the Z-direction and the plurality of conductive layers 110 included in the memory hole region $R_{MH2}$ arranged in the Z-direction are electrically connected with the plurality of conductive layers 110 included in the wiring regions $wl_{11a}$, $wl_{12a}$, $wl_{13a}$, $wl_{14a}$ arranged in the Z-direction in each layer.

[Structure of Contact Region $wl_{11b}$]

The contact region $wl_{11b}$ (FIG. 28) in the hook-up region $R_{HU11}$ includes a part of the plurality of conductive layers 110 arranged in the Z-direction. Between the plurality of conductive layers 110 arranged in the Z-direction, the insulating layers 101 are disposed. Moreover, the structure of the substantially staircase pattern is formed in the contact region $wl_{11b}$. That is, as illustrated in FIG. 29, in a part equivalent to the contact region $wl_{11b}$ in the hook-up region $R_{HU11}$ of the memory cell array layer $L_{MCA1}$ of the lower layer, the structure of the substantially staircase pattern in which the depression deepens in phases from the other side (the right side in FIG. 29) to the one side (the left side in FIG. 29) in the X-direction is formed.

This structure of the substantially staircase pattern is formed by removing a part of the conductive layers 110 of the third layer to the eighth layer and the like disposed in the hook-up region $R_{HU11}$ (FIG. 29) of the memory cell array layer $L_{MCA1}$ of the lower layer in the contact region $wl_{11b}$ (FIG. 28) by etching or the like. An insulating layer 150, such as silicon oxide ($SiO_2$), is filled in the depressed part generated by forming the structure of the substantially staircase pattern.

Contacts CC2, CC4, CC6, CC8 are disposed in the contact region $wl_{11b}$ (FIG. 28) in the hook-up region $R_{HU11}$. As illustrated in FIG. 29, the contacts CC2, CC4, CC6, CC8 penetrate the plurality of conductive layers 110 in the memory cell array layer $L_{MCA2}$ and the insulating layer 150 in the memory cell array layer $L_{MCA1}$ and have lower ends connected to the conductive layers 110 of the second layer, the fourth layer, the sixth layer, and the eighth layer.

Note that, in the cross-sectional surface illustrated in FIG. 29 as an example, the contacts CC2, CC4, CC6, CC8 are connected to the structure of the substantially staircase pattern in the memory cell array layer $L_{MCA1}$. Therefore, for example, distances in the X-direction between the contact CC2 connected to the conductive layer 110 of the second layer and the conductive layers 110 of the third layer to the eighth layer or the insulating layers 101 disposed therebetween are larger than at least the film thickness of the insulating layer 102. Meanwhile, in the cross-sectional surface illustrated in FIG. 29 as an example, the contacts CC2, CC4, CC6, CC8 penetrate the plurality of conductive layers 110 and insulating layers 101 in the memory cell array layer $L_{MCA2}$. Therefore, for example, the distances in the X-direction between the contact CC2 connected to the conductive layer 110 of the second layer and the conductive layers 110 of the ninth layer to the sixteenth layer or the insulating layers 101 disposed therebetween are around the film thickness of the insulating layer 102, which is comparatively small.

[Structure of Contact Region $wl_{12b}$]

The contact region $wl_{12b}$ (FIG. 28) in the hook-up region $R_{HU12}$ includes a part of the plurality of conductive layers 110 arranged in the Z-direction. Moreover, the structure of the substantially staircase pattern is formed in the contact region $wl_{12b}$. That is, as illustrated in FIG. 29, in apart equivalent to the contact region $wl_{12b}$ in the hook-up region $R_{HU12}$ of the memory cell array layer $L_{MCA2}$ of the upper layer, a structure of a substantially staircase pattern in which a depression deepens in phases from one side (the left side in FIG. 29) to the other side (the right side in FIG. 29) in the X-direction is formed.

This structure of the substantially staircase pattern is formed by removing a part of the conductive layers 110 of the eleventh layer to the sixteenth layer and the like disposed in the hook-up region $R_{HU12}$ (FIG. 29) of the memory cell array layer $L_{MCA2}$ of the upper layer in the contact region $wl_{12b}$ (FIG. 28) by etching or the like. An insulating layer 151, such as silicon oxide ($SiO_2$), is filled in the depressed part generated by forming the structure of the substantially staircase pattern.

Contacts CC10, CC12, CC14, CC16 are disposed in the contact region $wl_{12b}$ (FIG. 28) in the hook-up region $R_{HU12}$. As illustrated in FIG. 29, the contacts CC10, CC12, CC14, CC16 penetrate the insulating layer 151 in the memory cell array layer $L_{MCA2}$ and have lower ends connected to the conductive layers 110 of the tenth layer, the twelfth layer, the fourteenth layer, and the sixteenth layer.

Note that, in the cross-sectional surface illustrated in FIG. 29 as an example, the contacts CC10, CC12, CC14, CC16 are connected to the structure of the substantially staircase pattern in the memory cell array layer $L_{MCA2}$. Therefore, for example, the distances in the X-direction between the contact CC10 connected to the conductive layer 110 of the tenth layer and the conductive layers 110 of the eleventh layer to the sixteenth layer or the insulating layers 101 disposed therebetween are larger than at least the film thickness of the insulating layer 102.

[Structure of Contact Region $wl_{13b}$]

The contact region $wl_{13b}$ (FIG. 28) in the hook-up region $R_{HU13}$ includes a part of the plurality of conductive layers 110 arranged in the Z-direction. Moreover, the structure of the substantially staircase pattern is formed in the contact region $wl_{13b}$. That is, as illustrated in FIG. 30, in a part equivalent to the contact region $wl_{13b}$ in the hook-up region $R_{HU13}$ of the memory cell array layer $L_{MCA2}$ of the upper layer, a structure of a substantially staircase pattern in which a depression deepens in phases from the other side (the right side in FIG. 30) to one side (the left side in FIG. 30) in the X-direction is formed.

This structure of the substantially staircase pattern is formed by removing a part of the conductive layers 110 of the tenth layer to the sixteenth layer and the like disposed in the hook-up region $R_{HU13}$ (FIG. 30) of the memory cell array layer $L_{MCA2}$ of the upper layer in the contact region $wl_{13b}$ (FIG. 28) by etching or the like. An insulating layer 152, such as silicon oxide ($SiO_2$), is filled in the depressed part generated by forming the structure of the substantially staircase pattern.

Contacts CC9, CC11, CC13, CC15 are disposed in the contact region $wl_{13b}$ (FIG. 28) in the hook-up region $R_{HU13}$. As illustrated in FIG. 30, the contacts CC9, CC11, CC13, CC15 penetrate the insulating layer 152 in the memory cell array layer $L_{MCA2}$ and have lower ends connected to the conductive layers 110 of the ninth layer, the eleventh layer, the thirteenth layer, and the fifteenth layer.

Note that, in the cross-sectional surface illustrated in FIG. 30 as an example, the contacts CC9, CC11, CC13, CC15 are connected to the structure of the substantially staircase pattern in the memory cell array layer $L_{MCA2}$. Accordingly, for example, distances in the X-direction between the contact CC9 connected to the conductive layer 110 of the ninth layer and the conductive layers 110 of the tenth layer to the sixteenth layer or the insulating layers 101 disposed therebetween are larger than at least the film thickness of the insulating layer 102.

[Structure of Contact Region $wl_{14b}$]

The contact region $wl_{14b}$ (FIG. 28) in the hook-up region $R_{HU14}$ includes a part of the plurality of conductive layers 110 arranged in the Z-direction. Moreover, the structure of the substantially staircase pattern is formed in the contact region $wl_{14b}$. That is, as illustrated in FIG. 30, in apart equivalent to the contact region $wl_{14b}$ in the hook-up region $R_{HU14}$ of the memory cell array layer $L_{MCA1}$ of the lower layer, a structure of the substantially staircase pattern in which a depression deepens in phases from one side (the left side in FIG. 30) to the other side (the right side in FIG. 30) in the X-direction is formed.

This structure of the substantially staircase pattern is formed by removing a part of the conductive layers 110 of the second layer to the eighth layer and the like disposed in the hook-up region $R_{HU14}$ (FIG. 30) of the memory cell array layer $L_{MCA1}$ of the lower layer in the contact region $wl_{14b}$ (FIG. 28) by etching or the like. An insulating layer 153, such as silicon oxide ($SiO_2$), is filled in the depressed part generated by forming the structure of the substantially staircase pattern.

The contacts CC1, CC3, CC5, CC7 are disposed in the contact region $wl_{14b}$ (FIG. 28) in the hook-up region $R_{HU14}$. As illustrated in FIG. 30, the contacts CC1, CC3, CC5, CC7 penetrate the plurality of conductive layers 110 in the memory cell array layer $L_{MCA2}$ and the insulating layer 153 in the memory cell array layer $L_{MCA1}$ and have lower ends connected to the conductive layers 110 of the first layer, the third layer, the fifth layer, and the seventh layer.

Note that, in the cross-sectional surface illustrated in FIG. 30 as an example, the contacts CC1, CC3, CC5, CC7 are connected to the structure of the substantially staircase pattern in the memory cell array layer $L_{MCA1}$. Accordingly, for example, a distance in the X-direction between the contact CC1 connected to the conductive layer 110 of the first layer and the conductive layers 110 of the second layer to the eighth layer or the insulating layers 101 disposed between the conductive layers 110 is at least larger than the film thickness of the insulating layer 102. Meanwhile, in the cross-sectional surface illustrated in FIG. 30 as an example, the contacts CC1, CC3, CC5, CC7 penetrate the plurality of conductive layers 110 and insulating layers 101 in the memory cell array layer $L_{MCA2}$. Therefore, for example, the distance in the X-direction between the contact CC1 connected to the conductive layer 110 of the first layer and the conductive layers 110 of the ninth layer to the sixteenth layer or the insulating layers 101 disposed between the conductive layers 110 is around the film thickness of the insulating layer 102, which is comparatively small.

[Arrangement of Hook-Up Regions $R_{HU3}$, $R_{HU4}$]

As described with reference to FIG. 28 to FIG. 30, in this embodiment, the hook-up regions $R_{HU13}$, $R_{HU14}$ are disposed at the positions corresponding to the positions where the hook-up regions $R_{HU3}$, $R_{HU4}$ are disposed in the first embodiment. In the semiconductor memory device according to the embodiment, the hook-up regions $R_{HU3}$, $R_{HU4}$ are disposed at other positions (not illustrated). For example, the hook-up region $R_{HU3}$, $R_{HU4}$ may be disposed between the memory hole region $R_{MH1}$ and the hook-up region $R_{HU11}$, between the hook-up region $R_{HU11}$ and the hook-up region $R_{HU12}$, or between the hook-up region $R_{HU12}$ and the memory hole region $R_{MH2}$. For example, the hook-up regions $R_{HU3}$, $R_{HU4}$ may be disposed between the memory hole region $R_{MH1}$ and the hook-up region $R_{HU13}$, between the hook-up region $R_{HU13}$ and the hook-up region $R_{HU14}$, or between the hook-up region $R_{HU14}$ and the memory hole region $R_{MH2}$.

Similarly to the semiconductor memory device according to the third embodiment, the semiconductor memory device according to the fourth embodiment may be configured by bonding the chip $C_M$ including the memory cell array MCA (FIG. 1) and the chip $C_P$ including the peripheral circuit PC (FIG. 1).

Fifth Embodiment

Next, a configuration of the semiconductor memory device according to the fifth embodiment is described with reference to the drawings. Note that, in the following description, same reference numerals are given to configuration parts similar to those of the fourth embodiment and description thereof will be simplified and omitted.

Figure 31:
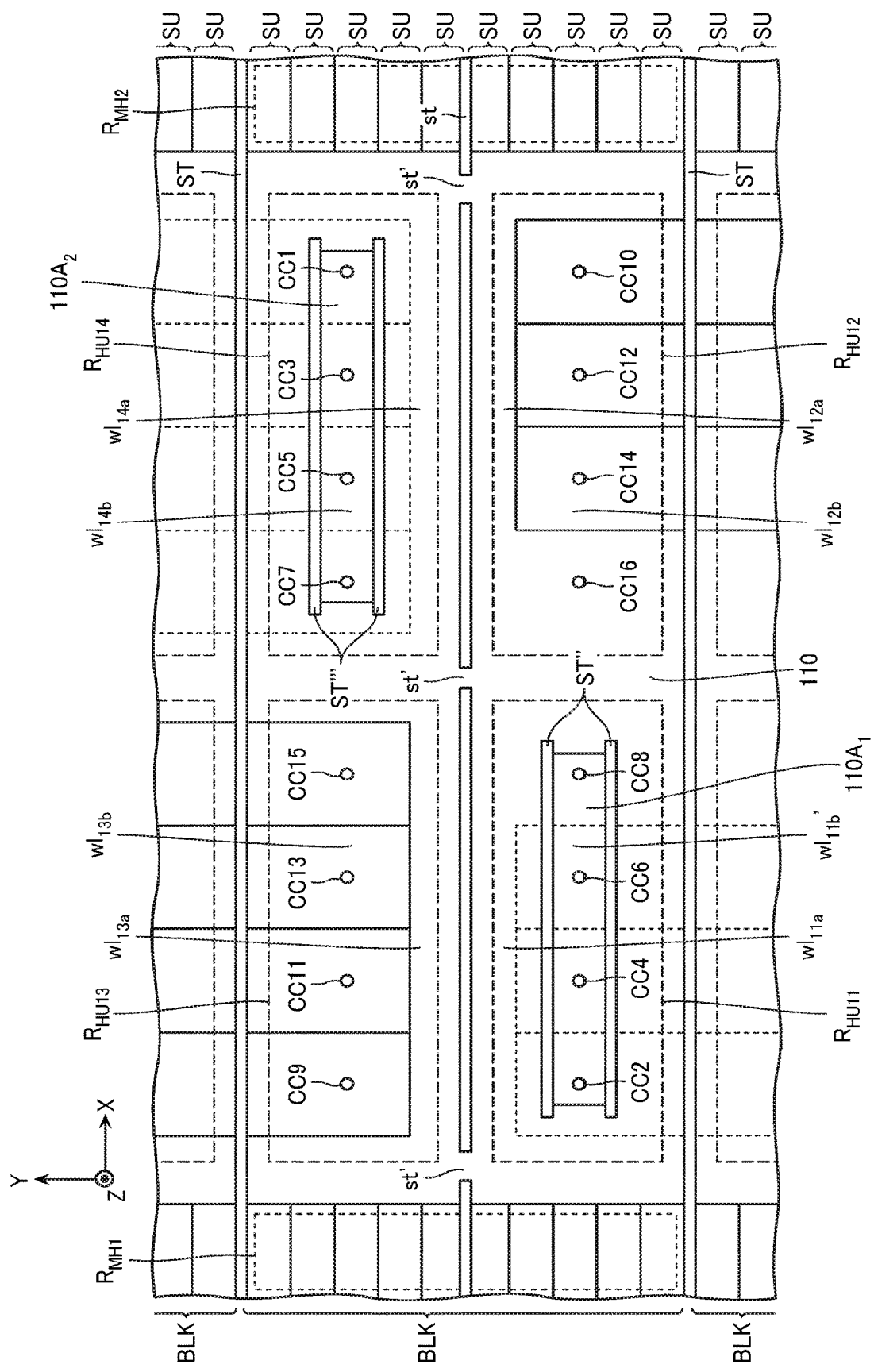
FIG. 31 is a schematic enlarged view of a semiconductor memory device according to a fifth embodiment.

FIG. 31 is a schematic enlarged plan view of the semiconductor memory device according to the fifth embodiment, is equivalent to the schematic enlarged view of the part indicated by A in FIG. 2, and illustrates the configuration in the memory cell array layer of the upper layer.

As illustrated in FIG. 31, the semiconductor memory device according to the fifth embodiment includes a contact region $wl_{11b}'$ instead of the contact region $wl_{11b}$. Additionally, the semiconductor memory device according to the fifth embodiment includes a contact region $wl_{14b}'$ instead of the contact region $wl_{14b}$.

A structure in the contact region $wl_{11b}'$ of the memory cell array layer $L_{MCA1}$ is similar to the structure (FIG. 29) in the contact region $wl_{11b}$ of the memory cell array layer $L_{MCA1}$ according to the fourth embodiment.

The structure in the contact region $wl_{11b}'$ of the memory cell array layer $L_{MCA2}$ is similar to the structure (FIG. 22) in the contact region CR3 of the memory cell array layer $L_{MCA2}$ according to the second embodiment.

The structure in the contact region $wl_{14b}'$ of the memory cell array layer $L_{MCA1}$ is similar to the structure (FIG. 30) in the contact region $wl_{14b}$ of the memory cell array layer $L_{MCA1}$ according to the fourth embodiment.

The structure in the contact region $wl_{14b}'$ of the memory cell array layer $L_{MCA2}$ is similar to the structure (FIG. 22) in the contact region CR3 of the memory cell array layer $L_{MCA2}$ according to the second embodiment.

Similarly to the semiconductor memory device according to the third embodiment, the semiconductor memory device according to the fifth embodiment may be configured by bonding the chip $C_M$ including the memory cell array MCA (FIG. 1) and the chip $C_P$ including the peripheral circuit PC (FIG. 1).

Other Embodiments

As described above, in the respective embodiments, in the memory cell array layers, the structure of the substantially staircase pattern is formed in the hook-up region or the like where the contacts are disposed. Various kinds of aspects can be employed as the pattern of this structure of the substantially staircase pattern.

For example, while the fourth embodiment employs the structure of the substantially staircase pattern as illustrated in FIG. 28 to FIG. 30, the structure of the substantially staircase pattern is not limited to this.

Therefore, similarly to the fourth embodiment, one in which a structure of a substantially staircase pattern according to another aspect is formed in another embodiment that includes a wiring region and a contact region in a hook-up region is described with reference to FIG. 32 to FIG. 34.

Figure 32:
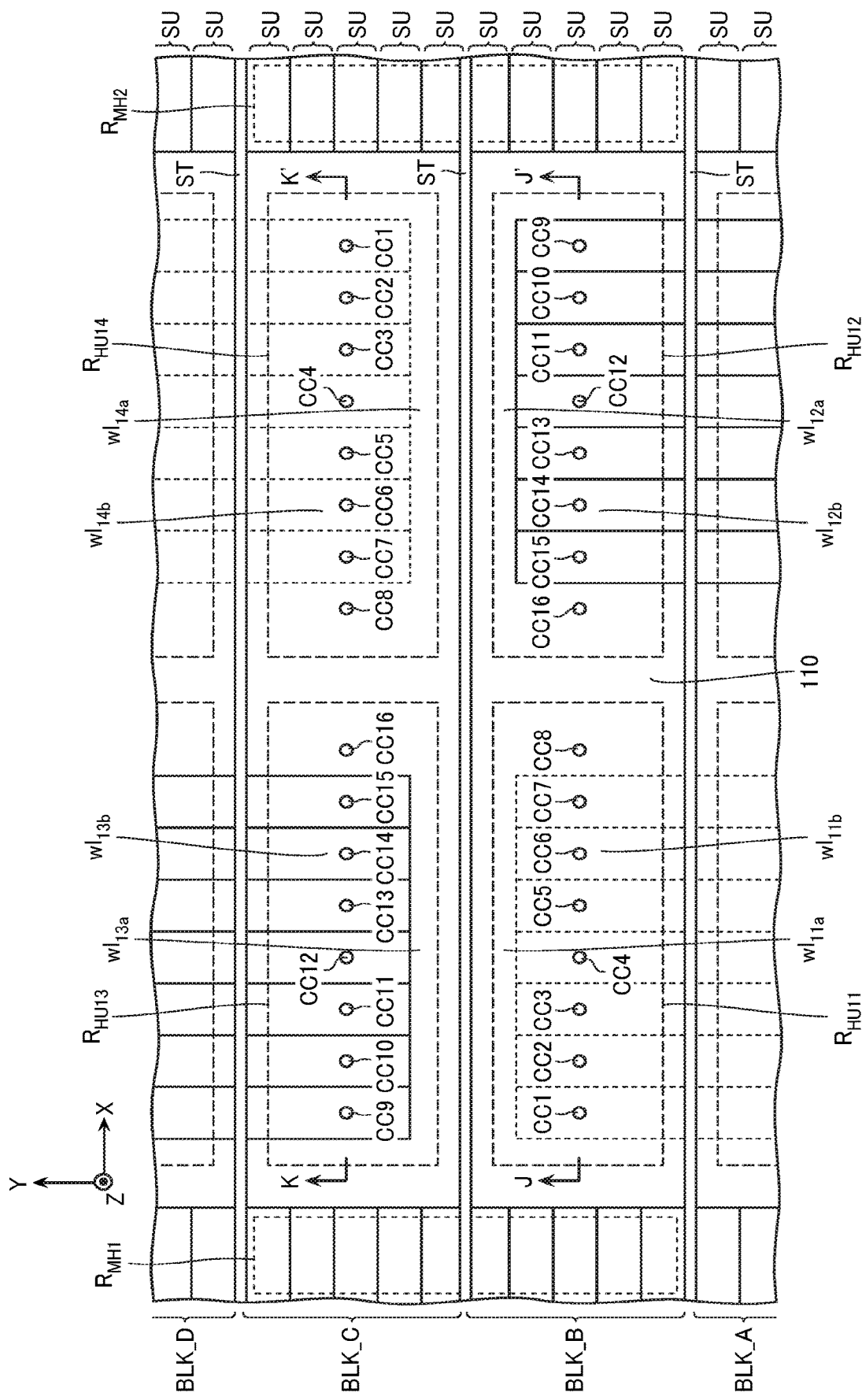
FIG. 32 is a schematic cross-sectional view of a semiconductor memory device having another aspect as a structure of a substantially staircase pattern.

FIG. 32 is a schematic enlarged plan view of a semiconductor memory device according to another embodiment, is equivalent to a schematic enlarged view of the part indicated by A in FIG. 2, and illustrates a configuration in a memory cell array layer of an upper layer. FIG. 33 is a schematic cross-sectional view of the structure illustrated in FIG. 32 taken along the line J-J' and viewed in the arrow direction. FIG. 34 is a schematic cross-sectional view of the structure illustrated in FIG. 32 taken along the line K-K' and viewed in the arrow direction.

As illustrated in FIG. 32, in another embodiment as well, the plurality of memory blocks BLK (BLK_A to BKL_D) are arranged in the Y-direction, and the inter-block insulating layer ST is included between the two memory blocks BLK adjacent in the Y-direction.

Note that although the memory block BLK (FIG. 28) of the fourth embodiment includes the inner-block insulating layers st, the memory block BLK (FIG. 32) of another embodiment does not include an inner-block insulating layer. Additionally, a width in the Y-direction of the memory block BLK (FIG. 32) of another embodiment is about the half of the width in the Y-direction of the memory block BLK (FIG. 28) of the fourth embodiment.

Figure 33:
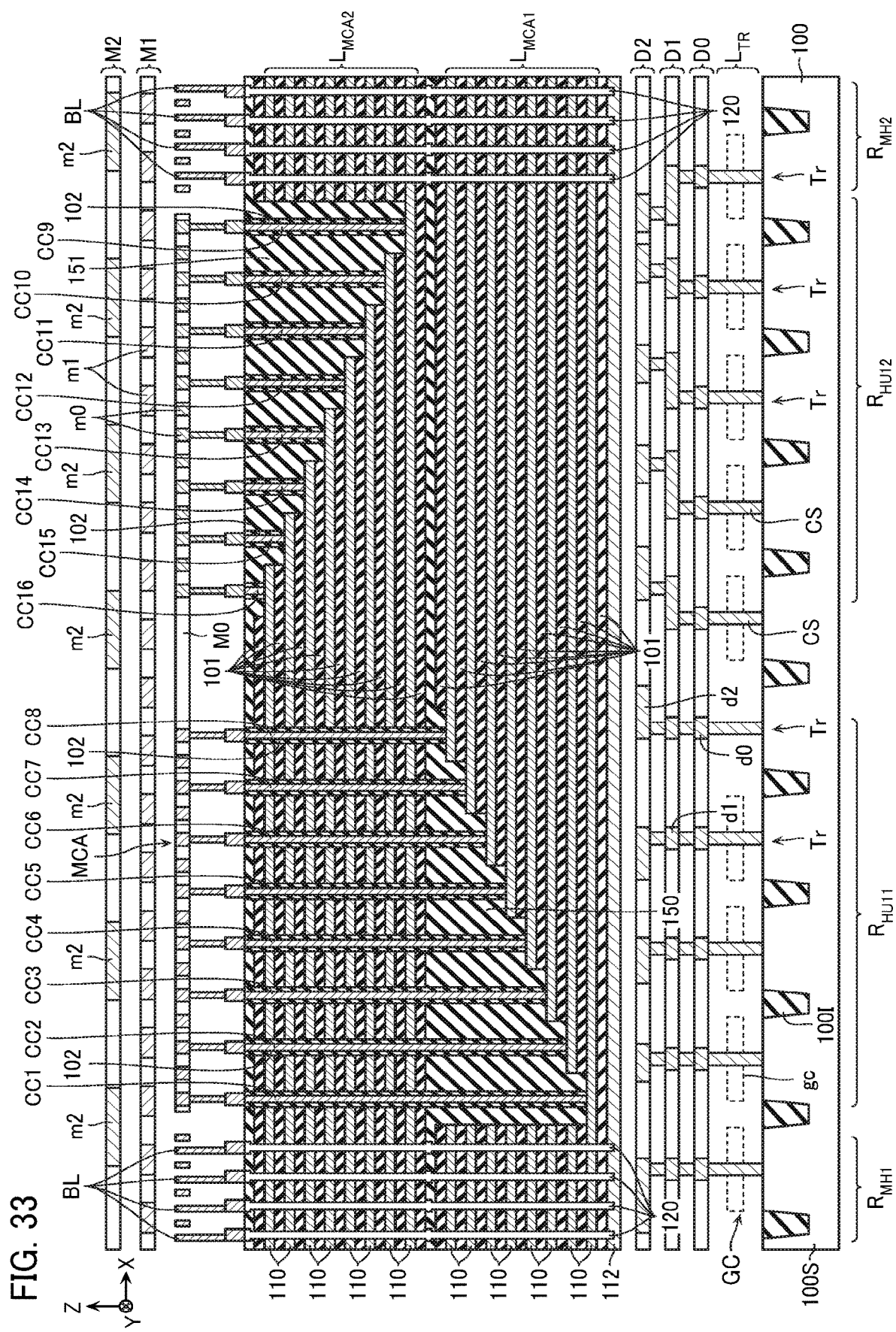
FIG. 33 is a schematic cross-sectional view of the structure illustrated in FIG. 32 taken along the line J-J' and viewed in the arrow direction.

As illustrated in FIG. 32 and FIG. 33, in the memory block BLK_B, a structure of a substantially staircase pattern in which a depression deepens in phases from the other side (the right side in FIG. 33) to one side (the left side in the drawing) in the X-direction is formed in a part equivalent to the contact region $wl_{11b}$ in the hook-up region $R_{HU11}$ of the memory cell array layer $L_{MCA1}$ of the lower layer. The number of steps of the structure of the substantially staircase pattern formed in the hook-up region $R_{HU11}$ in FIG. 33 is twice the number of steps illustrated in FIG. 29. The eight contacts CC1 to CC8 are disposed in this contact region $wl_{11b}$.

As illustrated in FIG. 32 and FIG. 33, in the memory block BLK_B, a structure of a substantially staircase pattern in which the depression deepens in phases from one side (the left side in FIG. 33) to the other side (the right side in the drawing) in the X-direction is formed in a part equivalent to the contact region $wl_{12b}$ in the hook-up region $R_{HU12}$ in the memory cell array layer $L_{MCA2}$ of the upper layer. The number of steps of the structure of the substantially staircase pattern formed in the hook-up region $R_{HU12}$ in FIG. 33 is twice the number of steps illustrated in FIG. 29. The eight contacts CC9 to CC16 are disposed in this contact region $wl_{12b}$.

In the memory block BLK_D as well, the structure of the substantially staircase pattern similar to the structure formed in the memory block BLK_B is formed, and the contacts CC1 to CC8 and CC9 to CC16 are disposed.

Figure 34:
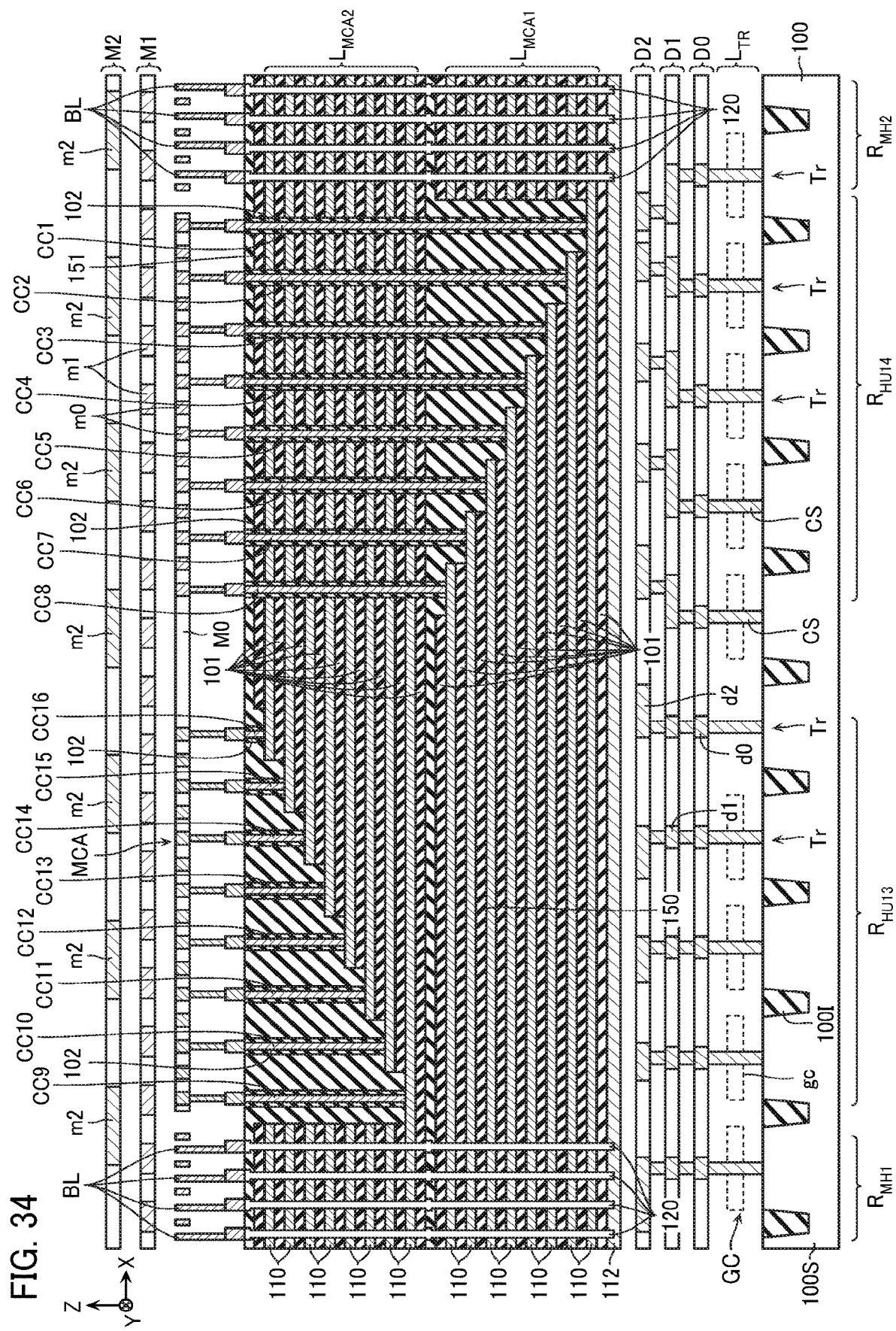
FIG. 34 is a schematic cross-sectional view taking the structure illustrated in FIG. 32 along the line K-K' and viewed in the arrow direction.

As illustrated in FIG. 32 and FIG. 34, in the memory block BLK_C, a structure of a substantially staircase pattern similar to the structure of the substantially staircase pattern formed in a part equivalent to the contact region $wl_{12b}$ in the hook-up region $R_{HU12}$ of the memory cell array layer $L_{MCA2}$ of the upper layer illustrated in FIG. 33 is formed in a part equivalent to the contact region $wl_{13b}$ in the hook-up region $R_{HU13}$ of the memory cell array layer $L_{MCA2}$ of the upper layer.

As illustrated in FIG. 32 and FIG. 34, in the memory block BLK_C, a structure of a substantially staircase pattern similar to the structure of the substantially staircase pattern formed in a part equivalent to the contact region $wl_{11b}$ in the hook-up region $R_{HU11}$ of the memory cell array layer $L_{MCA1}$ of the lower layer illustrated in FIG. 33 is formed in a part equivalent to the contact region $wl_{14b}$ in the hook-up region $R_{HU14}$ of the memory cell array layer $L_{MCA1}$ of the lower layer.

In the memory block BLK_A as well, the structure of the substantially staircase pattern similar to the structure formed in the memory block BLK_C is formed, and the contacts CC1 to CC8 and CC9 to CC16 are disposed.

In the above-described first embodiment to fifth embodiment, only one contact region is disposed in the hook-up region, and the contacts CC are arranged in one row in the X-direction in each contact region. However, such a configuration is merely an example, and the specific configurations are appropriately adjustable. For example, in the first embodiment to the fifth embodiment, two contact regions arranged in the Y-direction may be disposed in any of the hook-up regions or the contacts CC may be arranged in two rows in the X-direction in any of the contact regions.

Additionally, the above-described semiconductor memory devices according to the first embodiment to the fifth embodiment include the two memory cell array layers $L_{MCA1}$, $L_{MCA2}$ arranged in the Z-direction. However, such a configuration is merely an example, and the specific configurations are appropriately adjustable. For example, the semiconductor memory devices according to the first embodiment to the fifth embodiment may include three or more memory cell array layers arranged in the Z-direction. In this case, the positions of the hook-up regions corresponding to the respective memory cell array layers (connecting portions between the conductive layers 110 included in the respective memory cell array layers and the contacts CC) in the X-direction may be dispersedly disposed to three or more positions.

[Another Example of Connection State Between Contacts CC and Through Contacts C4]

While FIG. 8 illustrates the example of connecting the contacts CC and the through contacts C4, the connection state is not limited to this.

Therefore, with reference to FIG. 35 to FIG. 40, another example of connecting the contacts CC and the through contacts C4 is described. In this example, the connection is performed using the wirings m0 in the wiring layer M0, the wirings m1 in the wiring layer M1, and the wirings m2 in the wiring layer M2.

Figure 35:
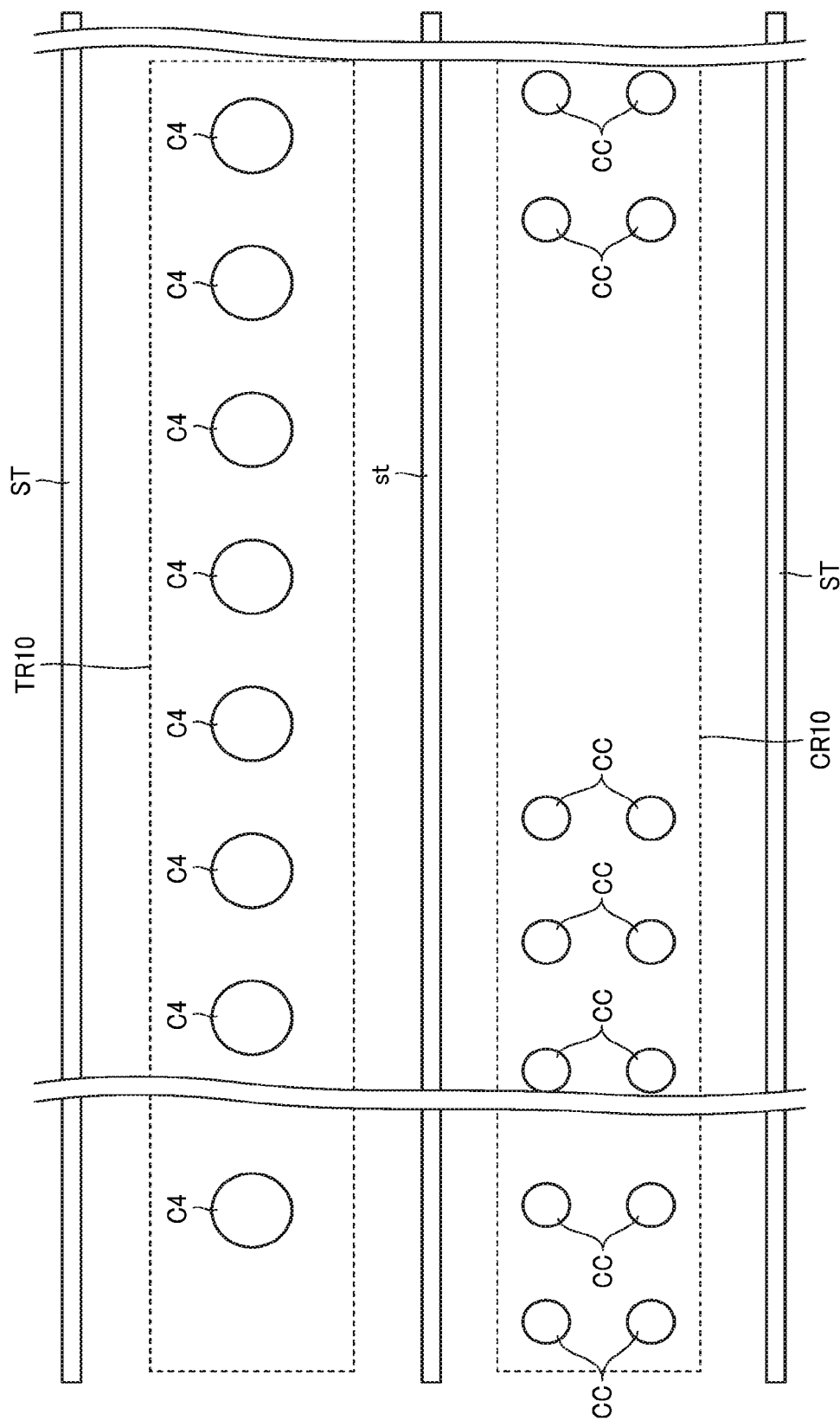
FIG. 35 is a plan view illustrating an arrangement state of contacts and through contacts in another example of the connecting the contacts and the through contacts.
Figure 36:
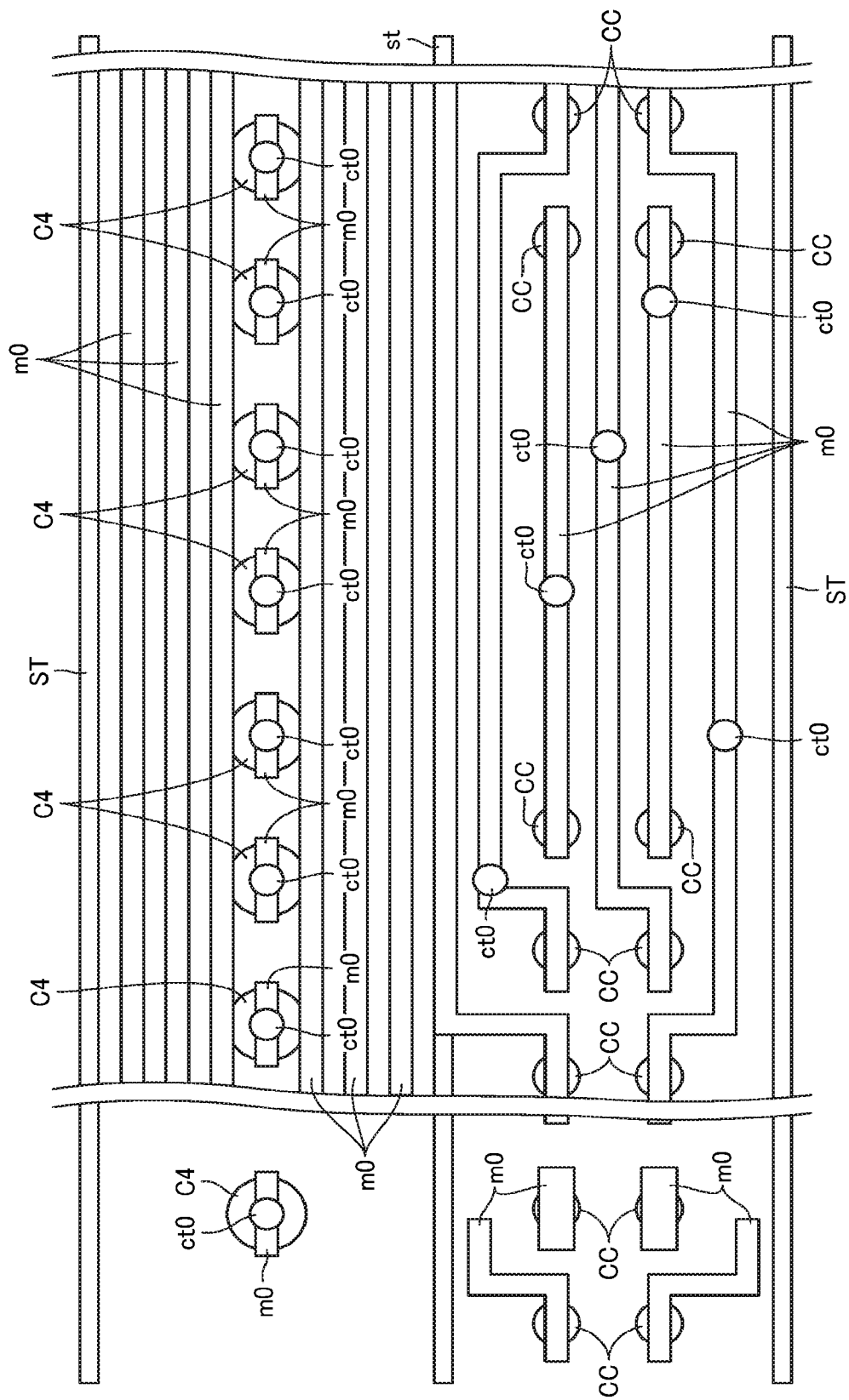
FIG. 36 is a plan view illustrating a connection state in another example of connecting the contacts and the through contacts.
Figure 37:
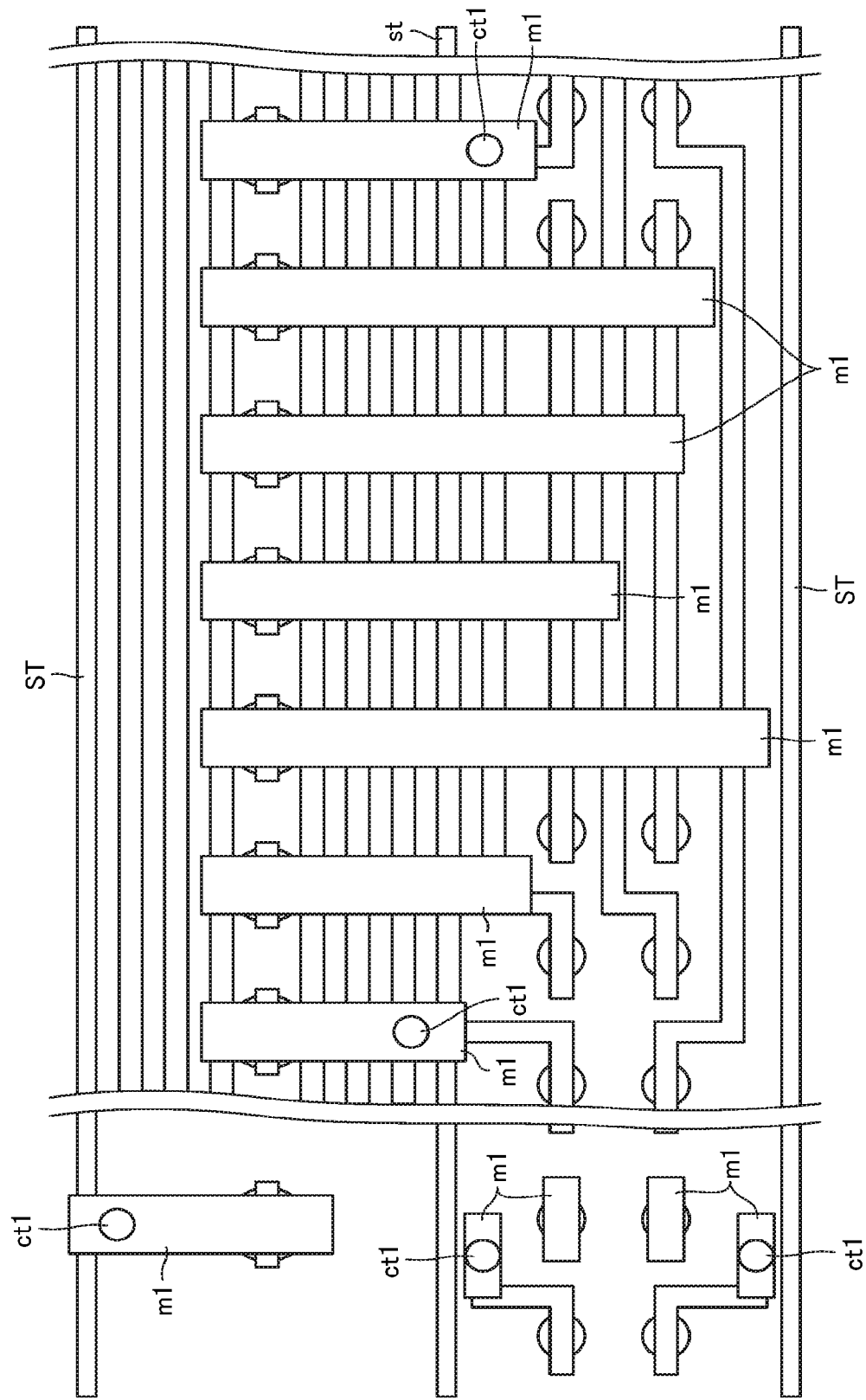
FIG. 37 is a plan view illustrating a connection state in another example of connecting the contacts and the through contacts.
Figure 38:
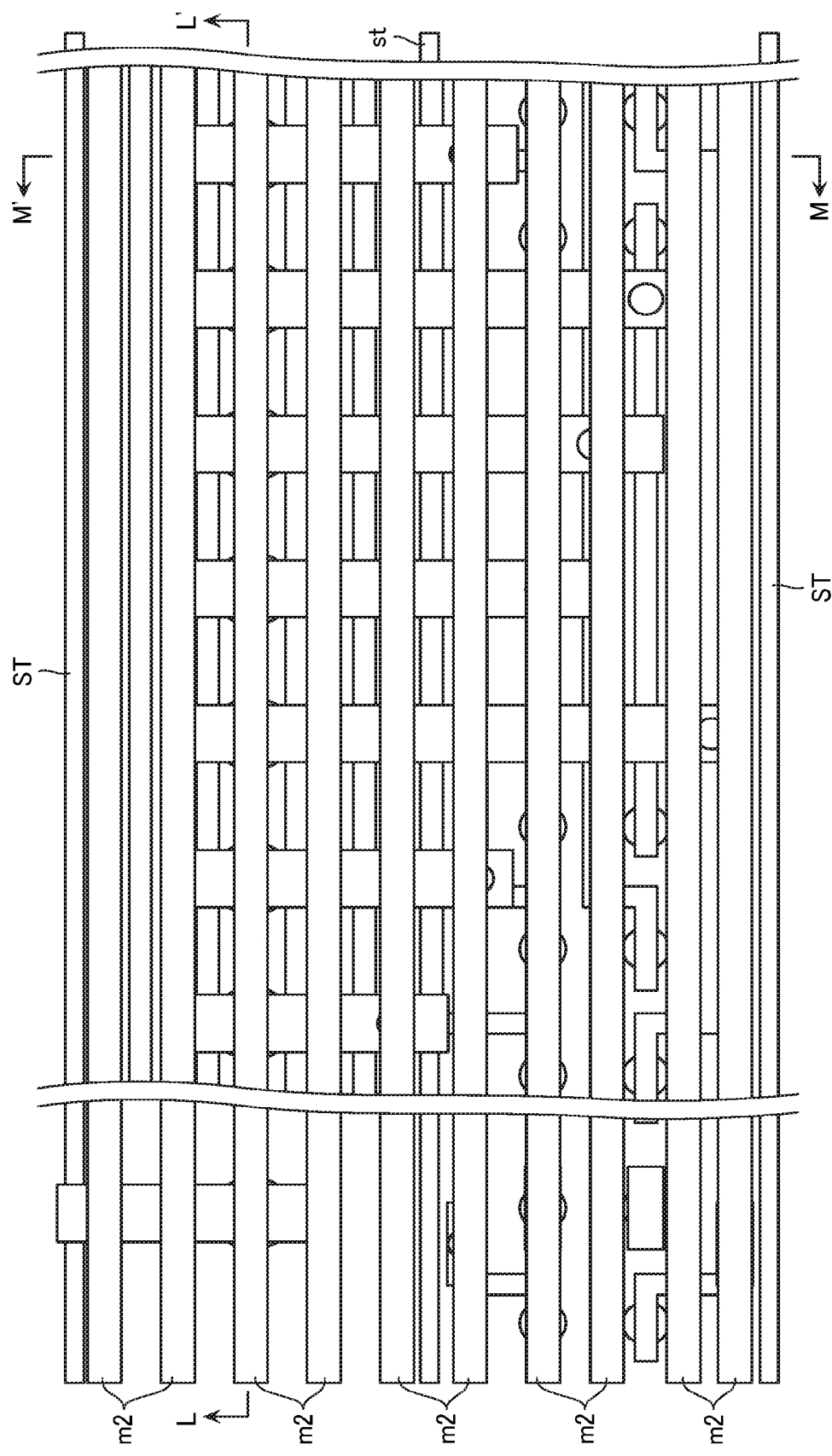
FIG. 38 is a plan view illustrating a connection state in another example of connecting the contacts and the through contacts.

For ease of understanding, FIG. 35 illustrates only the arrangement state of the contacts CC and the through contacts C4, FIG. 36 illustrates only the connection state with the wirings m0, FIG. 37 illustrates only the connection state with the wirings m0 and the wirings m1, and FIG. 38 illustrates the connection state with the wirings m0, the wirings m1, and the wiring m2s.

Figure 39:
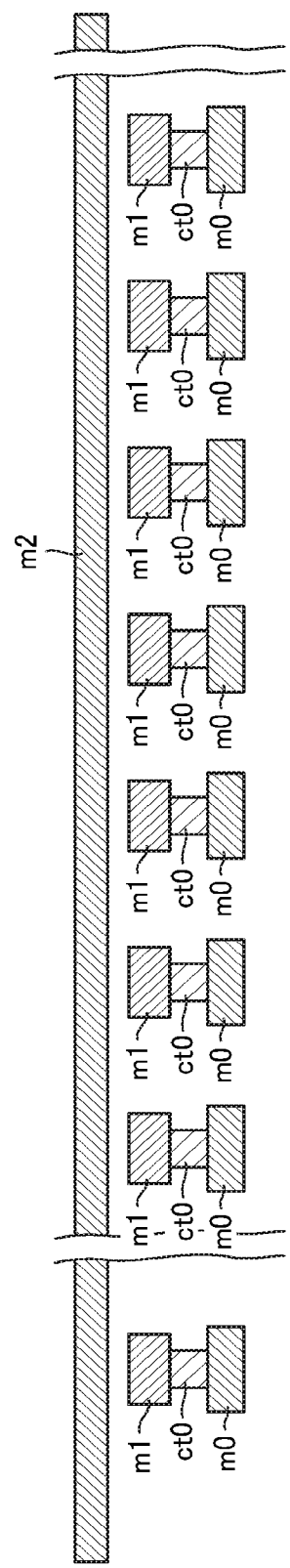
FIG. 39 is a schematic cross-sectional view of the structure illustrated in FIG. 35 taken along the line L-L' and viewed in the arrow direction.
Figure 40:
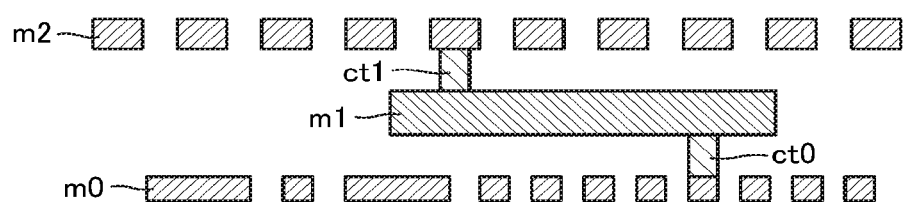
FIG. 40 is a schematic cross-sectional view of the structure illustrated in FIG. 35 taken along the line M-M' and viewed in the arrow direction.

FIG. 39 is a schematic cross-sectional view of the structure illustrated in FIG. 38 taken along the line L-L' and viewed in the arrow direction, and FIG. 40 is a schematic cross-sectional view of the structure illustrated in FIG. 38 taken along the line M-M' and viewed in the arrow direction.

For example, as illustrated in FIG. 35, a connection state in which the plurality of through contacts C4 arranged in the X-direction are arrayed in one row in a through contact region TR10 and the plurality of contacts CC arranged in the X-direction are arrayed in two rows in a contact region CR10 is described.

As illustrated in FIG. 36, above the through contacts C4 and above the contacts CC, the plurality of wirings m0 extending in the X-direction and arranged in the Y-direction are disposed. The lower surfaces of the predetermined wirings m0 are connected to the upper ends of the through contacts C4 and the contacts CC. A contact ct0 is connected to the predetermined position in the upper surface of each wiring m0.

As illustrated in FIG. 37, above the wirings m0, the plurality of wirings m1 extending in the Y-direction and arranged in the X-direction are disposed. The lower surface of the wiring m1 is connected to the upper surface of the contact ct0 (FIG. 36), and the wiring m1 is electrically connected to the wiring m0 via the contact ct0. The contact ct1 is connected to a predetermined position in the upper surface of each wiring m1.

As illustrated in FIG. 38, the plurality of wirings m2 extending in the X-direction and arranged in the Y-direction are disposed above the wirings m1. The lower surface of the wiring m2 is connected to the upper surface of the contact ct1 (FIG. 37), and the wiring m2 is electrically connected to the wiring m1 via the contact ct1.

As illustrated in FIG. 39 and FIG. 40, the wiring m0 and the wiring m1 are electrically connected via a contact ct0, and the wiring m1 and the wiring m2 are electrically connected via the contact ct1.

In this connection, between the plurality of wirings m0 extending in the X-direction and the plurality of wirings m2 extending in the X-direction, the plurality of wirings m1 extending in the Y-direction are disposed. In view of this, the contact CC and the through contact C4 away in the Y-direction can be easily electrically connected.

OTHERS

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate including a first region to a fourth region arranged sequentially in a first direction;

a plurality of first conductive layers extending from the first region to the second region in the first direction and arranged in a second direction intersecting with a surface of the substrate;
a plurality of second conductive layers extending from the fourth region to the second region in the first direction and arranged in the second direction;
a plurality of third conductive layers extending from the first region to the third region in the first direction and arranged in the second direction, the plurality of third conductive layers being disposed at positions in the second direction different from the plurality of first conductive layers;
a plurality of fourth conductive layers extending from the fourth region to the third region in the first direction and arranged in the second direction, the plurality of fourth conductive layers being disposed at positions in the second direction different from the plurality of second conductive layers;
a first semiconductor column disposed in the first region and extending in the second direction, the first semiconductor column being opposed to the plurality of first conductive layers and the plurality of third conductive layers;
a second semiconductor column disposed in the fourth region and extending in the second direction, the second semiconductor column being opposed to the plurality of second conductive layers and the plurality of fourth conductive layers;
a plurality of first contacts disposed in the second region and extending in the second direction, the plurality of first contacts being connected to end portions in the first direction of the plurality of first conductive layers;
a plurality of second contacts disposed in the second region and extending in the second direction, the plurality of second contacts being connected to end portions in the first direction of the plurality of second conductive layers;
a plurality of third contacts disposed in the third region and extending in the second direction, the plurality of third contacts being connected to end portions in the first direction of the plurality of third conductive layers;
a plurality of fourth contacts disposed in the third region and extending in the second direction, the plurality of fourth contacts being connected to end portions in the first direction of the plurality of fourth conductive layers;
a plurality of first wirings disposed in the second region, the plurality of first wirings being electrically connected to the plurality of first contacts and the plurality of second contacts; and
a plurality of second wirings disposed in the third region, the plurality of second wirings being electrically connected to the plurality of third contacts and the plurality of fourth contacts.

2. The semiconductor memory device according to claim 1, comprising:
a plurality of first insulating layers arranged in the second direction alternately with the plurality of first conductive layers;
a plurality of second insulating layers arranged in the second direction alternately with the plurality of second conductive layers;
a plurality of third insulating layers arranged in the second direction alternately with the plurality of third conductive layers; and
a plurality of fourth insulating layers arranged in the second direction alternately with the plurality of fourth conductive layers, wherein
in a first cross-sectional surface extending in the first direction and the second direction and including at least one of the plurality of first contacts;
a fifth contact as one of the plurality of first contacts penetrates the plurality of third insulating layers, extends in the second direction, and is connected to the first conductive layer farthest from the plurality of third conductive layers among the plurality of first conductive layers; and
a first conductive layer of the plurality of first conductive layers disposed at a position closer to the plurality of third conductive layers than other ones of the first conductive, layers and has a larger distance to the fifth contact in the first direction than the other ones of the first conductive layers.

3. The semiconductor memory device according to claim 2, wherein
the fifth contact is in contact with at least one of the plurality of third insulating layers.

4. The semiconductor memory device according to claim 1, wherein
the plurality of first contacts and the plurality of second contacts have lengths in the second direction larger than lengths in the second direction of the plurality of third contacts and the plurality of fourth contacts.

5. The semiconductor memory device according to claim 1, wherein
the closer to the fourth region in the first direction each of the plurality of first contacts is, the larger length in the second direction of the each of the plurality of first contacts is, and
the closer to the first region in the first direction each of the plurality of second contacts is, the larger length in the second direction of the each of the plurality of second contacts is.

6. The semiconductor memory device according to claim 1, wherein
the closer to the fourth region in the first direction each of the plurality of third contacts is, the larger length in the second direction of the each of the plurality of third contacts is, and
the closer to the first region in the first direction each of the plurality of fourth contacts is, the larger length in the second direction of the each of the plurality of fourth contacts is.

7. The semiconductor memory device according to claim 1, comprising:
a plurality of transistors disposed on the surface of the substrate;
a memory cell array layer including the plurality of first conductive layers to the plurality of fourth conductive layers; and
a third wiring disposed between the substrate and the memory cell array layer, the third wiring being electrically connected to the plurality of transistors.

8. The semiconductor memory device according to claim 1, comprising
a first chip and a second chip, wherein
the first chip includes:
the plurality of first conductive layers to the plurality of fourth conductive layers; and
a first bonding electrode, wherein the second chip includes:
- the substrate;
- a plurality of transistors disposed on the surface of the substrate; and
- a second bonding electrode connected to the first bonding electrode.

9. The semiconductor memory device according to claim 1, comprising:
- a first insulating portion disposed in the second region, the first insulating portion extending in the first direction and the second direction; and
- a second insulating portion disposed in the second region and extending in the first direction and the second direction, the second insulating portion being disposed at a position in a third direction different from the first insulating portion, the third direction intersecting with the first direction and the second direction, wherein
- the plurality of first contacts and the plurality of second contacts are positioned between the first insulating portion and the second insulating portion.

* * * * *